(12) United States Patent
Wu et al.

(10) Patent No.: US 12,178,137 B2
(45) Date of Patent: Dec. 24, 2024

(54) IN-ARRAY MAGNETIC SHIELD FOR SPIN-TRANSFER TORQUE MAGNETO-RESISTIVE RANDOM ACCESS MEMORY

(71) Applicant: International Business Machines Corporation, Armonk, NY (US)

(72) Inventors: Heng Wu, Guilderland, NY (US); Dimitri Houssameddine, Sunnyvale, CA (US); Saba Zare, White Plains, NY (US); Karthik Yogendra, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 748 days.

(21) Appl. No.: 17/444,176

(22) Filed: Jul. 30, 2021

(65) Prior Publication Data

US 2023/0031478 A1 Feb. 2, 2023

(51) Int. Cl.
*H10N 50/80* (2023.01)
*H10B 61/00* (2023.01)
*H10N 50/01* (2023.01)

(52) U.S. Cl.
CPC .............. *H10N 50/80* (2023.02); *H10B 61/00* (2023.02); *H10N 50/01* (2023.02)

(58) Field of Classification Search
CPC ......... H10N 50/80; H10N 50/01; H10B 61/00
USPC ....................................................... 257/422
See application file for complete search history.

(56) References Cited

U.S. PATENT DOCUMENTS

| | | | |
|---|---|---|---|
| 8,482,966 B2 | 7/2013 | Kang | |
| 9,564,403 B2 | 2/2017 | Allinger | |
| 10,510,946 B2 | 12/2019 | Bhushan | |
| 2007/0023806 A1 | 2/2007 | Gaidis et al. | |
| 2012/0205764 A1 | 8/2012 | Chen | |
| 2013/0313665 A1* | 11/2013 | Rhie | G11C 11/161 |
| | | | 257/421 |

(Continued)

FOREIGN PATENT DOCUMENTS

WO 2014142978 A1 9/2014

OTHER PUBLICATIONS

Notification of Transmittal of the International Search Report and the Written Opinion of the International Searching Authority, or the Declaration, International Application No. PCT/EP2022/069480, Nov. 28, 2022, 13 pgs.

(Continued)

*Primary Examiner* — Jami Valentine Miller
(74) *Attorney, Agent, or Firm* — Michael A. Petrocelli

(57) ABSTRACT

A memory device with in-array magnetic shield includes an electrically conductive structure embedded within an interconnect dielectric material located above a first metal layer. The electrically conductive structure includes a bottom electrode. The memory device further includes a magnetic tunnel junction stack located above the bottom electrode, a dielectric filling layer surrounding the magnetic tunnel junction stack, one or more connecting vias extending through the dielectric filling layer and the interconnect dielectric material until a top portion of the first metal layer, and one or more dummy vias located between the one or more connecting vias and the magnetic tunnel junction stack for conducting an external magnetic field around the memory device.

20 Claims, 44 Drawing Sheets

(56) References Cited

U.S. PATENT DOCUMENTS

| | | | |
|---|---|---|---|
| 2014/0197505 A1 | 7/2014 | Zhou | |
| 2014/0225208 A1 | 8/2014 | Gu et al. | |
| 2016/0351792 A1 | 12/2016 | Jiang et al. | |
| 2016/0359100 A1 | 12/2016 | Bhushan | |
| 2017/0025471 A1 | 1/2017 | Bhushan et al. | |
| 2017/0025601 A1 | 1/2017 | Bhushan et al. | |
| 2018/0287052 A1* | 10/2018 | Wang | G11C 11/18 |
| 2018/0351078 A1 | 12/2018 | Bharat | |
| 2019/0229068 A1 | 7/2019 | Bhushan | |
| 2019/0247050 A1* | 8/2019 | Goldsmith | A61F 2/82 |
| 2020/0284883 A1* | 9/2020 | Ferreira | H04N 25/773 |
| 2020/0403149 A1* | 12/2020 | Guisan | H10N 50/01 |
| 2021/0273157 A1* | 9/2021 | Guo | H10N 50/01 |
| 2021/0343934 A1* | 11/2021 | Guo | H01F 10/30 |
| 2022/0416156 A1* | 12/2022 | Hashemi | H10B 61/00 |

OTHER PUBLICATIONS

Bhushan, et al., "Enhancing Magnetic Immunity of STT-MRAM with Magnetic Shielding", 2018 IEEE International Memory Workshop (IMW), Jun. 21, 2018, 4 pages, <https://ieeexplore.ieee.org/document/8388828>.

* cited by examiner

A-A'

B-B'

A-A'

B-B'

A-A'

B-B'

IN-ARRAY MAGNETIC SHIELD FOR SPIN-TRANSFER TORQUE MAGNETO-RESISTIVE RANDOM ACCESS MEMORY

BACKGROUND

The present invention generally relates to the field of magnetic storage devices, and more particularly to spin-transfer torque (STT) magneto-resistive random access memory (MRAM) devices.

MRAM is a non-volatile random-access memory (RAM) technology. Unlike conventional RAM, data in MRAM devices is not stored as electric charge or current flows. Instead, data is stored by magnetic storage elements. MRAM devices include cells or elements having a magnetically hard layer (i.e., a "reference" layer) and a magnetically soft layer (i.e., the "free" layer). Writing to MRAM is performed by passing current through current leads that are formed on either side of each memory element in order to create a local induced magnetic field, which sets the direction of the soft layer magnetization.

Spin-transfer torque (STT) MRAM devices are two terminal devices similar to conventional MRAM devices, except that the write current paths pass through the magnetic layers of each memory element. The free layer is set via the spin transfer torque from the spin-polarized current passing through the reference magnetic layer. In an STT-MRAM device, the spin of the electrons is flipped using a spin-polarized current. This effect can be achieved in a magnetic tunnel junction (MTJ) or a spin-valve. The spin-polarized current is created by passing a current through a thin magnetic layer, and then directed into a thinner magnetic layer which transfers the angular momentum to the thin layer which changes its spin.

STT-MRAM technology promises scalable nonvolatile memories that may exhibit fast speed, long endurance and low power consumption. Particularly, MTJ stacks consisting of magnesium oxide (MgO) barrier and cobalt-iron-boron (CoFeB) magnetic layers with perpendicular magnetic anisotropy (PMA) have attracted considerable attention thanks to their combination of high thermal stability, high tunneling magnetoresistance and low switching current density for spin-transfer torque (STT) induced magnetization reversal. However, perpendicular external magnetic fields in PMA-STT MRAM devices may greatly affect the functionality of the MRAM, which may result in poor data retention.

SUMMARY

Shortcomings of the prior art are overcome and additional advantages are provided through the provision of a memory device that includes an electrically conductive structure embedded within an interconnect dielectric material located above a first metal layer, the electrically conductive structure comprising a bottom electrode, a magnetic tunnel junction stack located above the bottom electrode, a dielectric filling layer surrounding the magnetic tunnel junction stack, one or more connecting vias extending through the dielectric filling layer and the interconnect dielectric material until a top portion of the first metal layer, and one or more dummy vias located between the one or more connecting vias and the magnetic tunnel junction stack for conducting an external magnetic field around the memory device.

Another embodiment of the present disclosure provides a memory device that includes an electrically conductive structure embedded within an interconnect dielectric material located above a first metal layer, the electrically conductive structure comprising a bottom electrode, a magnetic tunnel junction stack located above the bottom electrode, an etch stop layer covering portions of the interconnect dielectric material adjacent to the magnetic tunnel junction stack and a bottom portion of the magnetic tunnel junction stack, a dielectric filling layer above the interconnect dielectric material and the etch stop layer, the dielectric filling layer surrounding the magnetic tunnel junction stack, one or more connecting vias extending through the dielectric filling layer and the interconnect dielectric material until a top portion of the first metal layer, and one or more dummy vias extending through the dielectric filling layer until a top portion of the etch stop layer, the one or more dummy vias being located between the one or more connecting vias and the magnetic tunnel junction stack for conducting an external magnetic field around the memory device.

Another embodiment of the present disclosure provides a method of forming a memory device that includes forming an electrically conductive structure embedded within an interconnect dielectric material located above a first metal layer, the electrically conductive structure comprising a bottom electrode, forming a magnetic tunnel junction stack above the bottom electrode, forming a dielectric filling layer surrounding the magnetic tunnel junction stack, forming one or more connecting vias extending through the dielectric filling layer and the interconnect dielectric material until a top portion of the first metal layer, and forming one or more dummy vias between the one or more connecting vias and the magnetic tunnel junction stack for conducting an external magnetic field around the memory device.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
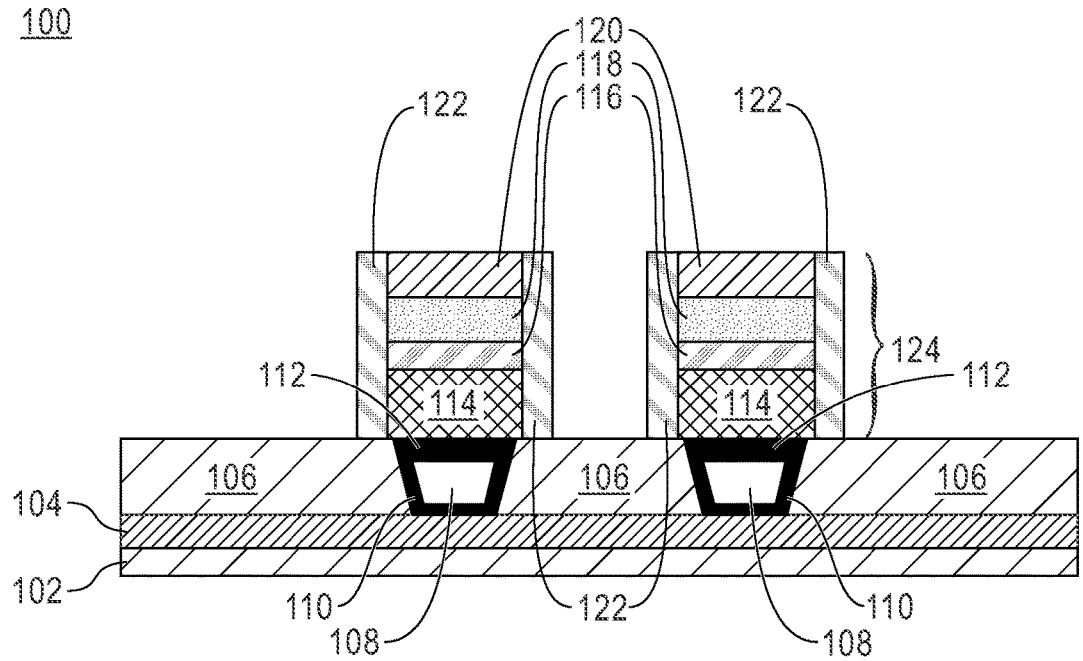
FIG. 1A is a cross-sectional view of a memory device across line A-A' at an intermediate step during a back-end-of-the-line (BEOL) integration process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

MRAM devices include cells or magnetic storage elements for storing data having a magnetically hard layer (i.e., the reference layer) and a magnetically soft layer (i.e., the free layer) separated by a thin dielectric layer (i.e., the tunnel barrier). This configuration is known as a magnetic tunnel junction (MTJ) pillar. MTJ pillar structures typically include a Co-based synthetic anti-ferromagnet (SAF), a CoFeB-based reference layer, a MgO-based tunnel barrier, a CoFeB-based free layer, and cap layers containing materials such as tantalum (Ta) and/or ruthenium (Ru). As mentioned above, MTJ stacks consisting of a MgO barrier and CoFeB magnetic layers with perpendicular magnetic anisotropy (PMA) may provide high thermal stability, high tunneling magnetoresistance and low switching current density for spin-transfer torque (STT) induced magnetization reversal. However, perpendicular external magnetic fields in PMA-STT MRAM devices may greatly affect the functionality of the MRAM, which may result in poor data retention. Current solutions to this problem include, for example, implementing a packaging level magnetic shield. Drawbacks of packaging level magnetic shield technology include high cost, complex design and failure to shield high external magnetic fields.

Therefore, embodiments of the present disclosure provide a STT-MRAM device with perpendicular magnetic anisotropy (PMA), and a method of making the same, in which a magnetic shield is integrated into each die of the MRAM array using current interconnect technologies available in advance technology nodes (<7 nm). The proposed embodiments use $M_1$, $M_2$ magnetically conductive interconnects such as cobalt (Co) metal lines (instead of copper) as the magnetic shield with an extra $V_1$ dummy via to conduct or guide the external magnetic field. Further, the proposed embodiments use a high permeability (m) metal (e.g., cobalt, nickel, and iron) in the array level to guide the external magnetic field around the MRAM array, without disturbing the operation of the MRAM. Thus, the shielding scheme in the proposed embodiments is located within the MRAM array thereby providing better field immunity compared with the complex packaging level field shielding schemes. By implementing the shielding scheme on an array level instead of a chip level, embodiments of the present disclosure may provide enhanced field immunity and flexibility in the wiring of MRAM chips in addition to reducing design complexity while providing an efficient magnetic shield that does not impact device performance.

An embodiment by which the in array magnetic shield can be formed in the (PMA) STT-MRAM device is described in detailed below by referring to the accompanying drawings in FIGS. 1A-7C.

Figure 1B:
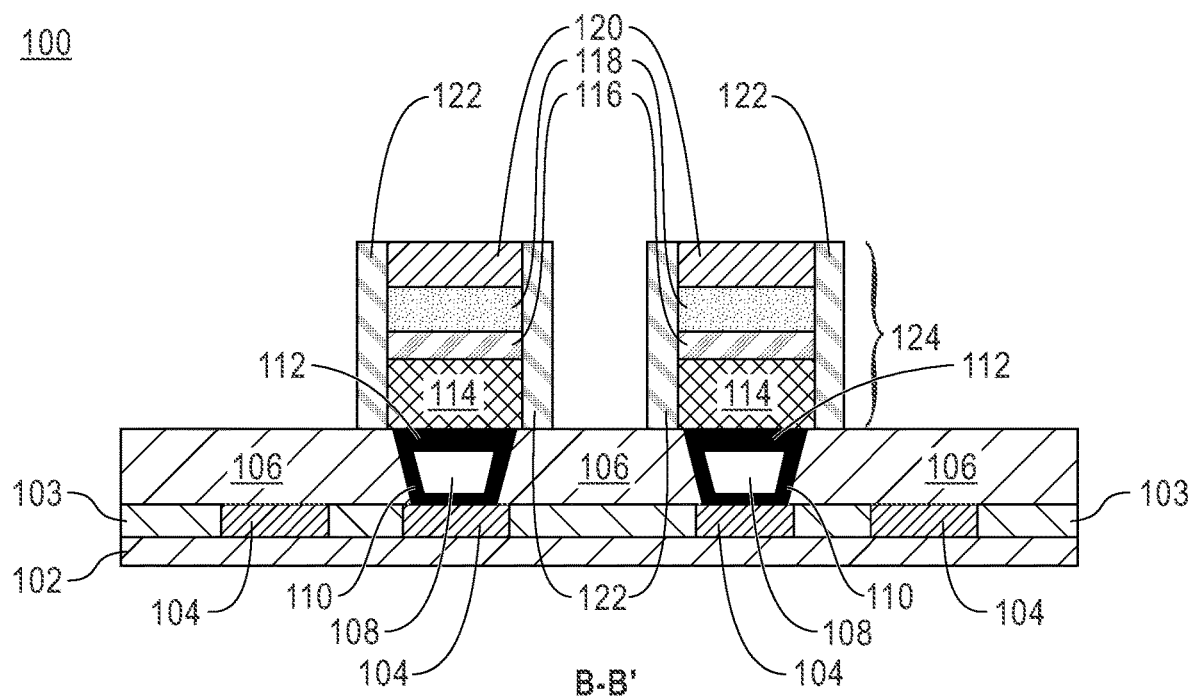
FIG. 1B is a cross-sectional view of the memory device across line B-B'.
Figure 1C:
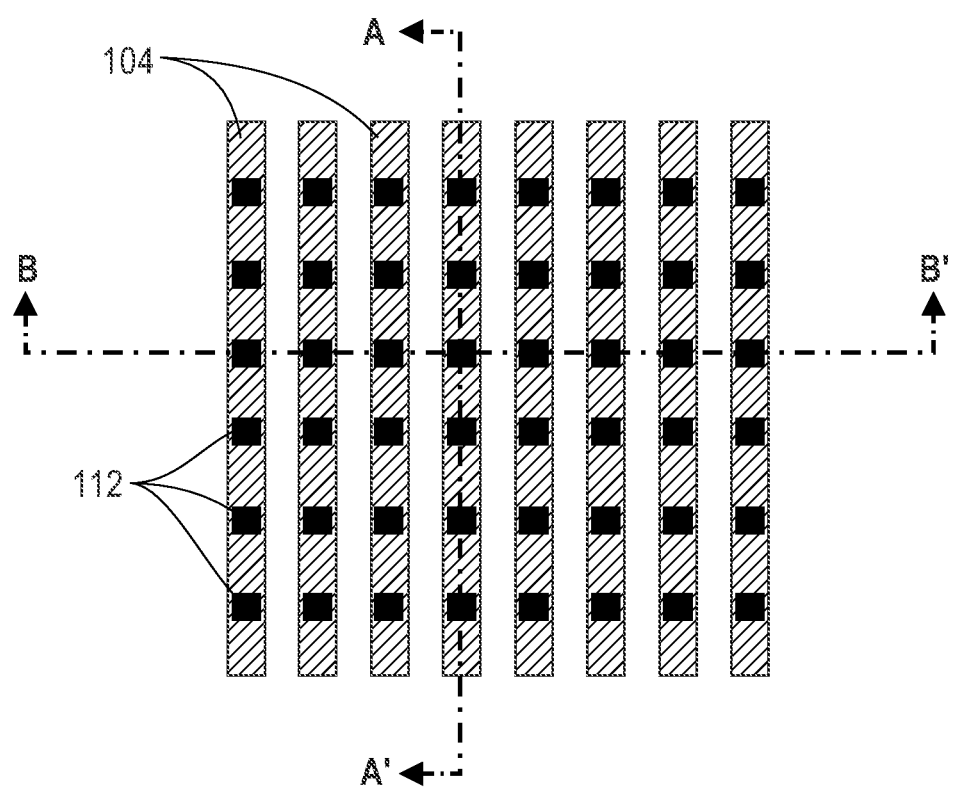
FIG. 1C is a top-down view of the memory device.

Referring now to FIG. 1A, a cross-sectional view of a memory device 100 at an intermediate step during a semiconductor manufacturing process is shown, according to an embodiment of the present disclosure. In this embodiment, FIG. 1C is a top-down view of the memory device 100, FIG. 1A is a cross-sectional view of the memory device 100 across line A-A' of FIG. 1C, and FIG. 1B is a cross-sectional view of the memory device 100 across line B-B' of FIG. 1C.

According to an embodiment, the memory device 100 may include an MRAM device based on a perpendicular MTJ pillar structure such as an STT-MRAM. The memory device 100 may include an electrically conductive structure 108 that is embedded in an interconnect dielectric material layer 106. A diffusion barrier liner 110 can be formed on sidewalls and a bottom wall of the electrically conductive structure 108, as shown in the figure. Collectively, the electrically conductive structure 108, the diffusion barrier liner 110, and the interconnect dielectric material layer 106 provide an interconnect level. It should be noted that at least one other interconnect level and/or a middle-of-the-line (MOL) level may be located beneath the interconnect level including the interconnect dielectric material layer 106, the electrically conductive structure 108, and the diffusion barrier liner 110. These other levels can be, for example, a first metal layer 104 including contacts and vias (not shown), and a front-end-of-the-line (FEOL) layer 102 including one or more transistors (not shown).

The interconnect dielectric material layer 106 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The electrically conductive structure 108 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

The diffusion barrier liner 110 is formed along the sidewalls and bottom wall of the electrically conductive structure 108. In some embodiments, no diffusion barrier liner is present. The diffusion barrier liner 110 is composed of a diffusion barrier material (i.e., a material that serves as a barrier to prevent a conductive material such as copper from diffusing there through). Examples of diffusion barrier materials that can be used in providing the diffusion barrier liner 110 may include, but are not limited to, Ta, TaN, Ti, TiN, Ru, RuN, RuTa, RuTaN, W, or WN. In some embodiments, the diffusion barrier liner 110 may include a material stack of diffusion barrier materials. In one example, the diffusion barrier material may be composed of a stack of Ta/TaN.

The interconnect level including the interconnect dielectric material layer 106, the electrically conductive structure 108, and the diffusion barrier liner 110 may be formed utilizing conventional processes that are well-known to those skilled in the art including, for example, a damascene process. So as not to obscure the method of the present application, the techniques used to form the interconnect level including the interconnect dielectric material layer 106, the electrically conductive structure 108, and the diffusion barrier liner 110 are not provided herein.

With continued reference to FIGS. 1A, a bottom electrode 112 is formed above the electrically conductive structure 108 and the diffusion barrier liner 110. The bottom electrode 112 may be composed of a conductive material such as, for example, Ta, TaN, Ti, TiN, Ru, RuN, RuTa, RuTaN, Co, CoWP, CoN, W, WN or any combination thereof. In this embodiment, the bottom electrode 112 is located on a recessed surface of the electrically conductive structure 108. Thus, prior to forming the bottom electrode 112, an upper portion of the electrically conductive structure 108 is removed utilizing a recess etching process, and thereafter the bottom electrode 112 is formed upon the recessed surface of the electrically conductive structure 108. Accordingly, the bottom electrode 112 is located on an entirety of the recessed topmost surface of the electrically conductive structure 108. The bottom electrode 112 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides the bottom electrode 112.

The memory device 100 further includes an MTJ stack 124 formed above the bottom electrode 112, according to an embodiment of the present disclosure. The MTJ stack 124 may include at least a magnetic reference layer 114, a tunnel barrier layer 116, a magnetic free layer 118 and a hardmask layer 120 as depicted in FIGS. 1A and 1B. It should be noted that other MTJ configurations are possible for the MTJ stack 124 such as, for example, the magnetic free layer 118 being located at the bottom of the MTJ stack 124 and the magnetic reference layer 114 being at the top of the MTJ stack 124.

In some embodiments, the MTJ stack 124 may also include a non-magnetic spacer layer (not shown) located on the magnetic free layer, a second magnetic free layer located on the non-magnetic spacer layer, and/or a MTJ cap layer located on the magnetic free layer 118 or on the second magnetic free layer. The various material layers of the MTJ stack 124 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 114 has a fixed magnetization. The magnetic reference layer 114 may be composed of a metal or metal alloy (or a stack thereof) that includes one or more metals exhibiting high spin polarization. In alternative embodiments, exemplary metals for the formation of the magnetic reference layer 114 may include iron, nickel, cobalt, chromium, boron, or manganese. Exemplary metal alloys may include the metals exemplified by the above. In another embodiment, the magnetic reference layer 114 may be a multilayer arrangement having (1) a high spin polarization region formed from a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 116 is composed of an insulator material and is formed at such a thickness as to provide an appropriate tunneling resistance. Exemplary materials for the tunnel barrier layer 116 may include magnesium oxide, aluminum oxide, and titanium oxide, or materials of higher electrical tunnel conductance, such as semiconductors or low-bandgap insulators.

The magnetic free layer 118 may be composed of a magnetic material (or a stack of magnetic materials) with a magnetization that can be changed in orientation relative to the magnetization orientation of the magnetic reference layer 114. Exemplary magnetic materials for the magnetic free layer 118 include alloys and/or multilayers of cobalt, iron, alloys of cobalt-iron, nickel, alloys of nickel-iron, and alloys of cobalt-iron-boron.

It should be noted that some elements and/or features of the memory device 100 are illustrated in the figures but not described in detail in order to avoid unnecessarily obscuring the presented embodiments. For illustration purposes only, without intent of limitation, only one MTJ stack 124 with a corresponding bottom electrode 112 is depicted in the memory device 100. As may be understood by those skilled in the art, the memory device 100 may include more than one MTJ stack 124.

In an embodiment, the hardmask layer 120 may be composed of a metal (not shown) such as TaN, TaAlN, WN as the bottommost material, and a dielectric material (not shown) such as silicon dioxide, silicon nitride, silicon carbide, and the like, as the topmost material. The hardmask layer 120 can be deposited by any suitable deposition method known in the art. It should be noted that the metal layer in the hardmask layer 120 is not sacrificial, while the dielectric layer in the hardmask layer 120 is sacrificial, in that the dielectric layer will be removed after completion of the patterning process. In some embodiments, top layers (not shown) of the MTJ stack 124 may act as both a hardmask for etching the MTJ stack 124 and as an interlayer conductor channel.

With continued reference to FIG. 1A, a spacer material can be deposited on the memory device 100 and subsequently etched to form sidewall spacers 122 as depicted in FIGS. 1A and 1B.

The spacer material forming the sidewall spacers 122 may include an insulator material such as an oxide, nitride, oxynitride, silicon carbon oxynitride, silicon boron oxynitride, low-k dielectric, or any combination thereof. Standard deposition and etching techniques may be used to form the sidewall spacers 122. As known by those skilled in the art, the insulator material forming the spacer material is removed from all horizontal surfaces of the memory device 100 during the etching process. The sidewall spacers 122 surround the MTJ stack 124. A (horizontal) thickness of the sidewall spacers 122 may vary between approximately 3 nm to approximately 40 nm, although other thicknesses above or below this range may be used as desired for a particular application.

Figure 2A:
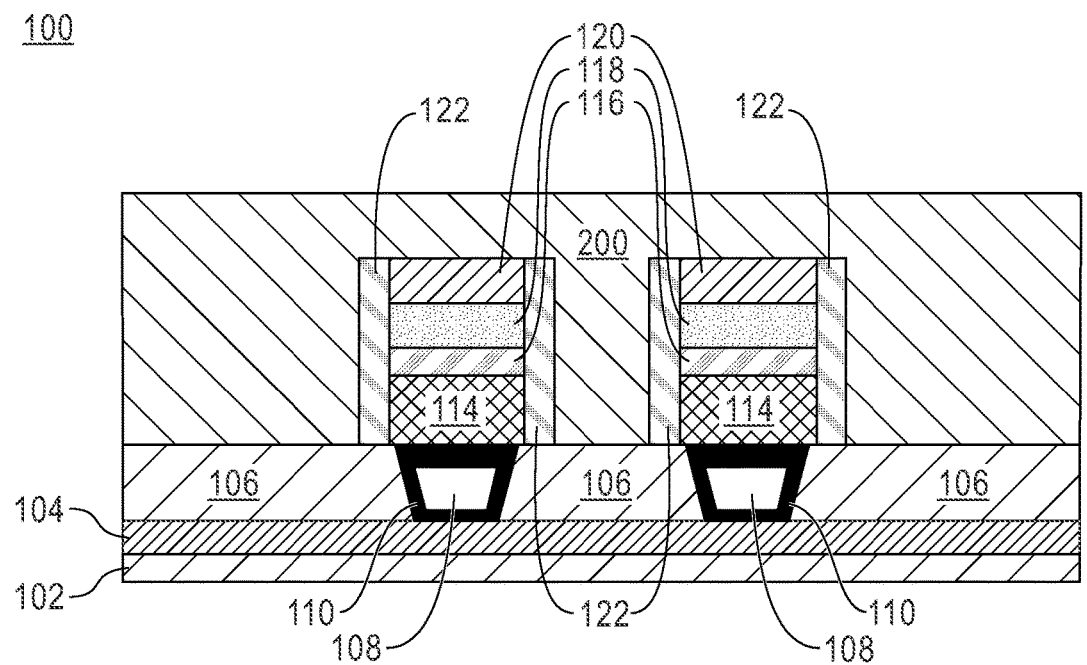
FIG. 2A is a cross-sectional view of the memory device across line A-A' depicting forming a dielectric filling layer, according to an embodiment of the present disclosure.
Figure 2B:
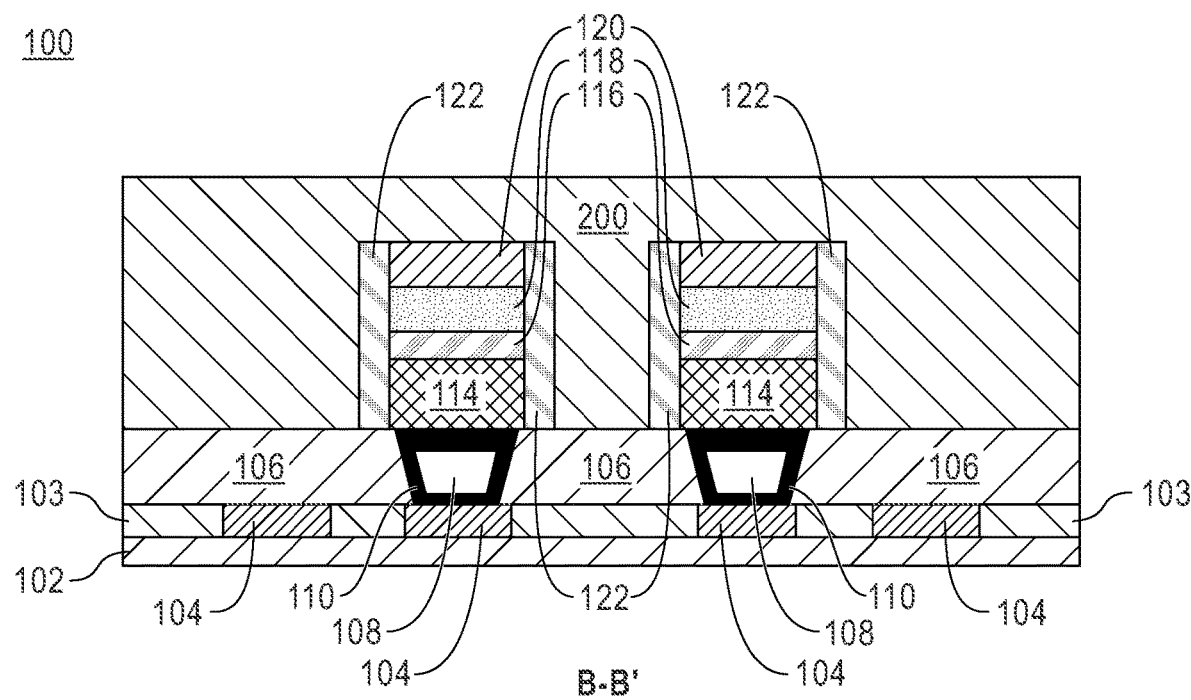
FIG. 2B is a cross-sectional view of the memory device across line B-B'.
Figure 2C:
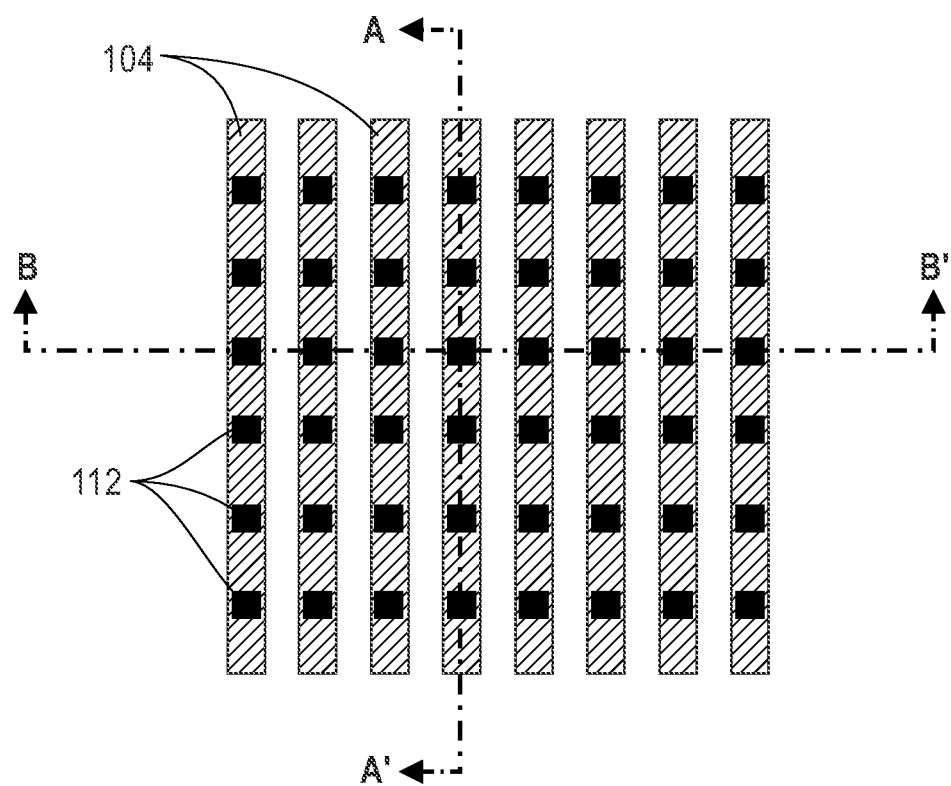
FIG. 2C is a top-down view of the memory device.

Referring now to FIG. 2A, a cross-sectional view of the memory device 100 depicting forming a dielectric filling layer 200 is shown, according to an embodiment of the present disclosure. In this embodiment, FIG. 2C is a top-down view of the memory device 100, FIG. 2A is a cross-sectional view of the memory device 100 across line A-A' of FIG. 2C, and FIG. 2B is a cross-sectional view of the memory device 100 across line B-B' of FIG. 2C.

Any suitable deposition process can be used to form the dielectric filling layer 200 in the memory device 100. The dielectric filling layer 200 may be made of analogous materials and formed in similar ways as the interconnect dielectric material layer 106. In some embodiments, a planarization process may be conducted on the memory device 100 after deposition of the dielectric filling layer 200.

Figure 3A:
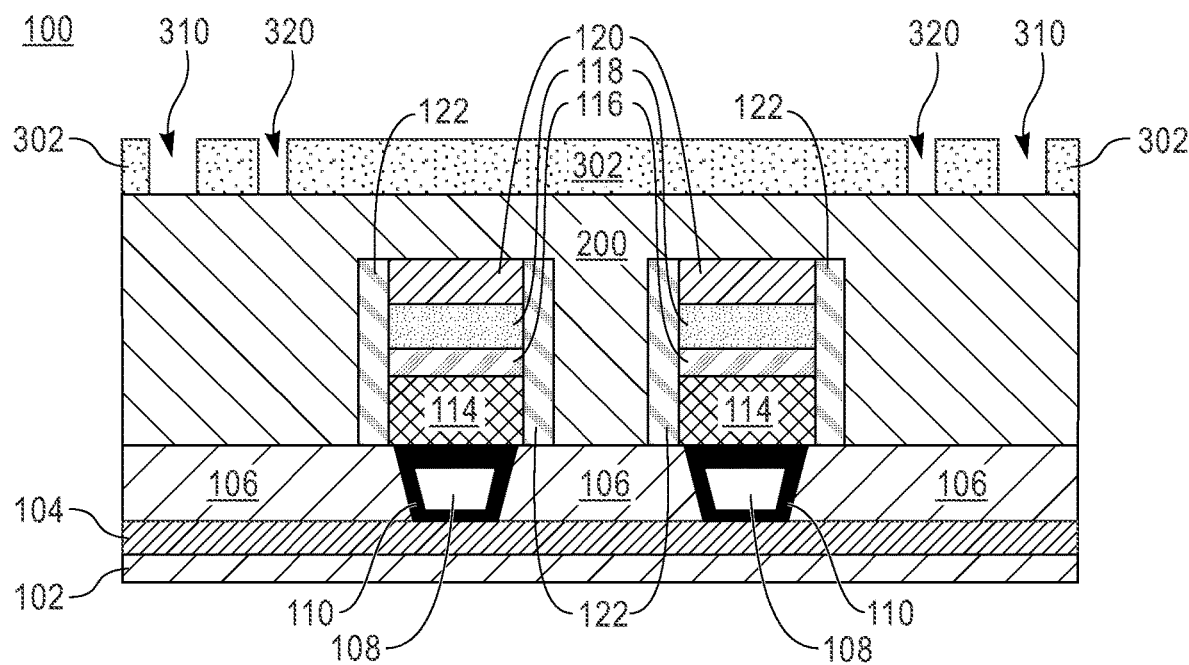
FIG. 3A is a cross-sectional view of the memory device across line A-A' after depositing a first photoresist layer, according to an embodiment of the present disclosure.
Figure 3B:
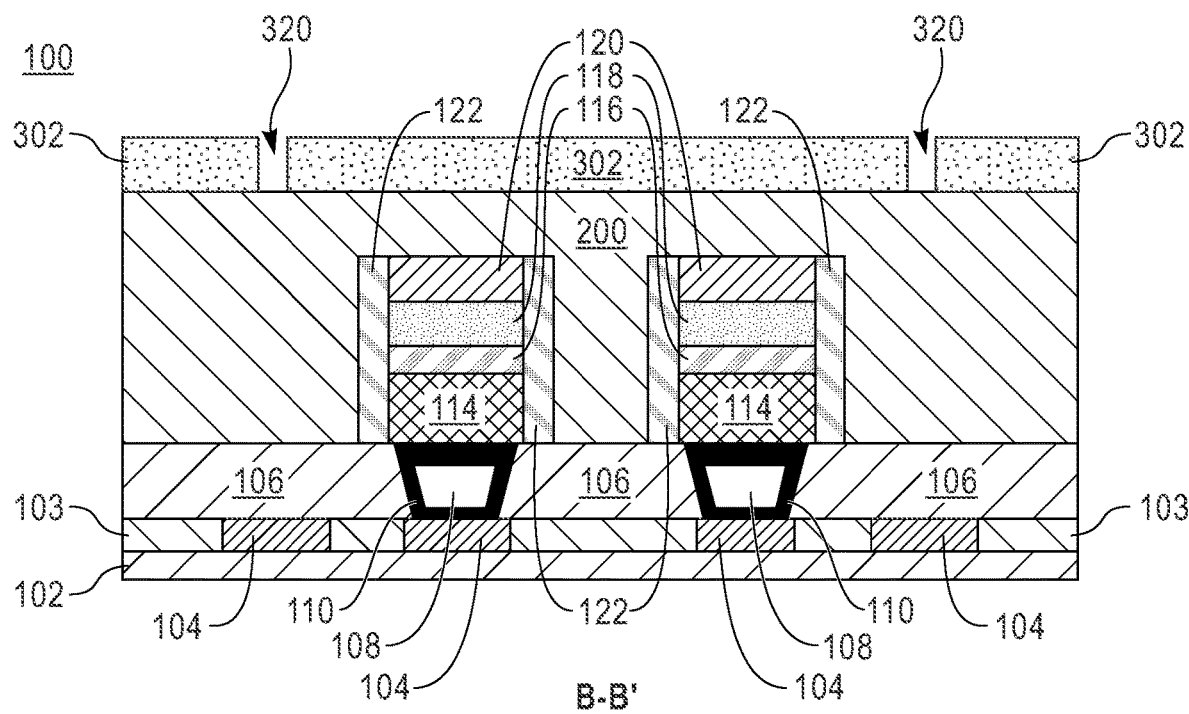
FIG. 3B is a cross-sectional view of the memory device across line B-B'.
Figure 3C:
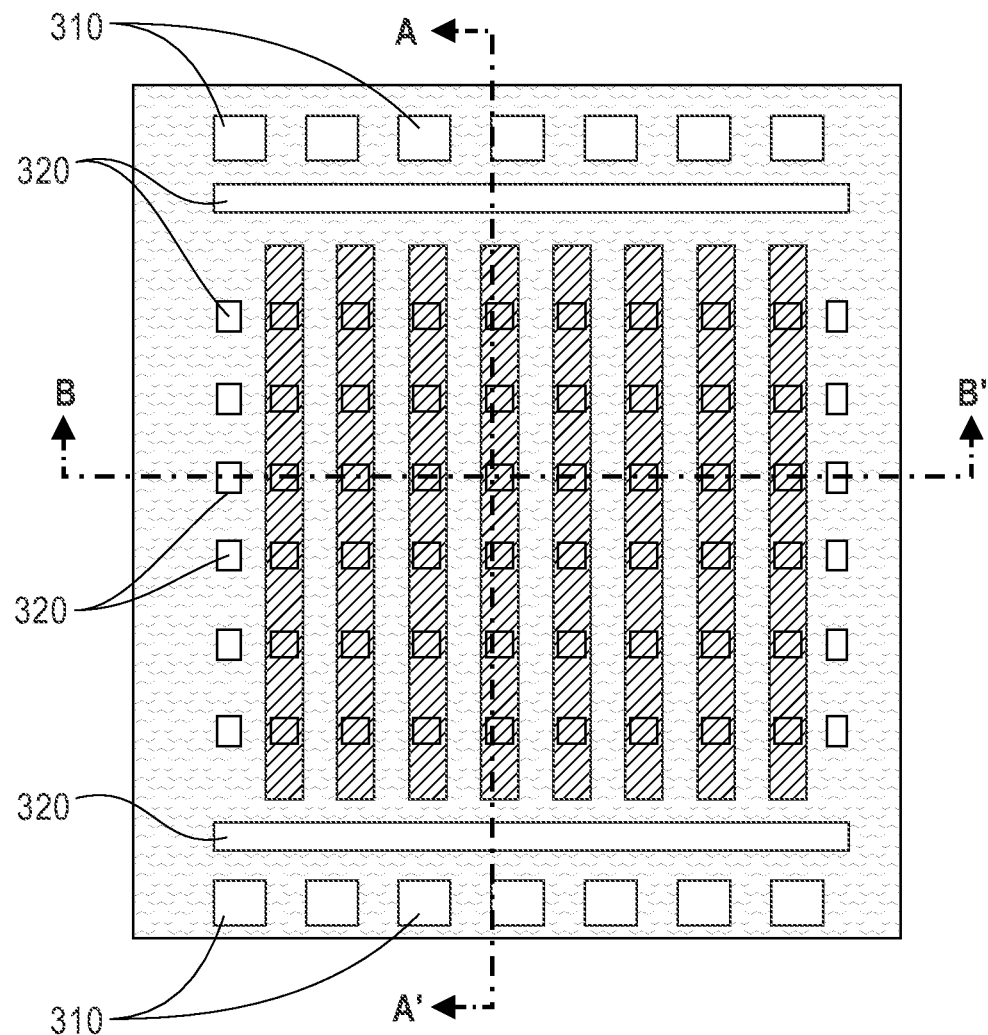
FIG. 3C is a top-down view of the memory device.
Figure 4A:
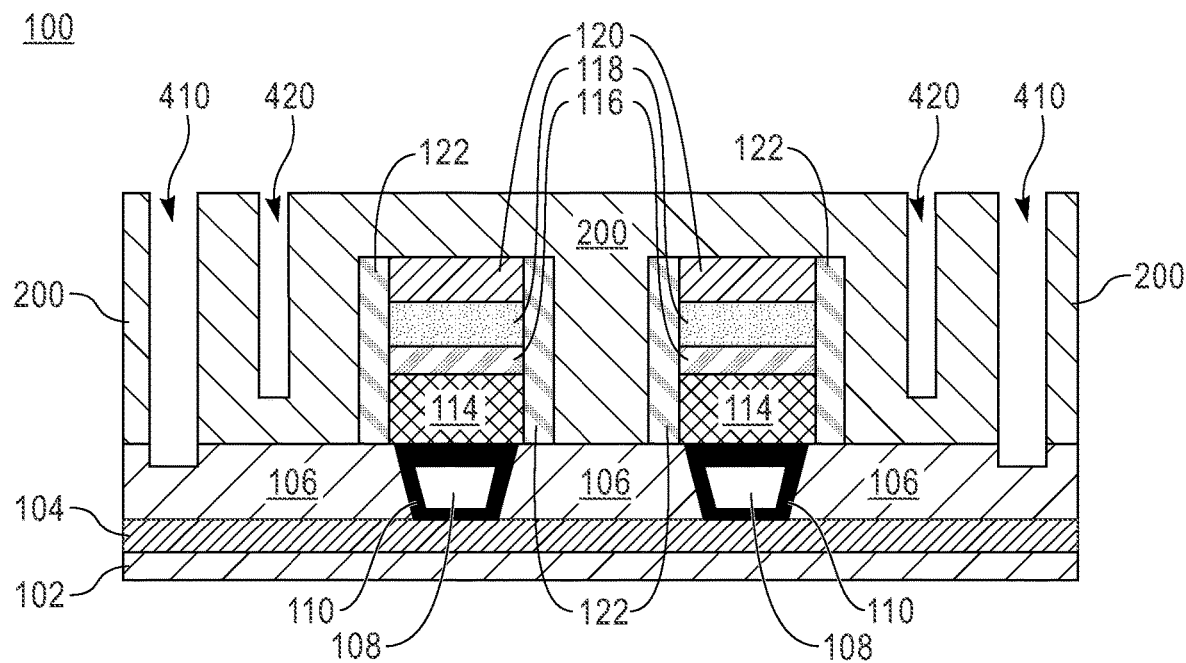
FIG. 4A is a cross-sectional view of the memory device across line A-A' after patterning the dielectric filling layer to form first connecting vias and first dummy vias, according to an embodiment of the present disclosure.

Referring now to FIG. 3A and FIG. 4A simultaneously, cross-sectional views of the memory device 100 after depositing a first photoresist layer 302 and patterning the dielectric filling layer 200 to form first connecting vias 410 and first dummy vias 420 are shown, according to an embodiment of the present disclosure. In this embodiment, FIG. 3C is a top-down view of the memory device 100, FIG. 3A is a cross-sectional view of the memory device 100 across line A-A' of FIG. 3C, and FIG. 3B is a cross-sectional view of the memory device 100 across line B-B' of FIG. 3C. Similarly, FIG. 4C is a top-down view of the memory device 100, FIG. 4A is a cross-sectional view of the memory device 100 across line A-A' of FIG. 4C, and FIG. 4B is a cross-sectional view of the memory device 100 across line B-B' of FIG. 4C.

The first photoresist layer 302 is deposited above the dielectric filling layer 200 for forming the first connecting vias 410 and the first dummy vias 420 (shown in FIGS. 4A-4C) using well-known lithography and reactive ion etch (RIE) processing. As known by those skilled in the art, patterning of the dielectric filling layer 200 to form the first connecting vias 410 and first dummy vias 420 involves exposing a pattern 310, 320 on the first photoresist layer 302 and transferring the exposed pattern to the dielectric filling layer 200, as shown in FIGS. 4A-4C. After transferring the pattern 310, 320 and forming the first connecting vias 410 and first dummy vias 420, the first photoresist layer 302 can be removed using any photoresist striping method known in the art including, for example, plasma ashing.

Figure 4B:
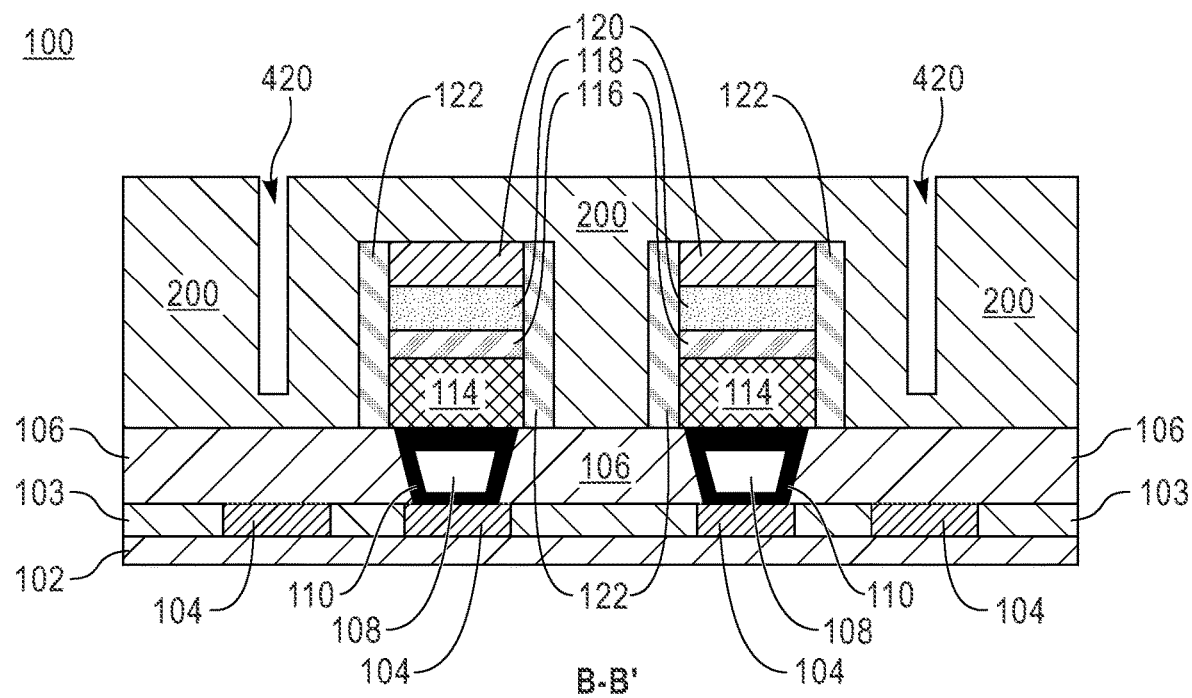
FIG. 4B is a cross-sectional view of the memory device across line B-B'.
Figure 4C:
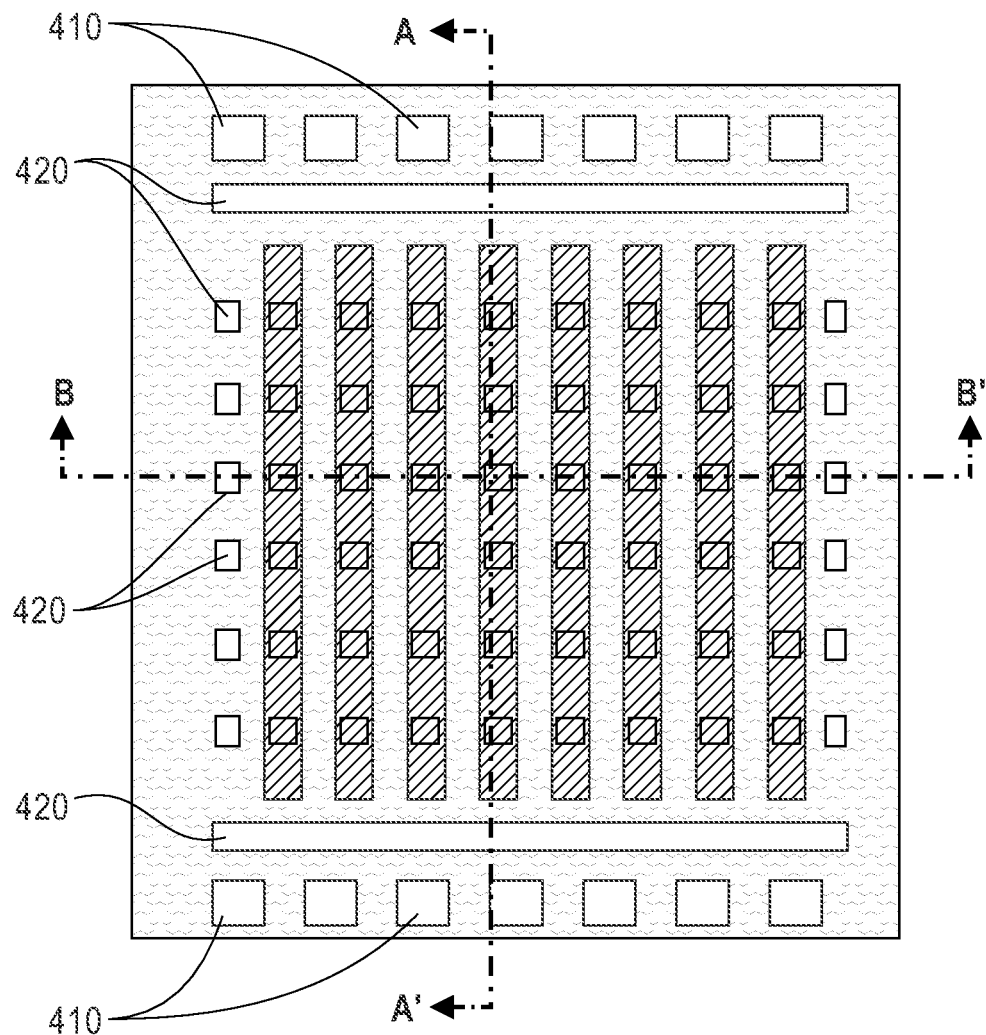
FIG. 4C is a top-down view of the memory device.

With continued reference to FIGS. 4A-4C, according to an embodiment, the first connecting vias 410 extend vertically through the dielectric filling layer 200. As shown in FIG. 4A, the first connecting vias 410 extend until a top portion of the interconnect dielectric material layer 106. Thus, at this point of the manufacturing process, a depth of each of the first connecting vias 410 (as measured in the y-direction) may at least be equal to a thickness of the dielectric filling layer 200. It should be noted that, at this step, the first connecting vias 410 do not contact the underlying first metal layer 104 and FEOL layer 102.

The first dummy vias 420 are formed within the dielectric filling layer 200 until a depth (as measured in the y-direction) varying from approximately 50 nm to approximately 200 nm is reached within the dielectric filling layer 200. As can be observed in FIG. 4A and FIG. 4B, the first dummy vias 420 do not extend beyond the dielectric filling layer 200. A width of each of the first dummy vias 420 (as measured in the x-direction) may vary, for example, between approximately 10 nm and approximately 20 nm and ranges therebetween. It should be noted that a via array (i.e., connecting vias and dummy vias) closer to the MTJ stack can make the area usage more efficient, but may affect the shielding efficiency. Thus, a distance from the first dummy vias 420 to the MTJ stack 124 (FIG. 1A) may, for example, vary from approximately 50 nm to approximately 500 nm. Similarly, a distance between the first connecting vias 410 and first dummy vias 420 may, for example, vary between approximately 50 nm to approximately 200 nm.

Figure 5A:
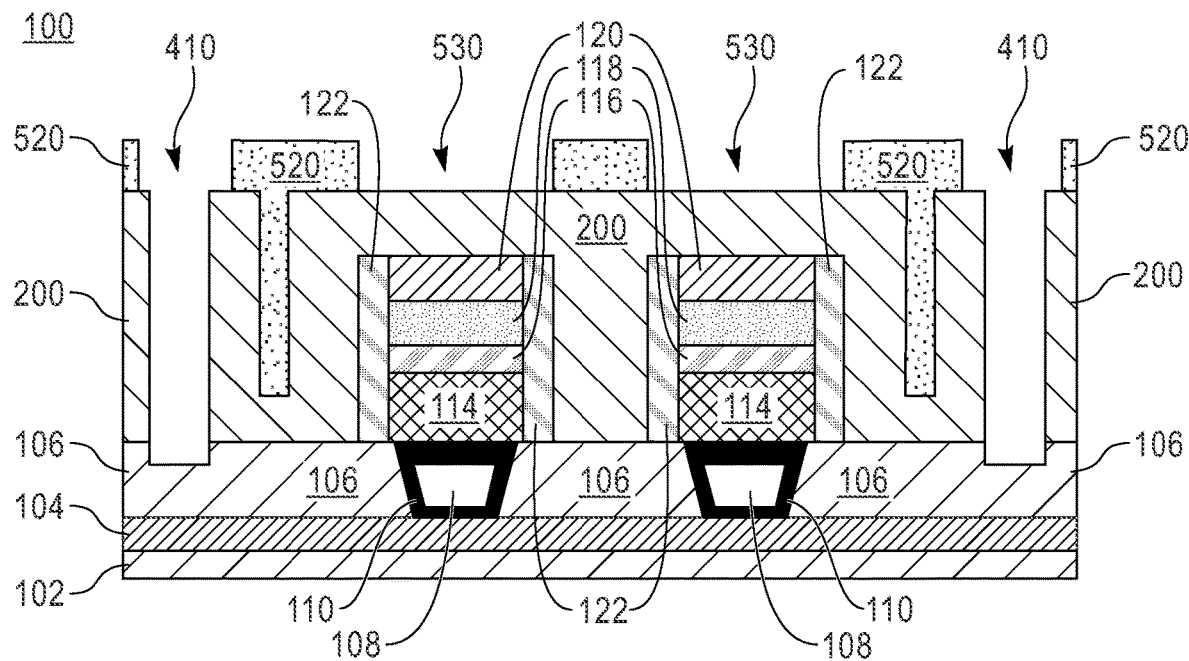
FIG. 5A is a cross-sectional view of the memory device across line A-A' after depositing a second photoresist layer, according to an embodiment of the present disclosure.
Figure 5B:
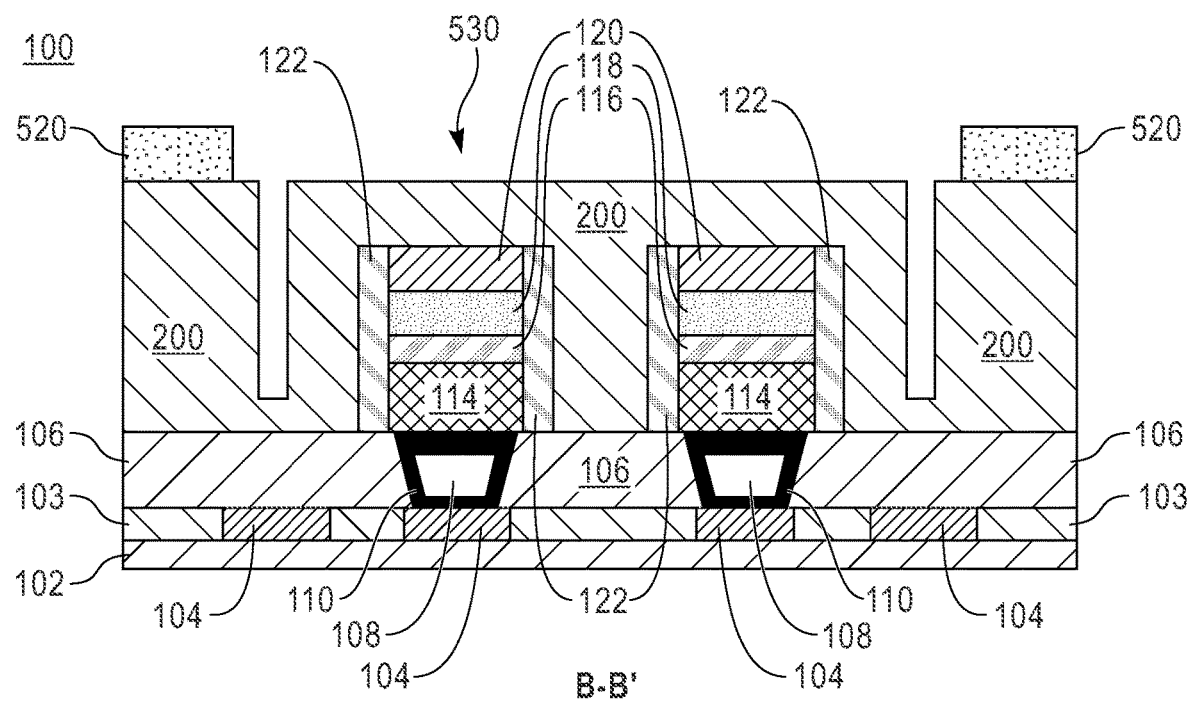
FIG. 5B is a cross-sectional view of the memory device across line B-B'.
Figure 5C:
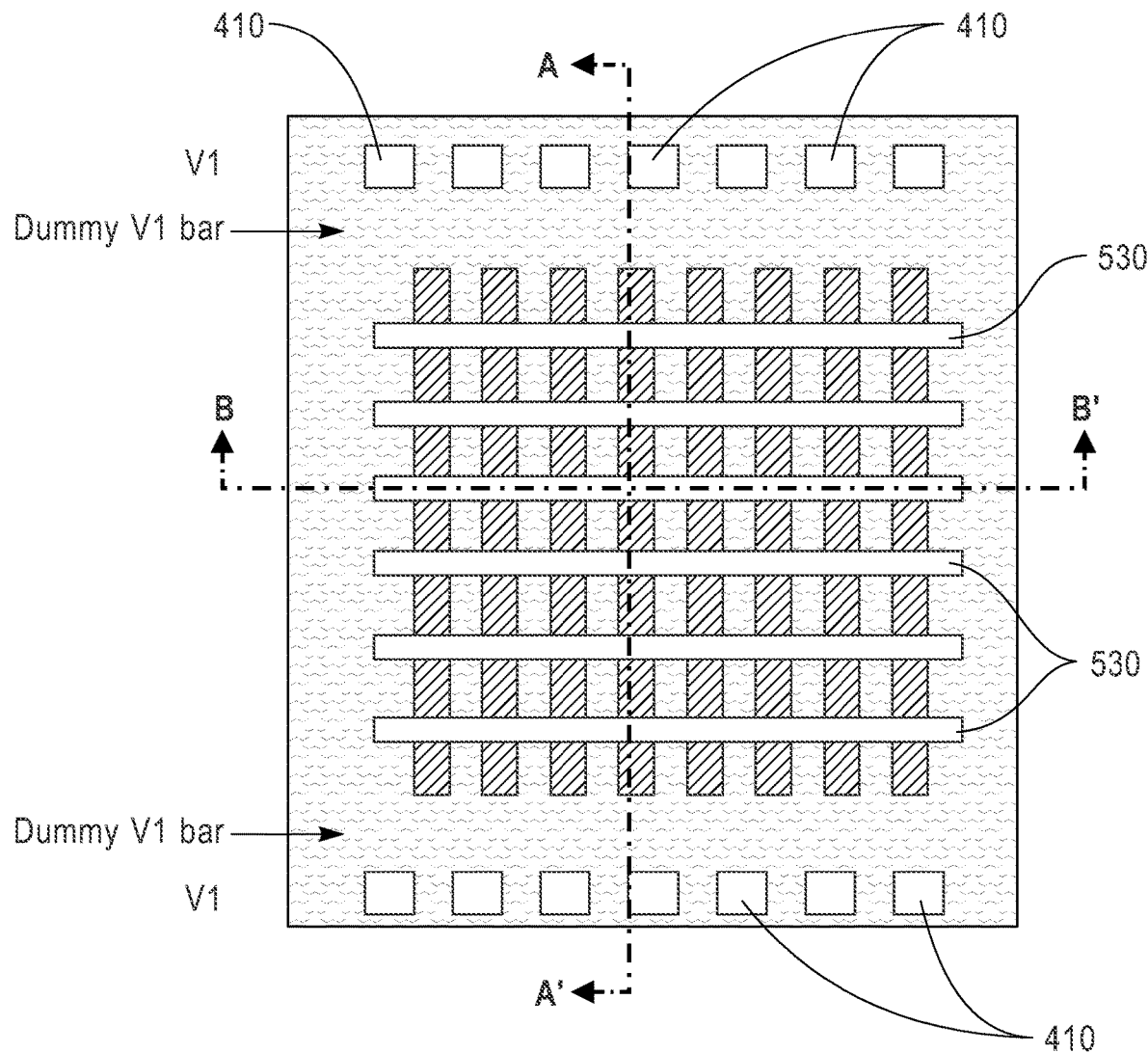
FIG. 5C is a top-down view of the memory device.
Figure 6A:
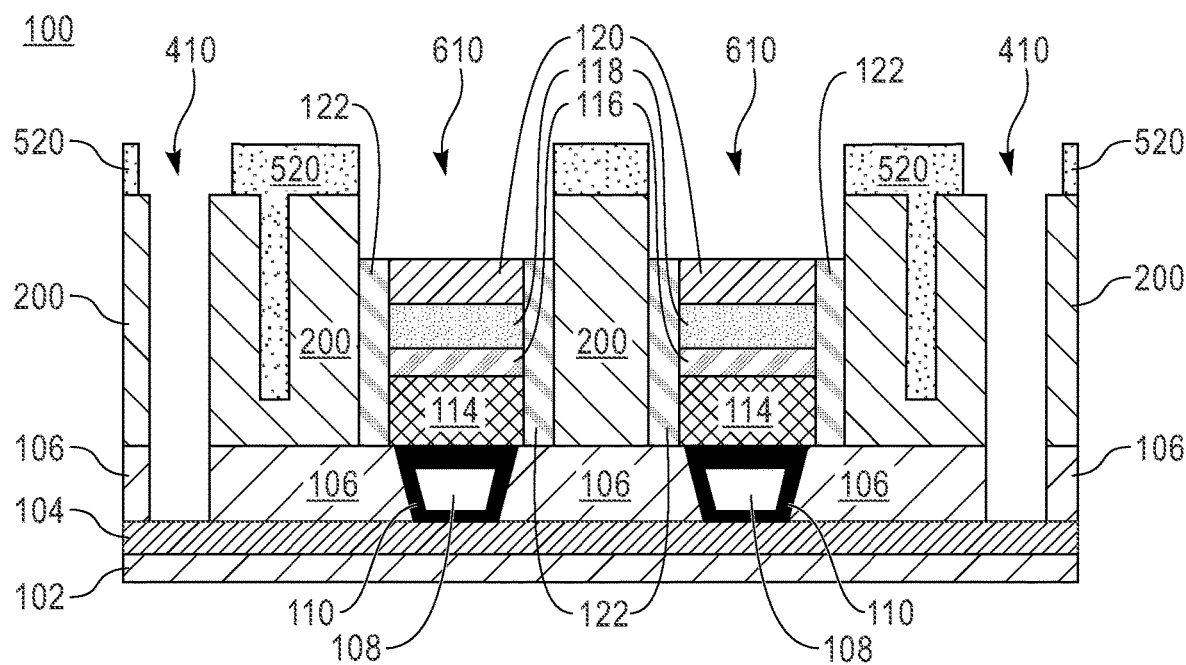
FIG. 6A is a cross-sectional view of the memory device across line A-A' after patterning the dielectric filling layer to form first trenches, according to an embodiment of the present disclosure.

Referring now to FIG. 5A and FIG. 6A simultaneously, cross-sectional views of the memory device 100 after depositing a second photoresist layer 520 and patterning the dielectric filling layer 200 to form first trenches 610 are shown, according to an embodiment of the present disclosure. In this embodiment, FIG. 5C is a top-down view of the memory device 100, FIG. 5A is a cross-sectional view of the memory device 100 across line A-A' of FIG. 5C, and FIG. 5B is a cross-sectional view of the memory device 100 across line B-B' of FIG. 5C. Similarly, FIG. 6C is a top-down view of the memory device 100, FIG. 6A is a cross-sectional view of the memory device 100 across line A-A' of FIG. 6C, and FIG. 6B is a cross-sectional view of the memory device 100 across line B-B' of FIG. 6C.

Figure 6B:
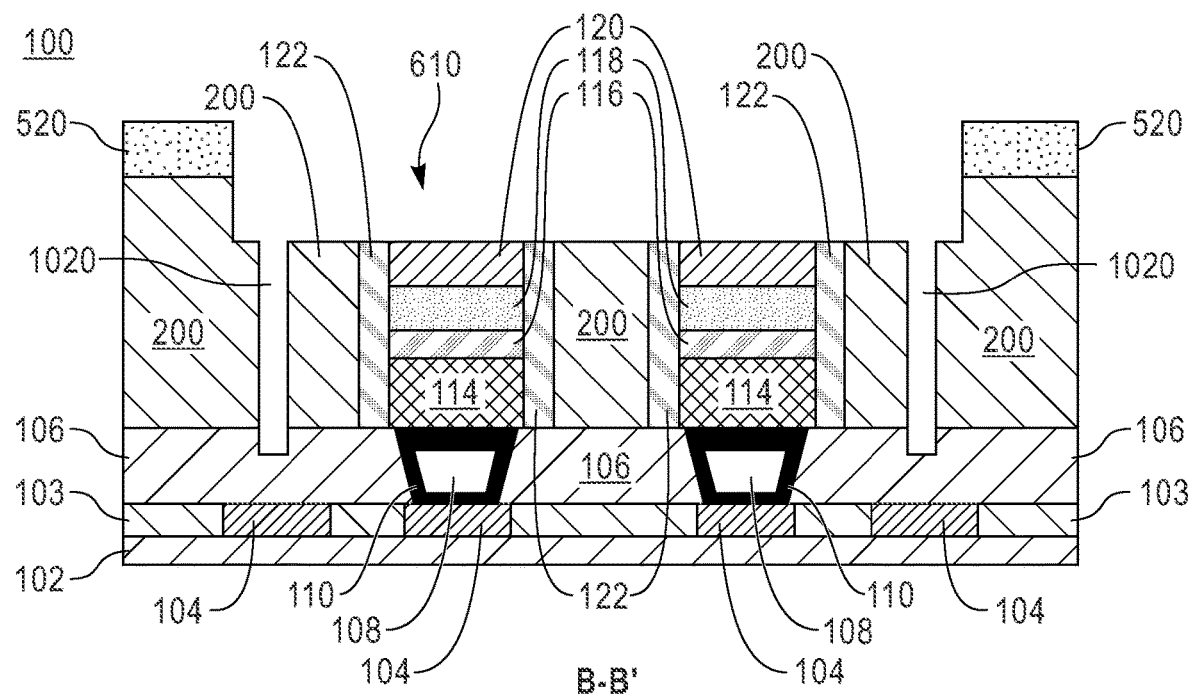
FIG. 6B is a cross-sectional view of the memory device across line B-B'.
Figure 6C:
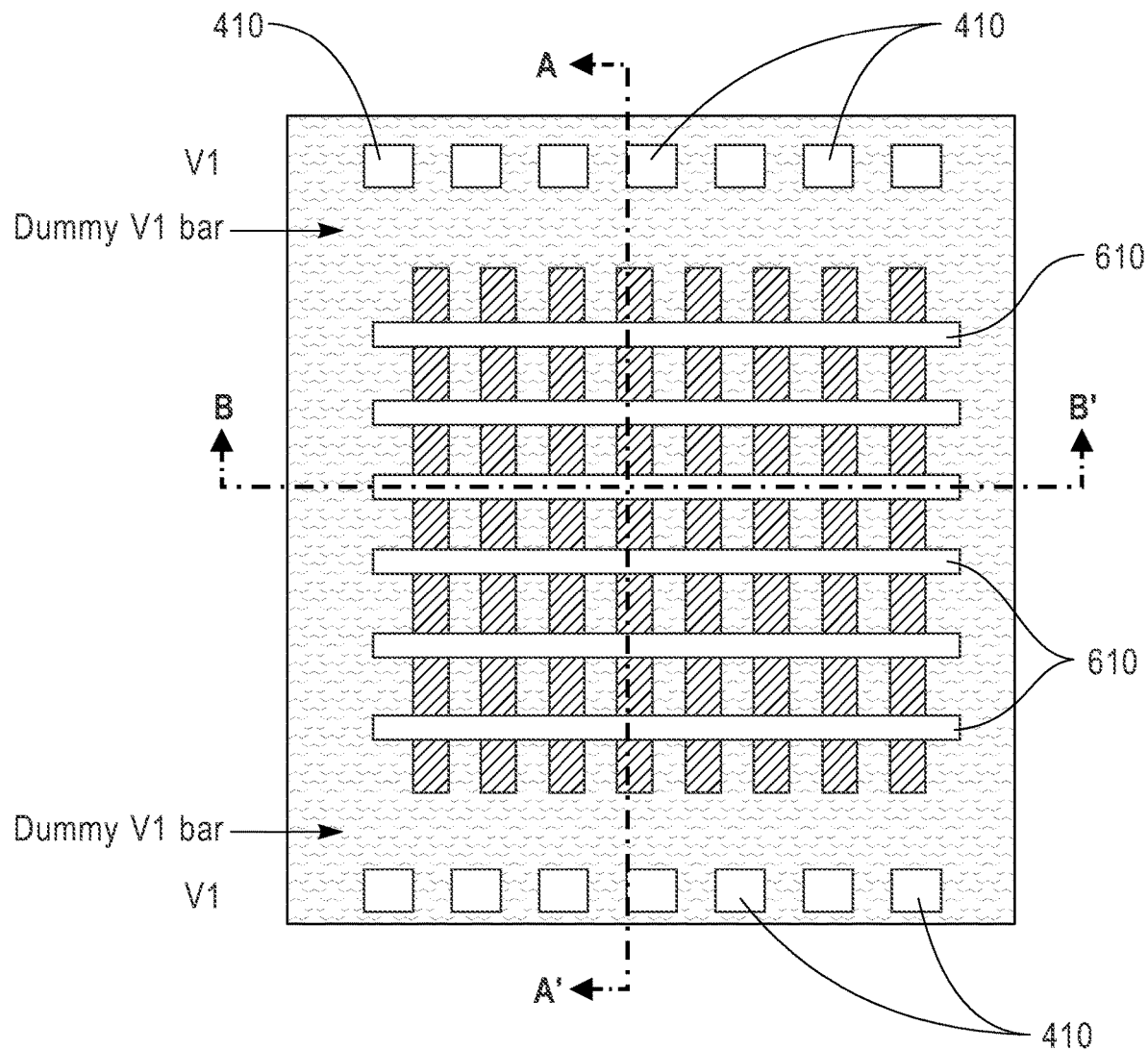
FIG. 6C is a top-down view of the memory device.

Similarly to the process of forming the first connecting vias 410 and first dummy vias 420 described above, forming the first trenches 610 involves exposing a pattern 530 on the second photoresist layer 520 and transferring the exposed pattern to the dielectric filling layer 200 using known lithography and RIE processing (FIG. 6A and FIG. 6B). As depicted in FIG. 5A, the second photoresist layer 520 substantially fills the dummy vias 420 (FIG. 4A) protecting them during subsequent etching steps. As can be appreciated in FIG. 6A, the first connecting vias 410 remain exposed and are further etched during the RIE step until exposing a top portion of the first metal layer 104. In an exemplary embodiment, a final depth of the connecting vias 410 may vary between approximately 50 nm and approximately 300 nm and ranges therebetween. A width of each of the first connecting vias 410 (as measured in the x-direction) may vary, for example, between approximately 20 nm and approximately 50 nm and ranges therebetween.

As shown in FIGS. 6A-6B, the first trenches 610 expose a top portion of the hardmask layer 120 and sidewall spacers 122. After transferring the pattern, the second photoresist layer 520 can be removed from the memory device 100 using any photoresist striping method known in the art.

Figure 7A:
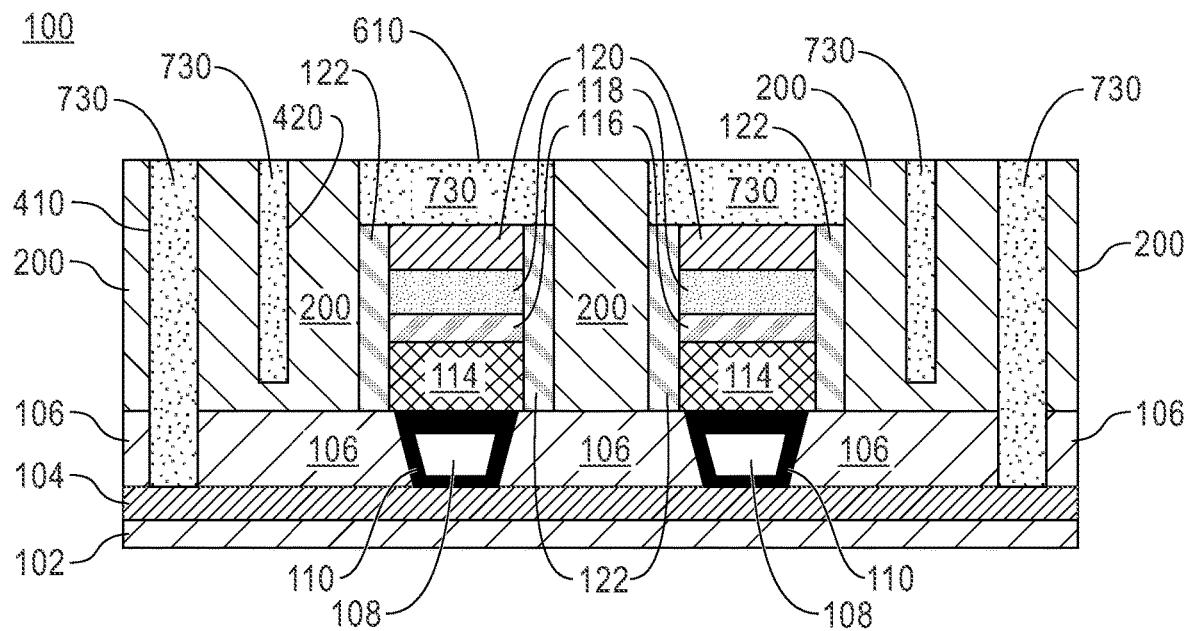
FIG. 7A is a cross-sectional view of the memory device across line A-A' after depositing a first conductive material, according to an embodiment of the present disclosure.
Figure 7B:
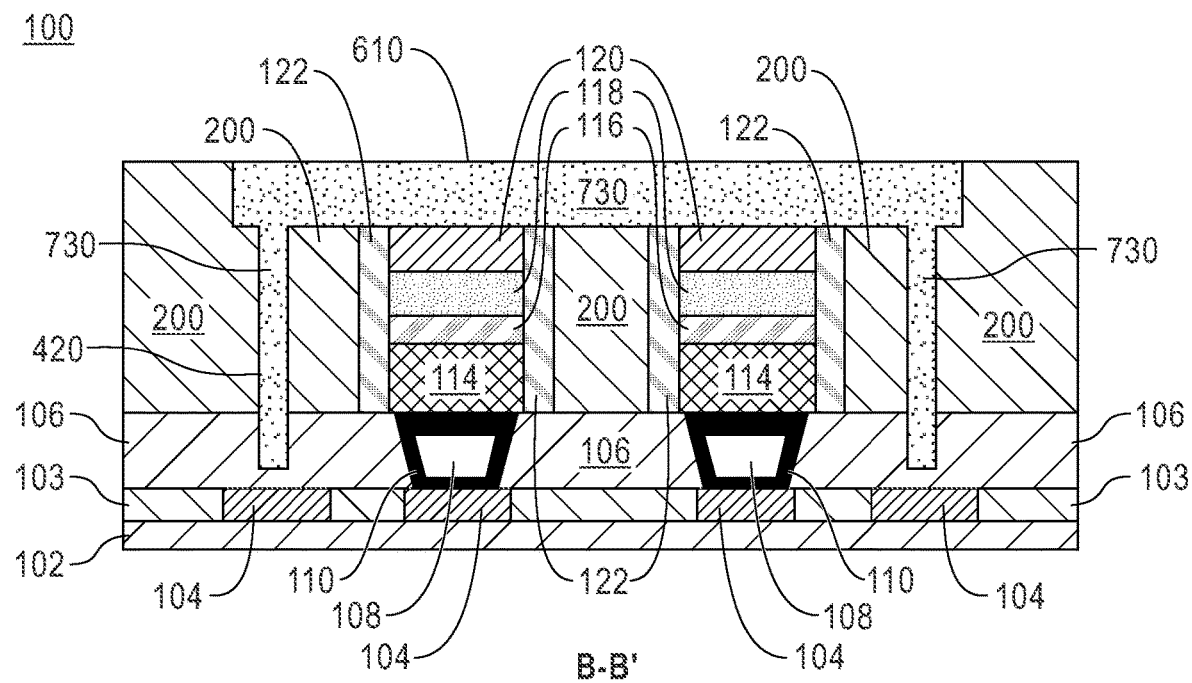
FIG. 7B is a cross-sectional view of the memory device across line B-B'.

Referring now to FIG. 7A, a cross-sectional view of the memory device 100 after depositing a first conductive material 730 is shown, according to an embodiment of the present disclosure. In this embodiment, FIG. 7C is a top-down view of the memory device 100, FIG. 7A is a cross-sectional view of the memory device 100 across line A-A' of FIG. 7C, and FIG. 7B is a cross-sectional view of the memory device 100 across line B-B' of FIG. 7C.

Figure 7C:
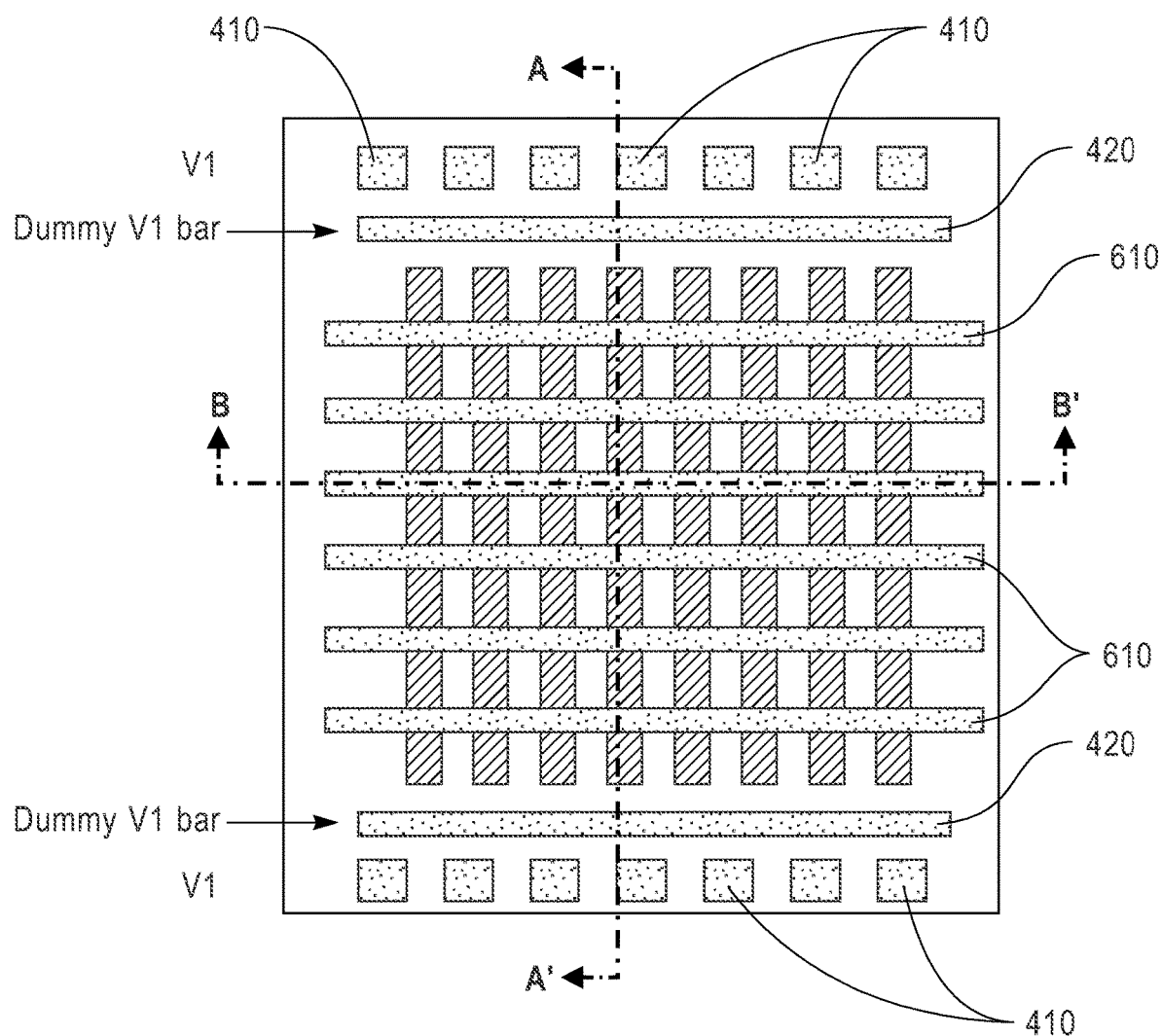
FIG. 7C is a top-down view of the memory device.

According to an embodiment, the deposited first conductive material 730 substantially fills the first connecting vias 410, the first dummy vias 420 and the first trenches 610 to form interconnect structures for the memory device 100 and dummy ($V_1$) bars shown in FIG. 7C. As known by those skilled in the art, the first connecting vias 410 and the first trenches 610 electrically connect the memory device 100 to additional circuit elements (e.g., the first metal layer 104 and FEOL layer 102).

Example of conductive materials that can be used to fill the first connecting vias 410, the first dummy vias 420 and the first trenches 610 include high permeability (m) metals such as, for example, cobalt (Co), iron (Fe), and nickel (Ni). In some embodiments, a metal liner (not shown) including, for example, titanium nitride (TiN) may be formed prior to depositing the first conductive material 730. The first conductive material 730 is conformally deposited on the memory device 100, substantially filling the first connecting vias 410, the first dummy vias 420 and the first trenches 610, as illustrated in the figures. Methods well-known in the art can be used to deposit the first conductive material 730 including, for example, atomic layer deposition (ALD), chemical vapor deposition (CVD), or plasma enhanced CVD (PECVD).

As depicted in the figures, the first dummy vias 420 now filled with the first conductive material 730 (dummy $V_1$ bars) remain in the memory device 100 adjacent to the MTJ stack 124. The high permeability metal (i.e., first conductive material 730) filling the first dummy vias 420 (FIGS. 4A-4C) is capable of guiding external magnetic fields around the MRAM array without disturbing the operation of the memory device 100.

Another embodiment by which the in array magnetic shield can be formed in the (PMA) STT-MRAM device is described in detailed below by referring to the accompanying drawings in FIGS. 8A-13C.

Figure 8A:
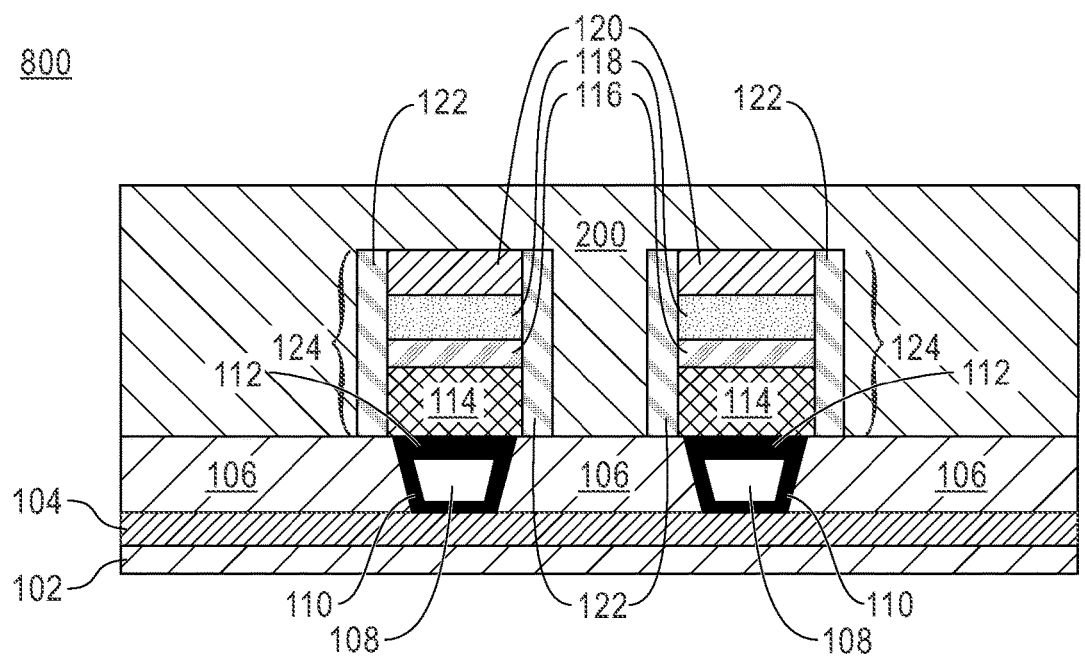
FIG. 8A is a cross-sectional view of a memory device across line A-A' at an intermediate step during a semiconductor manufacturing process, according to another embodiment of the present disclosure.
Figure 8B:
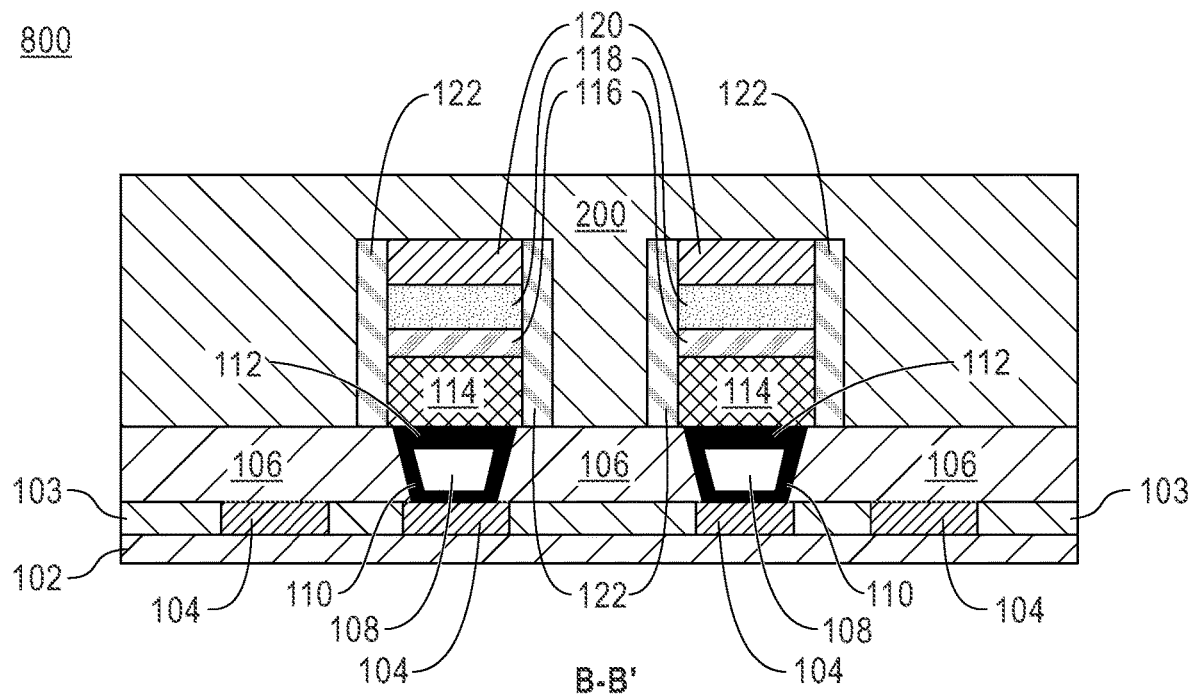
FIG. 8B is a cross-sectional view of the memory device across line B-B'.
Figure 8C:
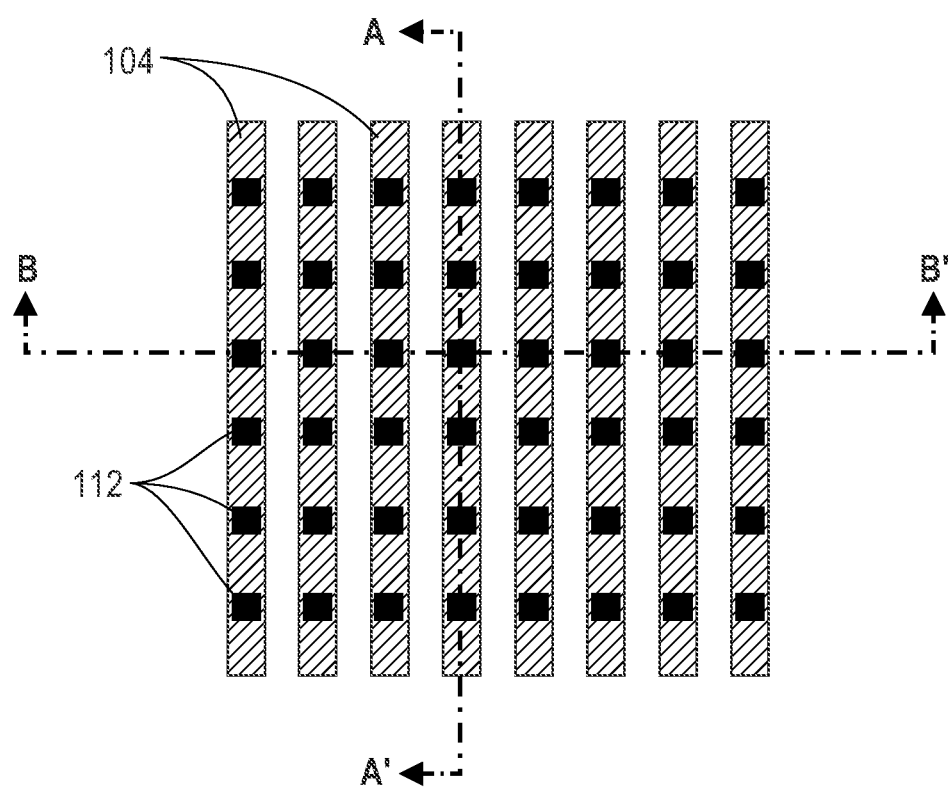
FIG. 8C is a top-down view of the memory device.

Referring now to FIG. 8A, a cross-sectional view of a memory device 800 at an intermediate step during a semiconductor manufacturing process is shown, according to an embodiment of the present disclosure. In this embodiment, FIG. 8C is a top-down view of the memory device 800, FIG. 8A is a cross-sectional view of the memory device 800 across line A-A' of FIG. 8C, and FIG. 8B is a cross-sectional view of the memory device 800 across line B-B' of FIG. 8C.

At this step of the manufacturing process, the memory device 800 may include substantially the same elements as the memory device 100 depicted in FIGS. 2A-2C.

Figure 9A:
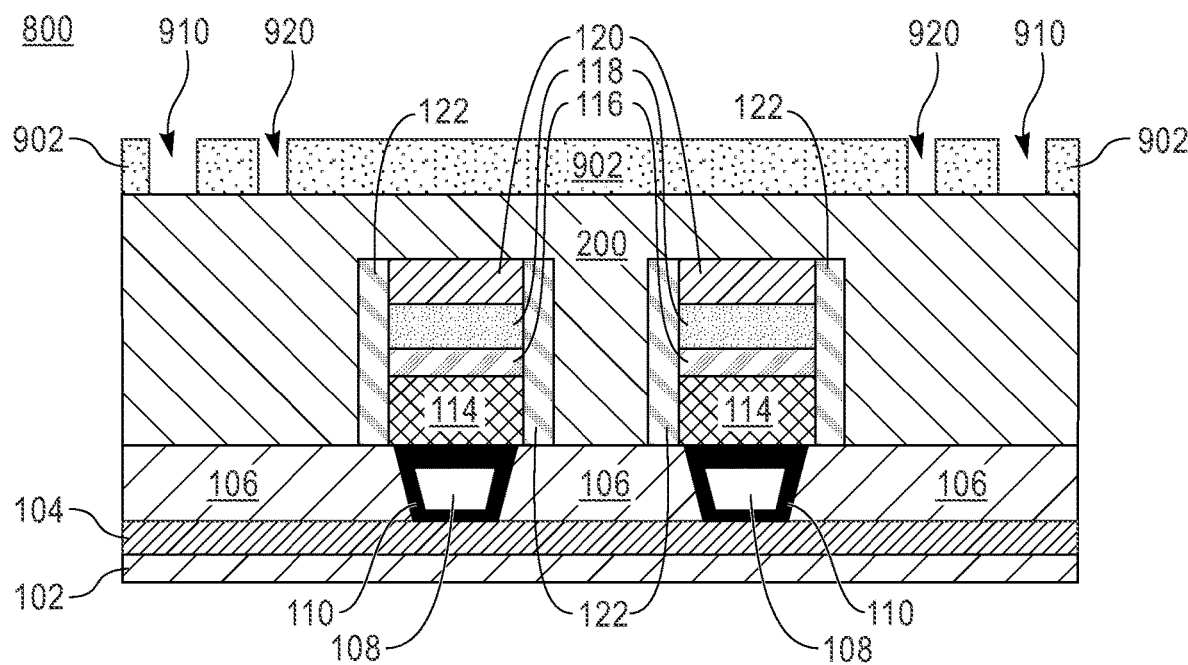
FIG. 9A is a cross-sectional view of the memory device across line A-A' after depositing a third photoresist layer, according to another embodiment of the present disclosure.
Figure 9B:
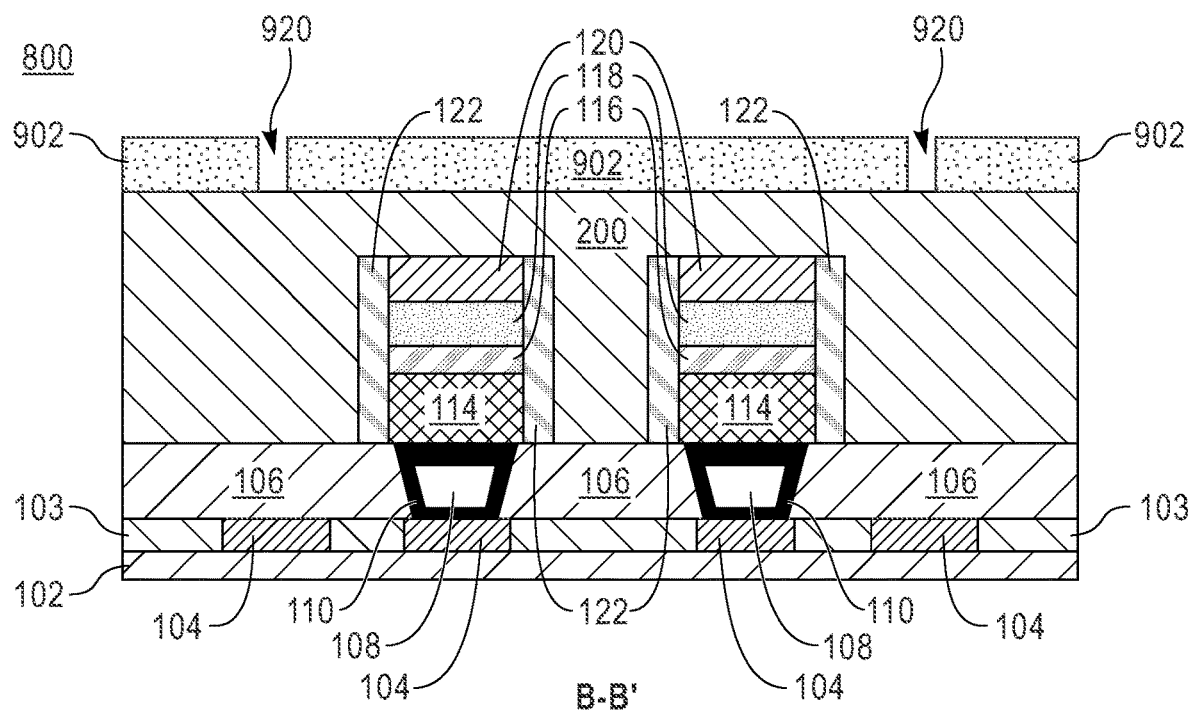
FIG. 9B is a cross-sectional view of the memory device across line B-B'.
Figure 9C:
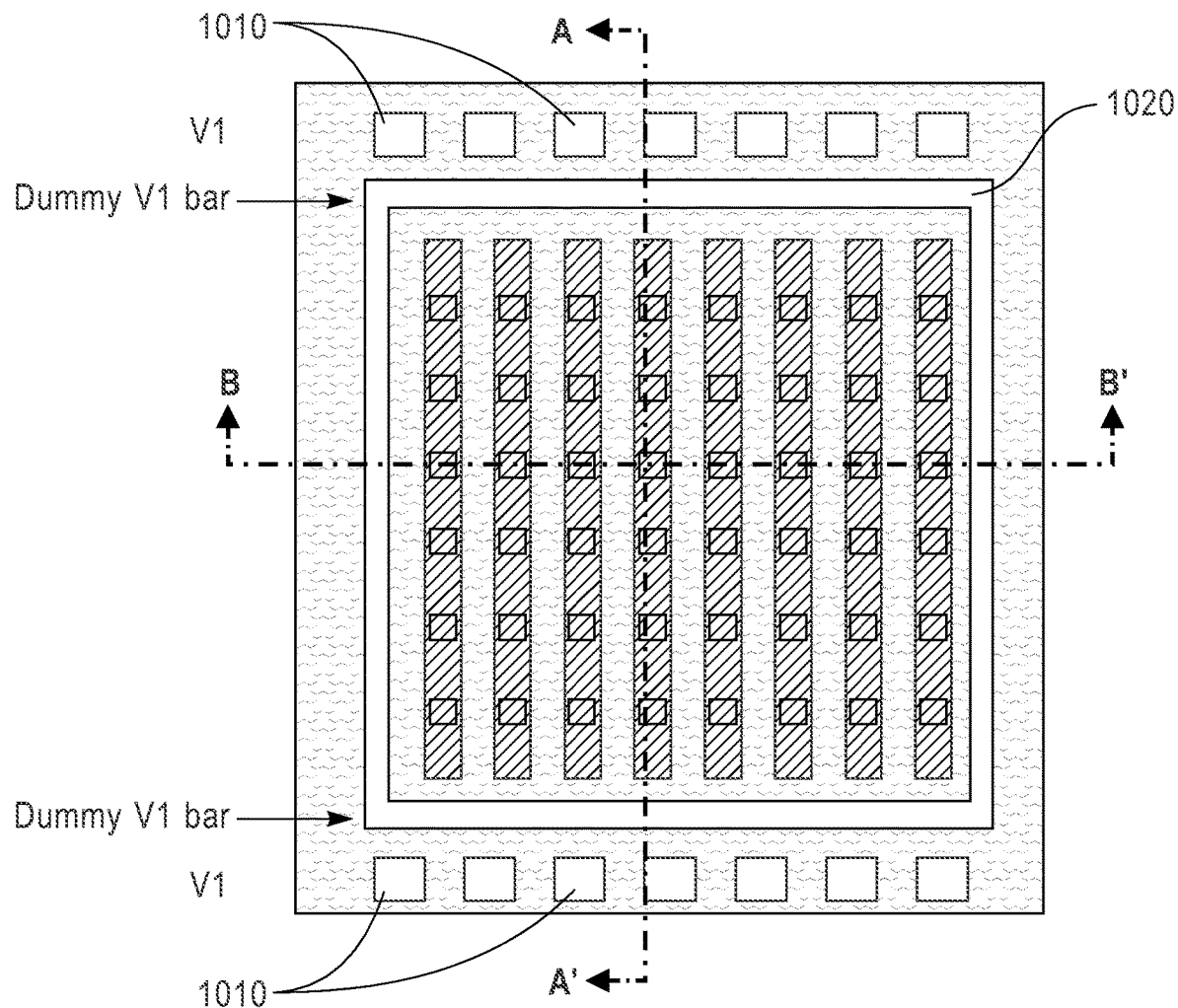
FIG. 9C is a top-down view of the memory device.
Figure 10A:
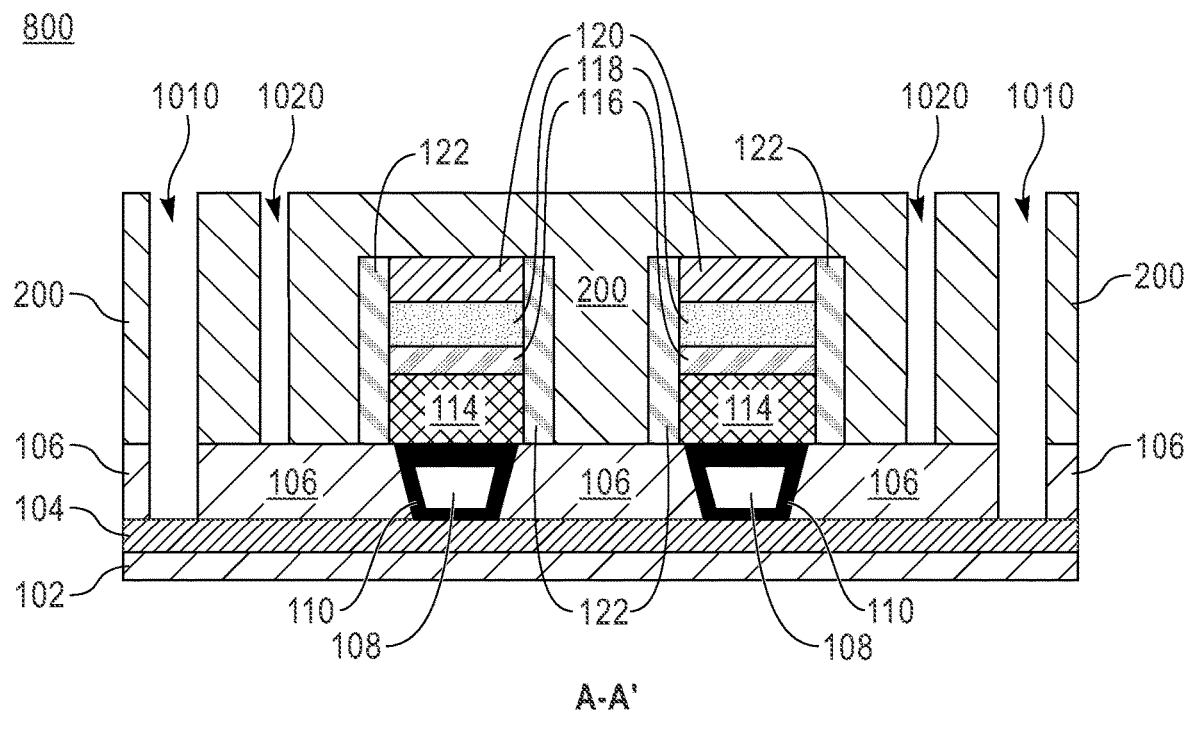
FIG. 10A is a cross-sectional view of the memory device across line A-A' after patterning a dielectric filling layer to form second connecting vias and second dummy vias, according to another embodiment of the present disclosure.

Referring now to FIG. 9A and FIG. 10A simultaneously, cross-sectional views of the memory device 800 after depositing a third photoresist layer 902 and patterning the dielectric filling layer 200 to form second connecting vias 1010 and second dummy vias 1020 are shown, according to an embodiment of the present disclosure. In this embodiment, FIG. 9C is a top-down view of the memory device 800, FIG. 9A is a cross-sectional view of the memory device 800 across line A-A' of FIG. 9C, and FIG. 9B is a cross-sectional view of the memory device 800 across line B-B' of FIG. 9C. Similarly, FIG. 10C is a top-down view of the memory device 800, FIG. 10A is a cross-sectional view of the memory device 800 across line A-A' of FIG. 10C, and FIG. 10B is a cross-sectional view of the memory device 800 across line B-B' of FIG. 10C.

The third photoresist layer 902 is deposited above the dielectric filling layer 200 for forming second connecting vias 1010 and second dummy vias 1020 (shown in FIGS. 10A-10C) using well-known lithography and RIE processing. As described above, patterning of the dielectric filling layer 200 to form the second connecting vias 1010 and second dummy vias 1020 involves exposing a pattern 910, 920 on the third photoresist layer 902 and transferring the exposed pattern to the dielectric filling layer 200, as shown in FIGS. 10A-10C. After transferring the pattern 910, 920 and forming the second connecting vias 1010 and second dummy vias 1020, the third photoresist layer 902 can be removed from the memory device 800 using any photoresist striping method known in the art including, for example, plasma ashing.

Figure 10B:
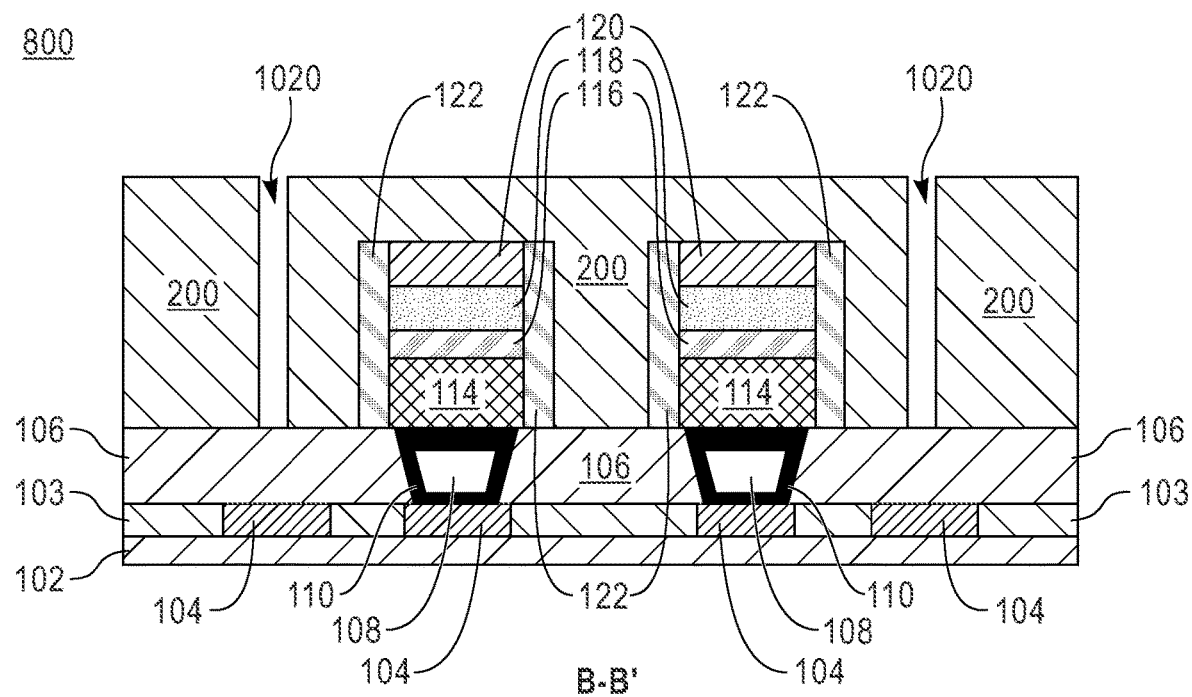
FIG. 10B is a cross-sectional view of the memory device across line B-B'.
Figure 10C:
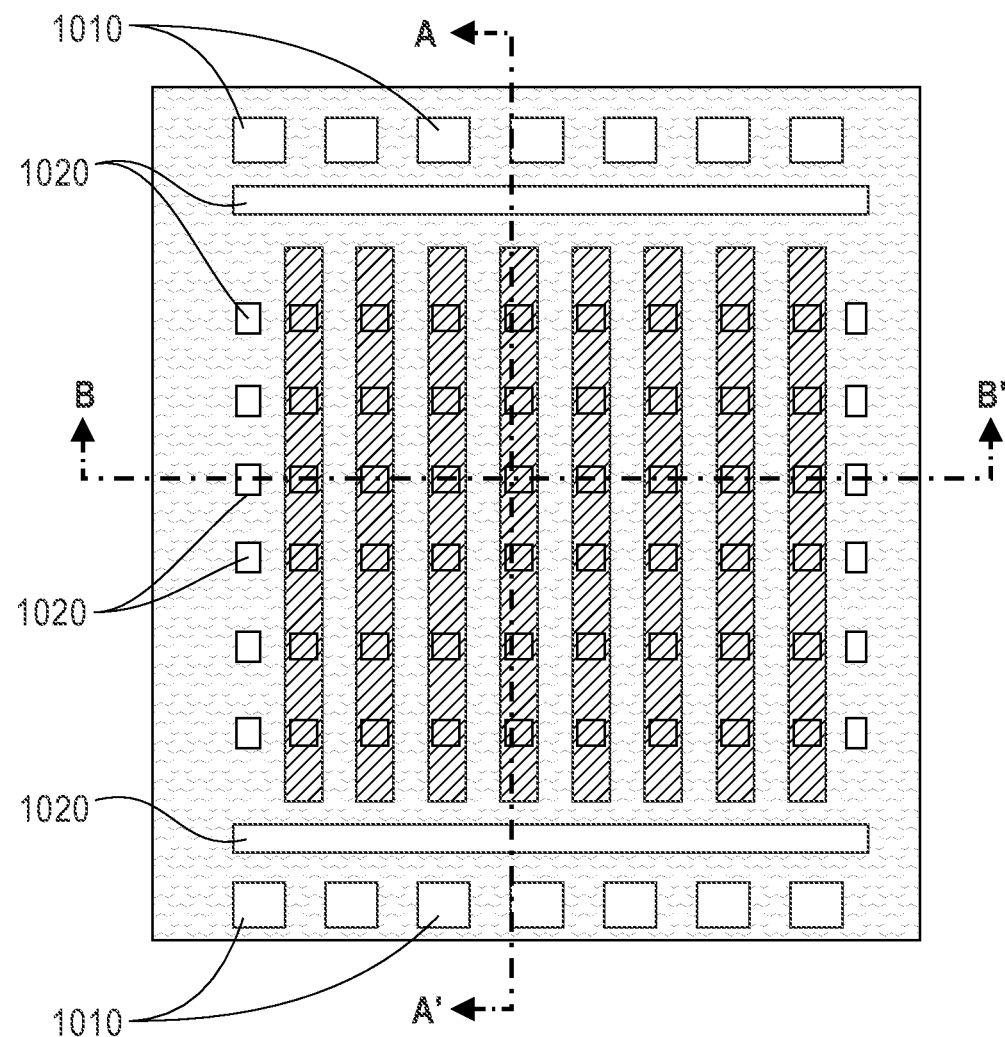
FIG. 10C is a top-down view of the memory device.

With continued reference to FIGS. 10A-10C, the second connecting vias 1010 extend vertically through the dielectric filling layer 200 until the top portion of the first metal layer 104. Specifically, in this embodiment, during (V1) RIE the second connecting vias 1010 and second dummy vias 1020 are formed simultaneously, with the second connecting vias 1010 extending to the top portion of the first metal layer 104. Further, in this embodiment, the second dummy vias 1020 are formed with a higher aspect ratio that helps avoiding reaching the first metal layer 104 ($M_1$ level).

In an exemplary embodiment, a depth of the second connecting vias 1010 may vary between approximately 50 nm and approximately 300 nm and ranges therebetween. A width of each of the second connecting vias 1010 (as measured in the x-direction) may vary, for example, between approximately 20 nm and approximately 50 nm and ranges therebetween.

In this embodiment, the second dummy vias 1020 extend vertically through the dielectric filling layer 200 until a top portion of the interconnect dielectric material layer 106. Thus, in this embodiment, a depth of each of the second dummy vias 1020 (as measured in the y-direction) may at least be equal to a thickness of the dielectric filling layer 200. A width of each of the second dummy vias 1020 (as measured in the x-direction) may vary, for example, between approximately 10 nm and approximately 20 nm and ranges therebetween. As mentioned above, to improve shielding efficiency, a distance between the second dummy vias 1020 and the MTJ stack 124 (FIG. 8A) may, for example, vary between approximately 50 nm and approximately 500 nm. Similarly, a distance between the second connecting vias 1010 and second dummy vias 1020 may, for example, vary between approximately 50 nm to approximately 200 nm.

Figure 11A:
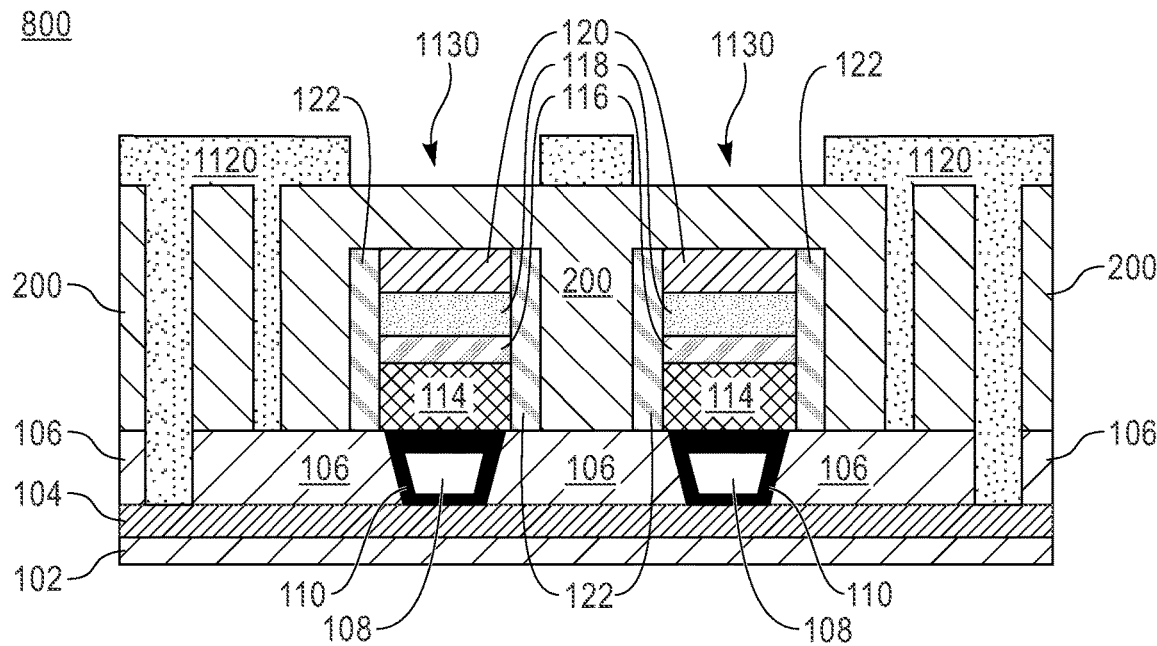
FIG. 11A is a cross-sectional view of the memory device across line A-A' after depositing a fourth photoresist layer, according to another embodiment of the present disclosure.
Figure 11B:
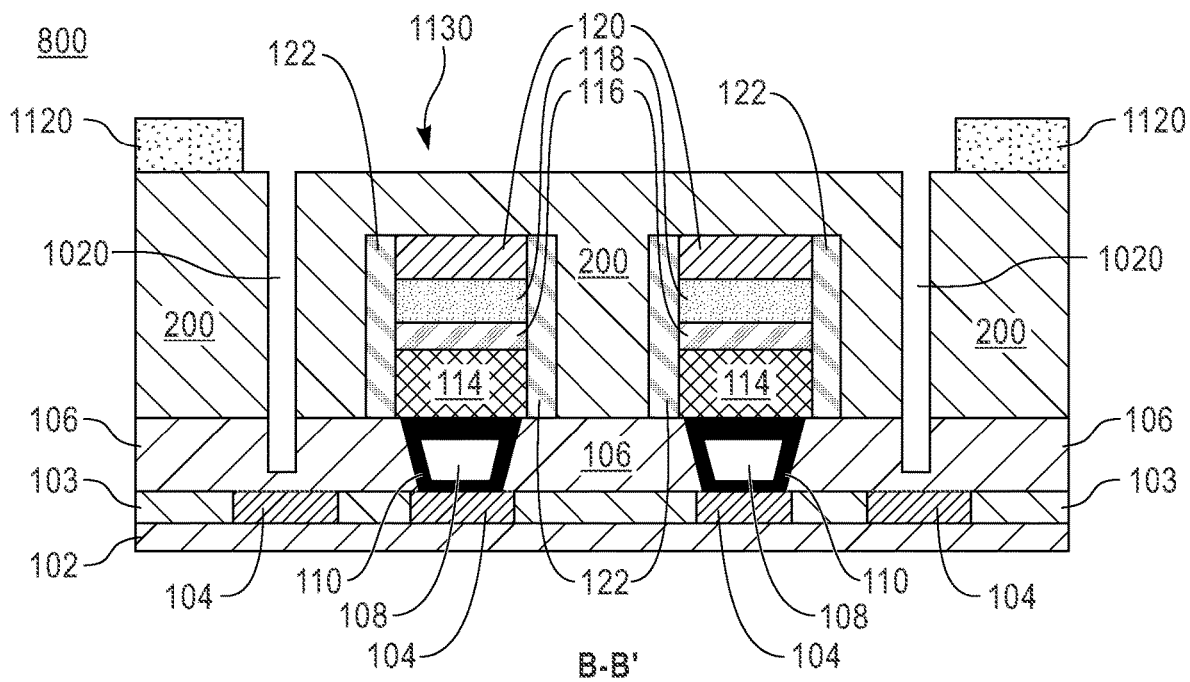
FIG. 11B is a cross-sectional view of the memory device across line B-B'.
Figure 11C:
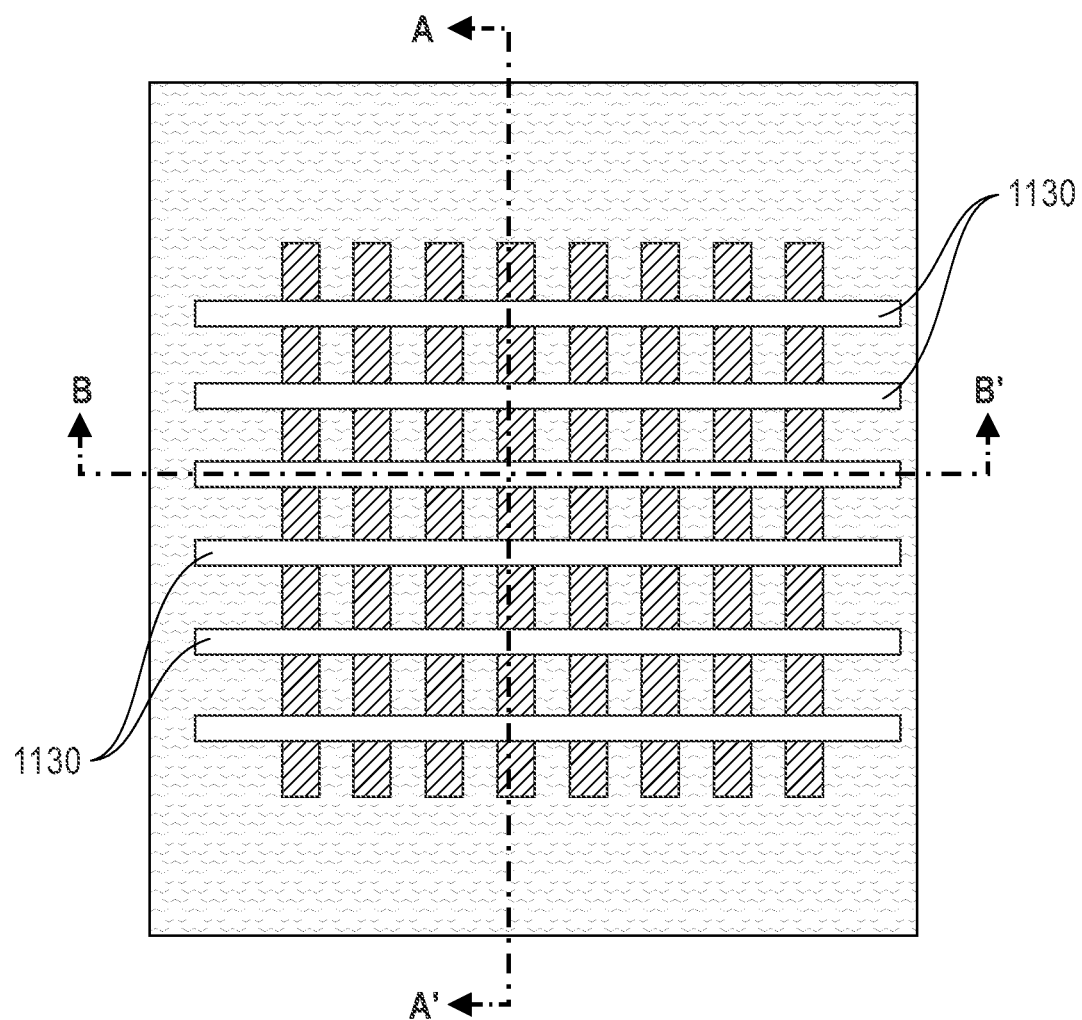
FIG. 11C is a top-down view of the memory device.
Figure 12A:
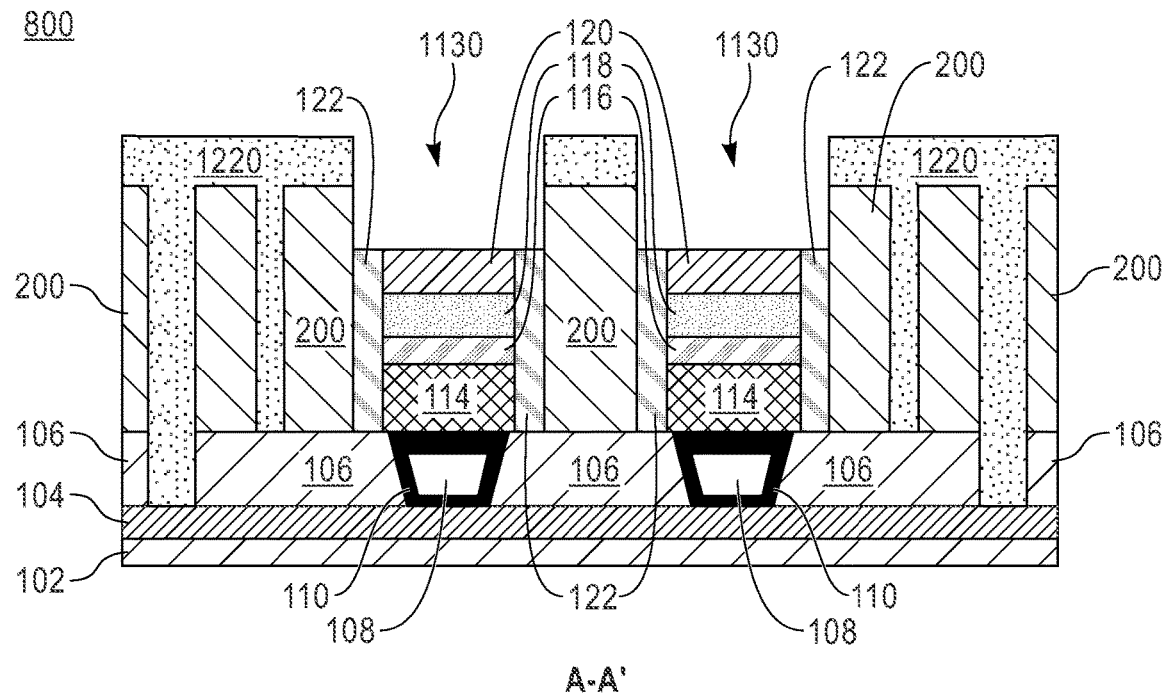
FIG. 12A is a cross-sectional view of the memory device across line A-A' after patterning the dielectric filling layer to form second trenches, according to another embodiment of the present disclosure.
Figure 12B:
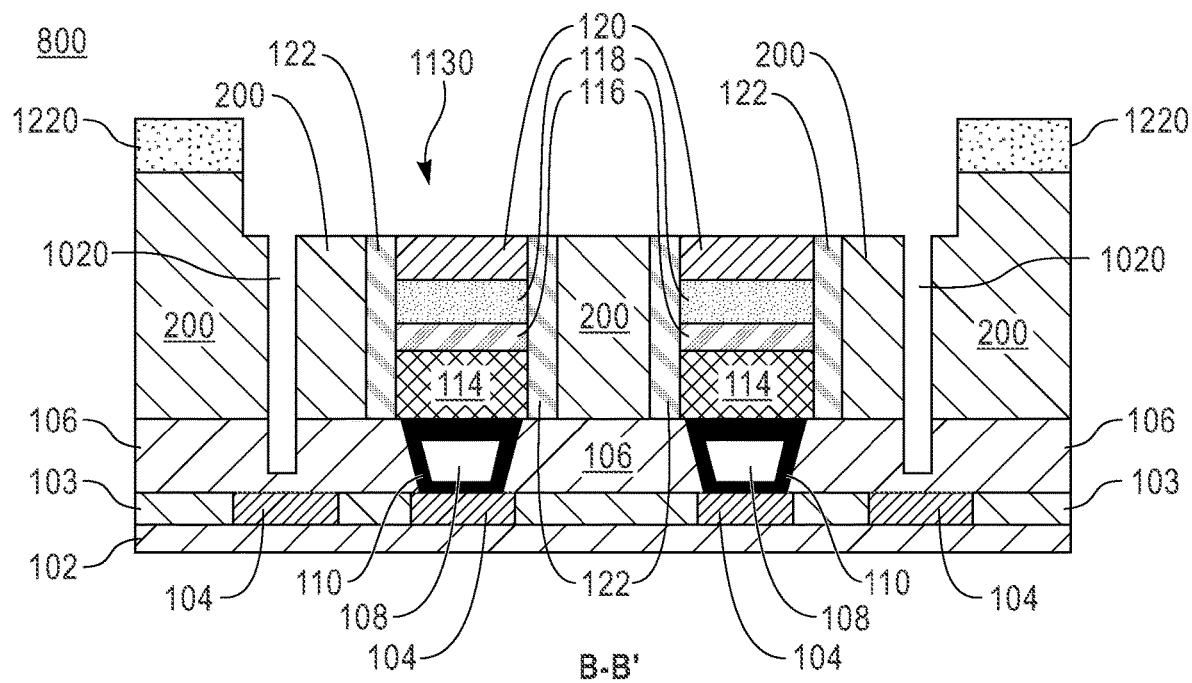
FIG. 12B is a cross-sectional view of the memory device across line B-B'.
Figure 12C:
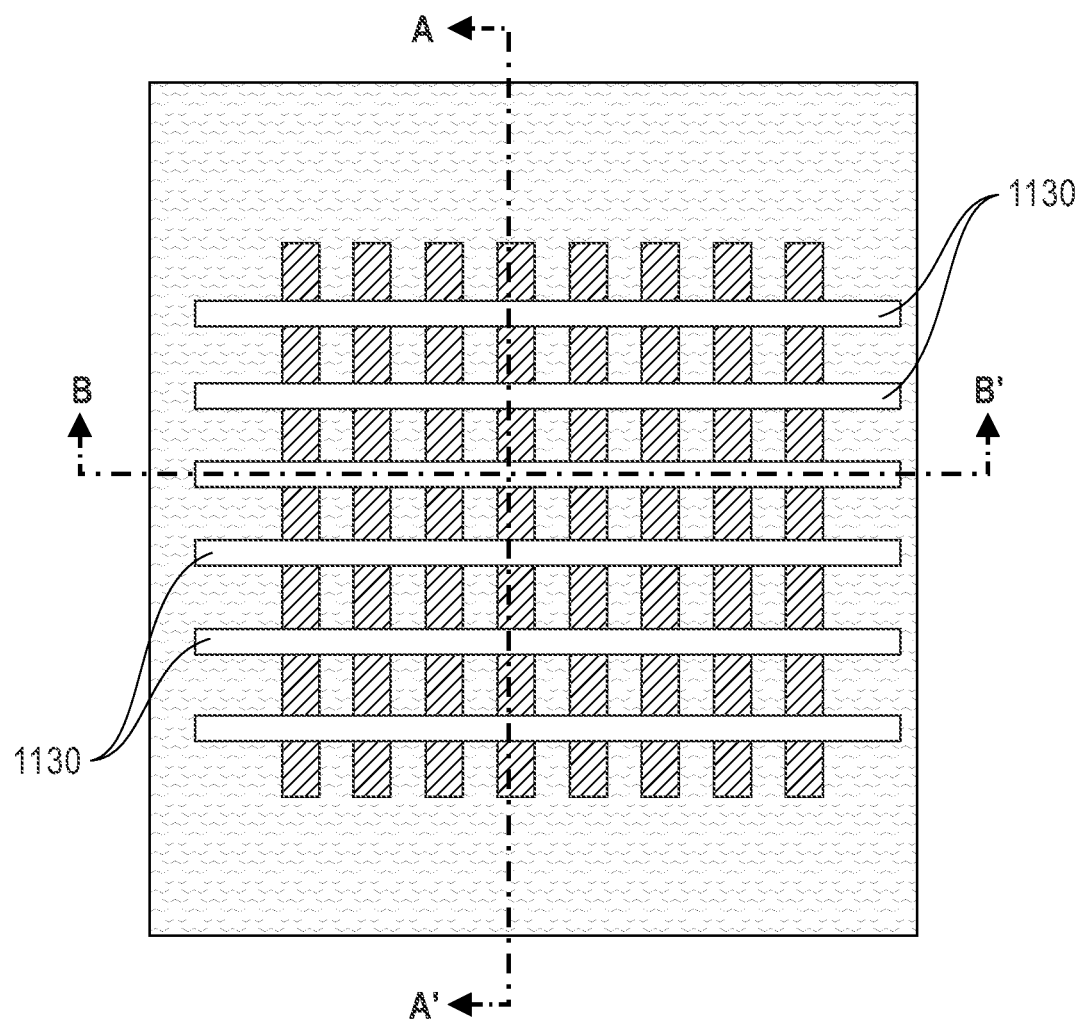
FIG. 12C is a top-down view of the memory device.

Referring now to FIG. 11A and FIG. 12A simultaneously, cross-sectional views of the memory device 800 after depositing a fourth photoresist layer 1220 and patterning the dielectric filling layer 200 to form second trenches 1130 are shown, according to an embodiment of the present disclosure. In this embodiment, FIG. 11C is a top-down view of the memory device 800, FIG. 11A is a cross-sectional view of the memory device 800 across line A-A' of FIG. 11C, and FIG. 11B is a cross-sectional view of the memory device 800 across line B-B' of FIG. 11C. Similarly, FIG. 12C is a top-down view of the memory device 800, FIG. 12A is a cross-sectional view of the memory device 800 across line A-A' of FIG. 12C, and FIG. 12B is a cross-sectional view of the memory device 800 across line B-B' of FIG. 12C.

Similarly to the process of forming the second connecting vias 1010 and second dummy vias 1020 described above, forming the second trenches 1130 involves exposing a pattern (not shown) on the fourth photoresist layer 1220 and transferring the exposed pattern to the dielectric filling layer 200 using known lithography and RIE processing. As depicted in FIG. 11A, the fourth photoresist layer 1120 substantially fills the second connecting vias 1010 and the second dummy vias 1020 (FIG. 10A) protecting them during subsequent etching steps. Similar to the first trenches 610 (FIGS. 6A-6C), the second trenches 1130 expose a top portion of the hardmask layer 120 and sidewall spacers 122, as shown in FIGS. 12A-12B. After transferring the pattern, the fourth photoresist layer 1220 can be removed from the memory device 800 using any photoresist striping method known in the art.

Figure 13A:
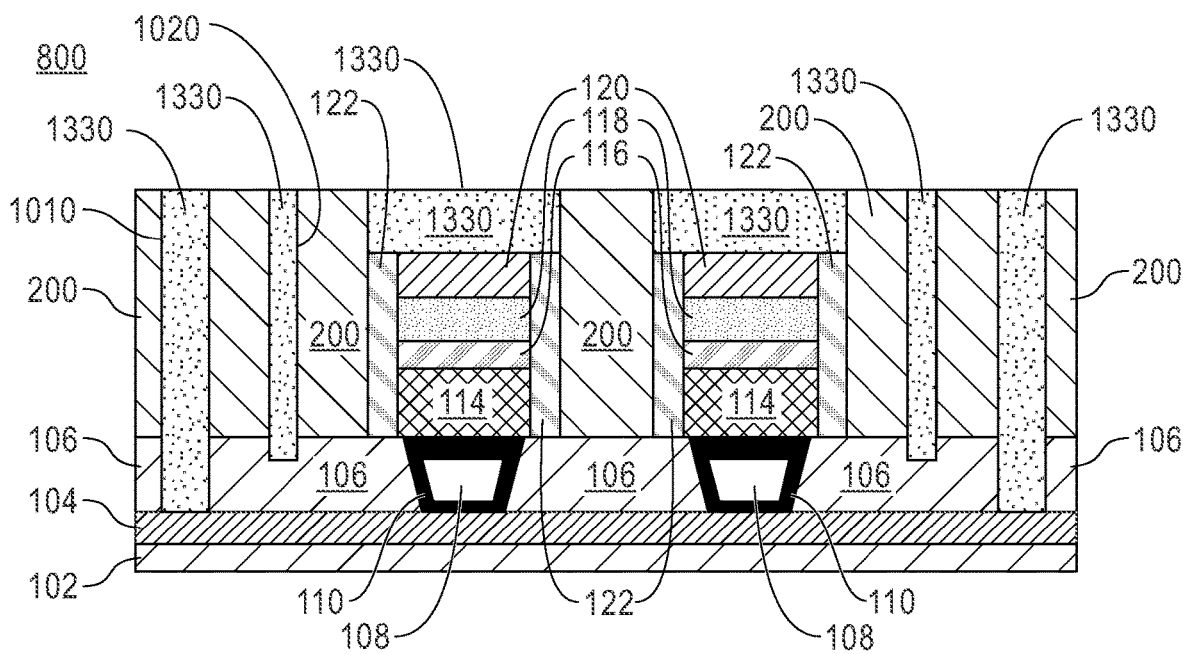
FIG. 13A is a cross-sectional view of the memory device across line A-A' after depositing a second conductive material, according to another embodiment of the present disclosure.
Figure 13B:
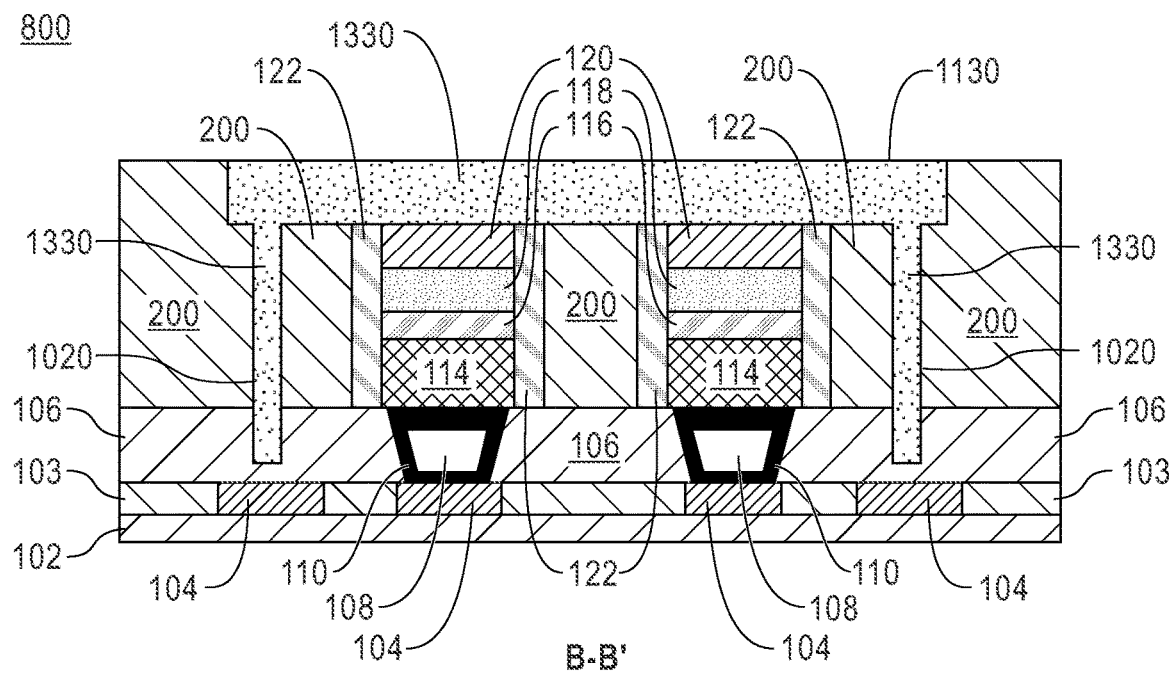
FIG. 13B is a cross-sectional view of the memory device across line B-B'.
Figure 13C:
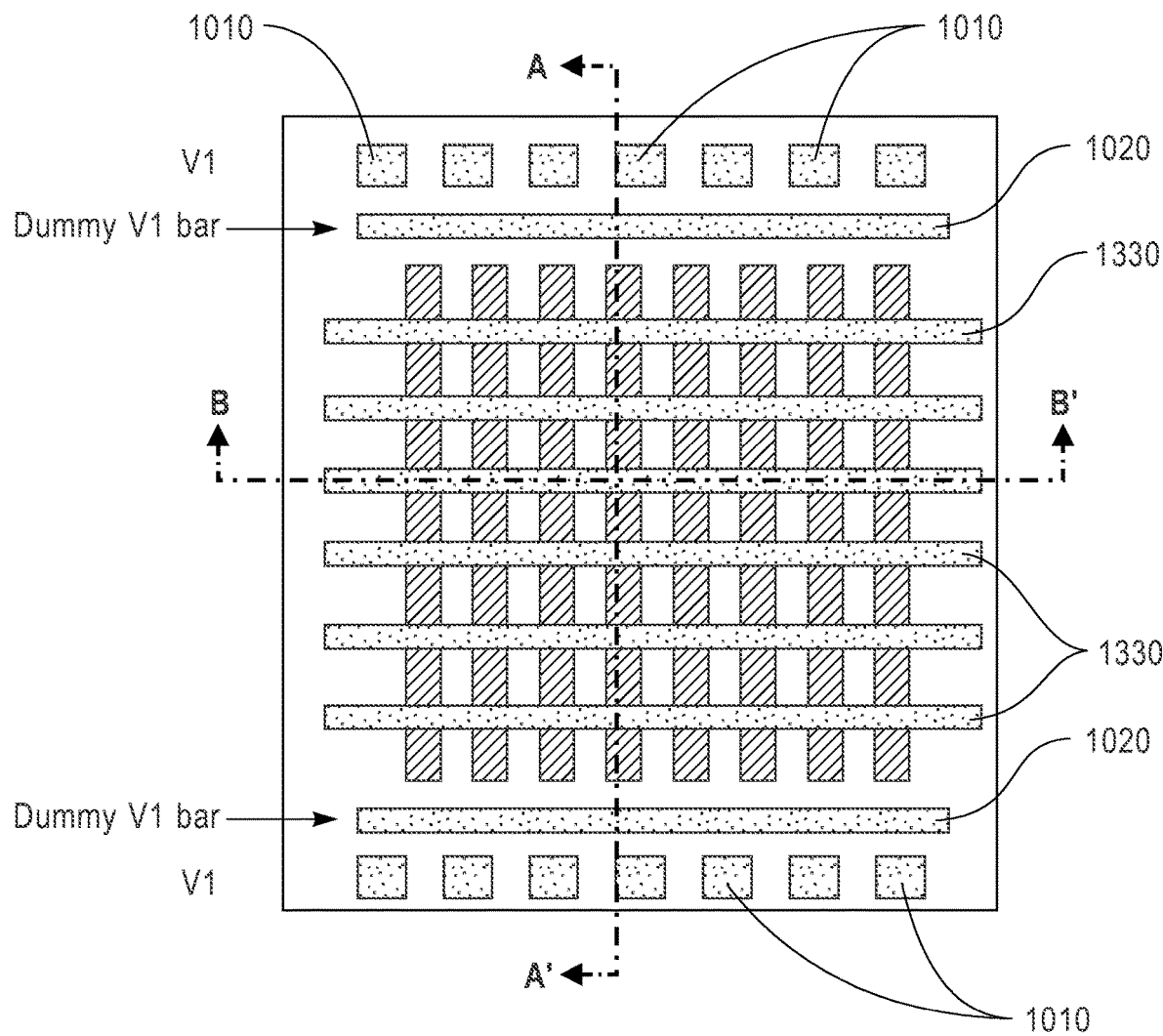
FIG. 13C is a top-down view of the memory device.

Referring now to FIG. 13A, a cross-sectional view of the memory device 800 after depositing a second conductive material 1330 is shown, according to an embodiment of the present disclosure. In this embodiment, FIG. 13C is a top-down view of the memory device 800, FIG. 13A is a cross-sectional view of the memory device 800 across line A-A' of FIG. 13C, and FIG. 13B is a cross-sectional view of the memory device 800 across line B-B' of FIG. 13C.

Similar to the first conductive material 730 (FIGS. 7A-7C), the second conductive material 1330 substantially fills the second connecting vias 1010, the second dummy vias 1020 and the second trenches 1130 to form interconnect structures for electrically connecting the memory device 800 to other structures and (V1) dummy bars for guiding an external magnetic field. The second conductive material 1330 include similar materials and is formed in analogous ways as the first conductive material 730. Thus, the second conductive material 1330 also includes a high permeability (m) metal for guiding the external magnetic field around the MRAM array without disturbing the operation of the memory device 800, as explained above.

Yet another embodiment by which the in array magnetic shield can be formed in the (PMA) STT-MRAM device is described in detailed below by referring to the accompanying drawings in FIGS. 14A-22C.

Figure 14A:
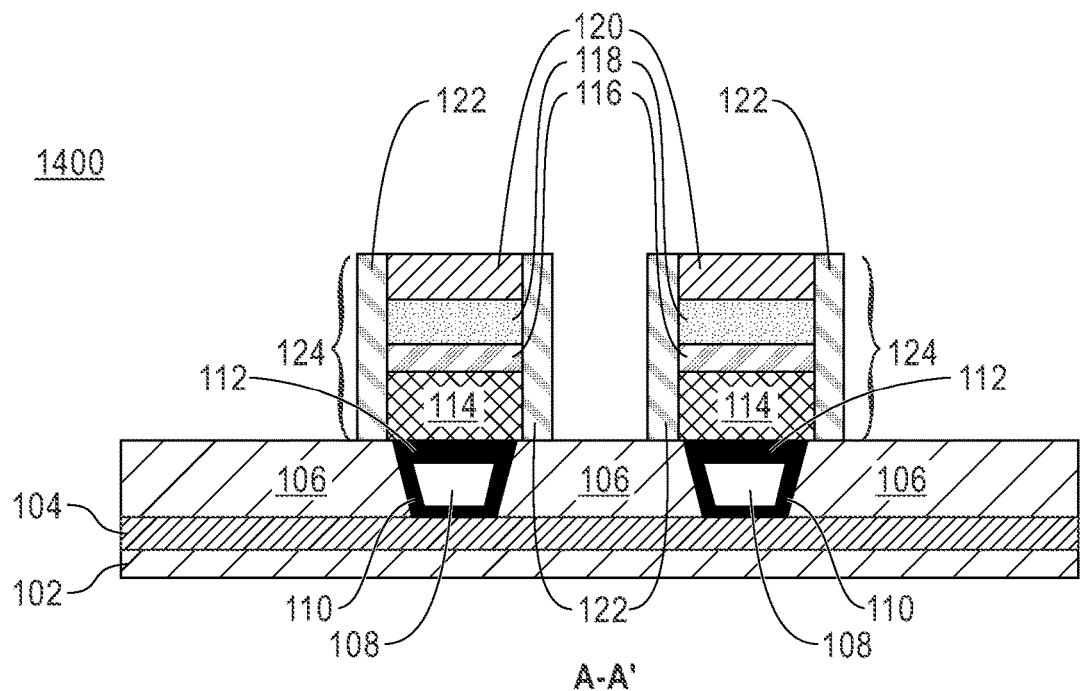
FIG. 14A is a cross-sectional view of a memory device across line A-A' at an intermediate step during a semiconductor manufacturing process, according to yet another embodiment of the present disclosure.
Figure 14B:
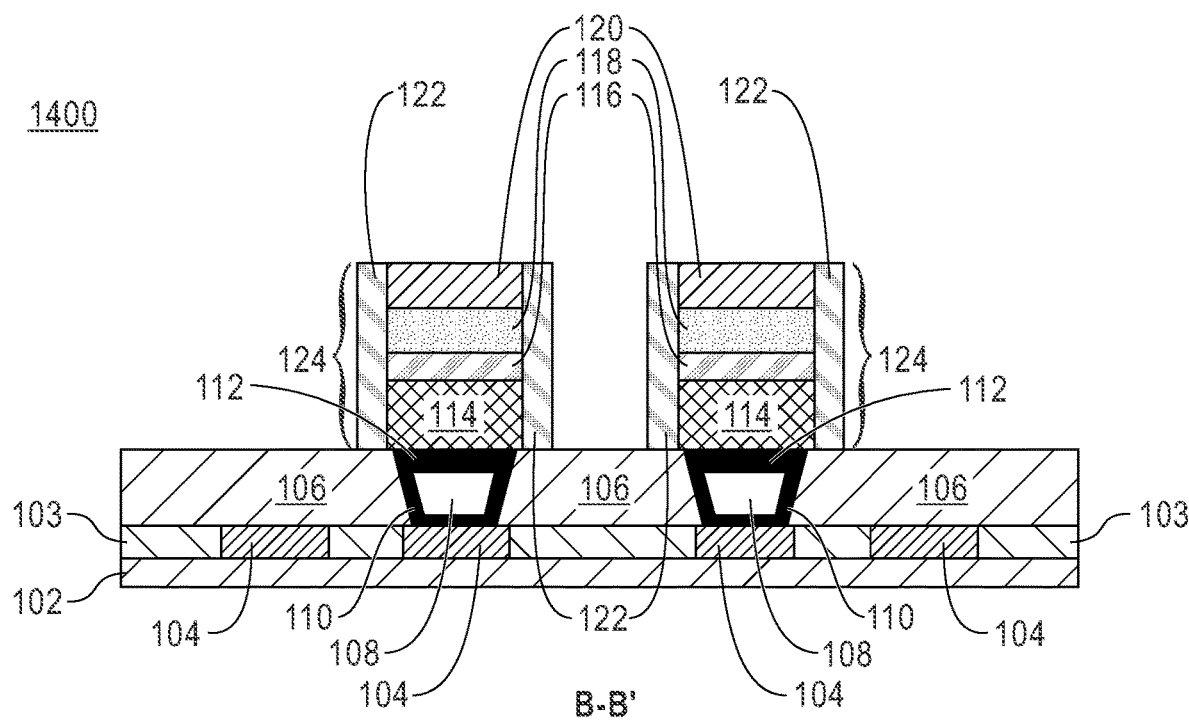
FIG. 14B is a cross-sectional view of the memory device across line B-B'.
Figure 14C:
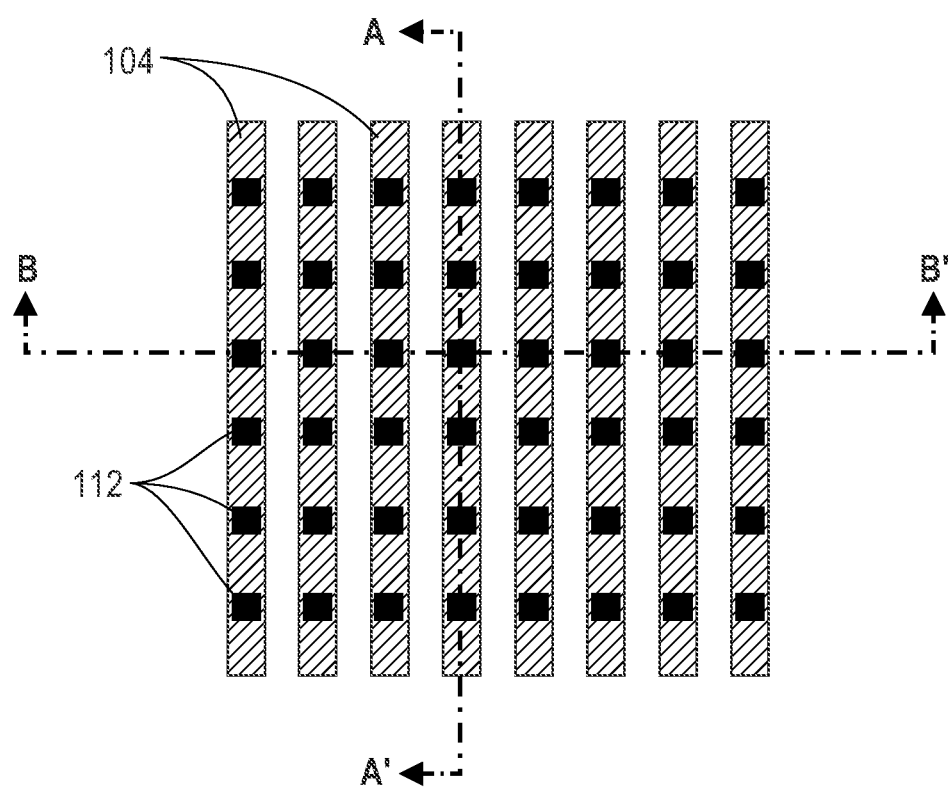
FIG. 14C is a top-down view of the memory device.

Referring now to FIG. 14A, a cross-sectional view of a memory device 1400 at an intermediate step during a semiconductor manufacturing process is shown, according to an embodiment of the present disclosure. In this embodiment, FIG. 14C is a top-down view of the memory device 1400, FIG. 14A is a cross-sectional view of the memory device 1400 across line A-A' of FIG. 14C, and FIG. 14B is a cross-sectional view of the memory device 1400 across line B-B' of FIG. 14C.

At this step of the manufacturing process, the memory device 1400 may include substantially the same elements as the memory device 100 depicted in FIGS. 1A-1C.

Figure 15A:
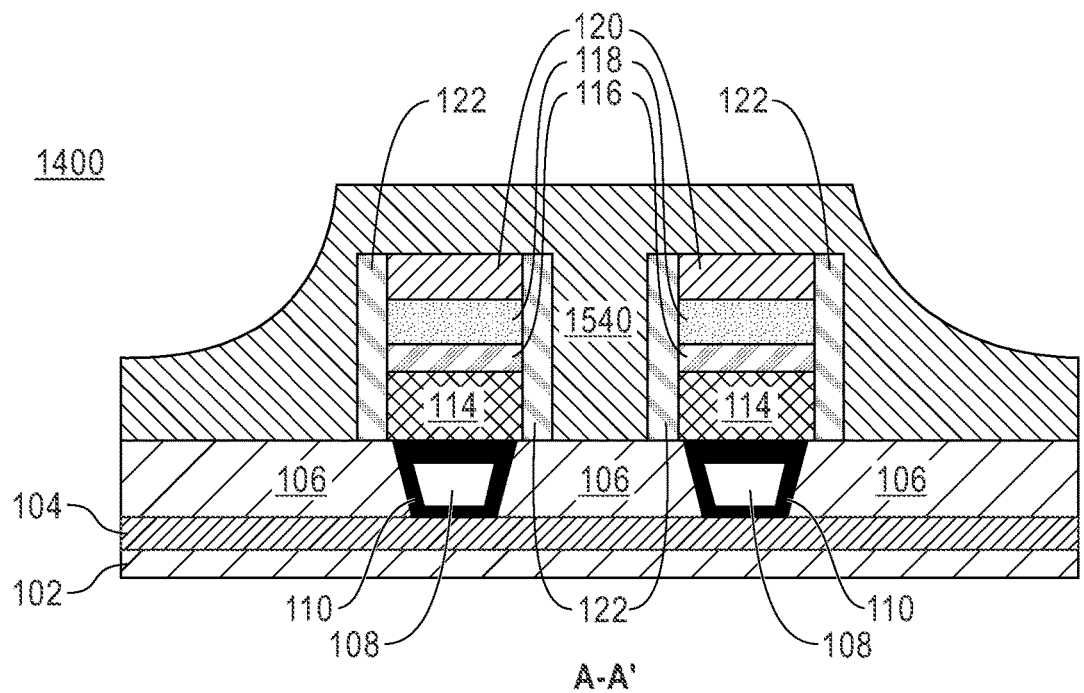
FIG. 15A is a cross-sectional view of the memory device across line A-A' after depositing an etch stop layer, according to yet another embodiment of the present disclosure.
Figure 15B:
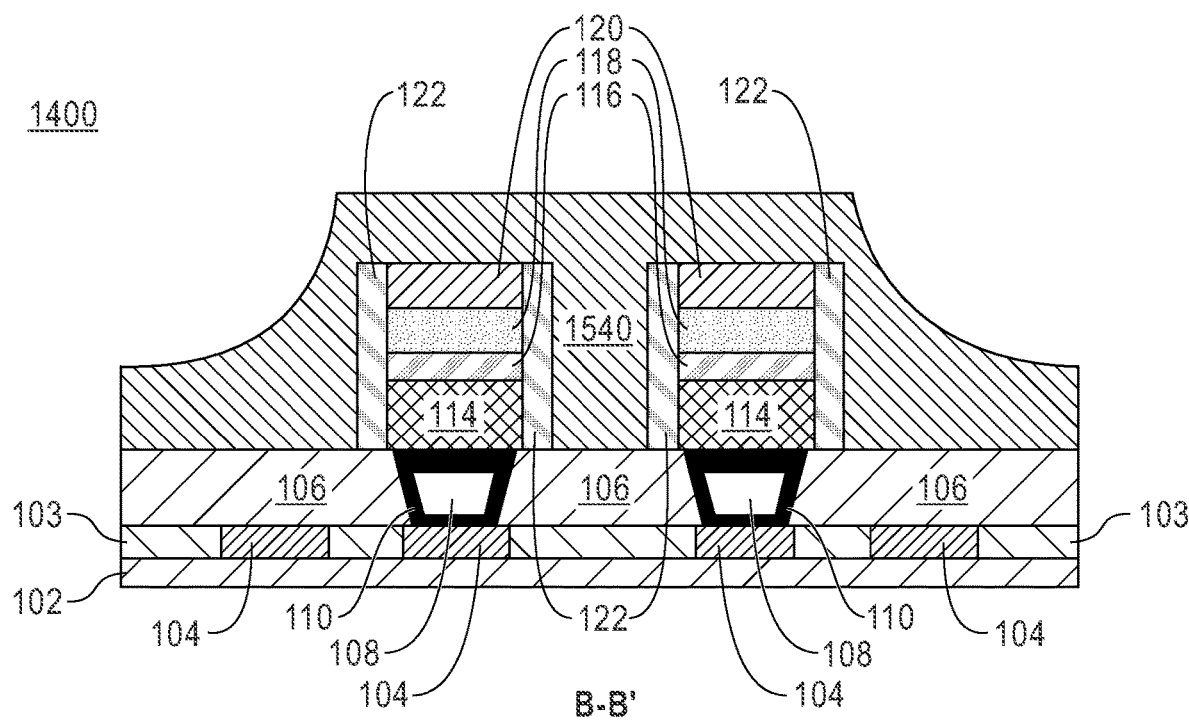
FIG. 15B is a cross-sectional view of the memory device across line B-B'.
Figure 15C:
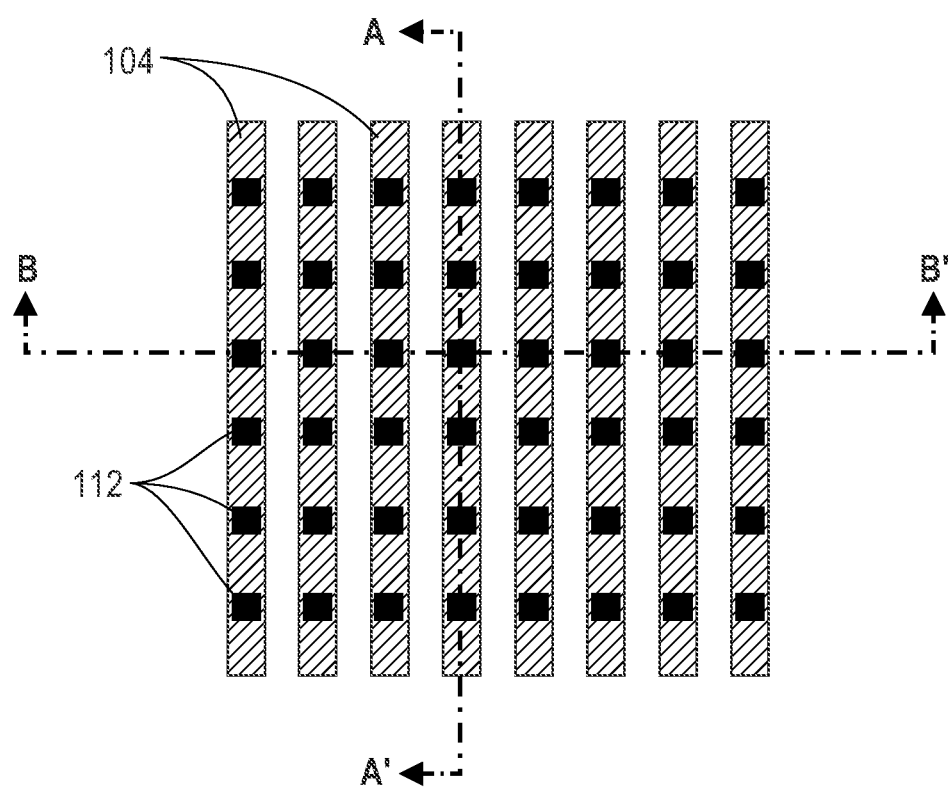
FIG. 15C is a top-down view of the memory device.

Referring now to FIG. 15A, a cross-sectional view of the memory device after depositing an etch stop layer 1540 is shown, according to an embodiment of the present disclosure. In this embodiment, FIG. 15C is a top-down view of the memory device 1400, FIG. 15A is a cross-sectional view of the memory device 1400 across line A-A' of FIG. 15C, and FIG. 15B is a cross-sectional view of the memory device 1400 across line B-B' of FIG. 15C.

According to an embodiment, the etch stop layer 1540 is formed on the memory device 1400 using known deposition methods. For example, a CVD process can be used to form the etch stop layer on the memory device 1400. The etch stop layer 1540 may include any suitable etch stop material. In an exemplary embodiment, the etch stop layer 1540 is made of amorphous silicon (a-Si). The etch stop layer 1540 may function as an etch stop during the subsequent formation of third dummy vias 1920 (FIGS. 19A-19C) as will be described in detail below.

Figure 16A:
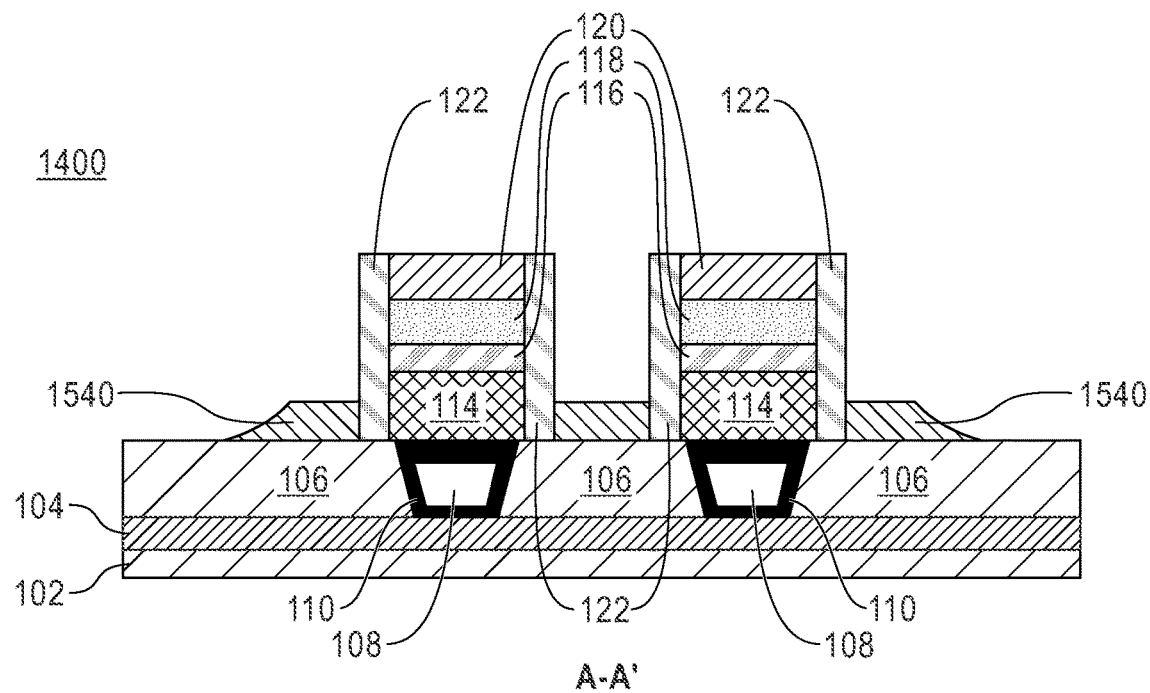
FIG. 16A is a cross-sectional view of the memory device across line A-A' after etching the etch stop layer, according to yet another embodiment of the present disclosure.
Figure 16B:
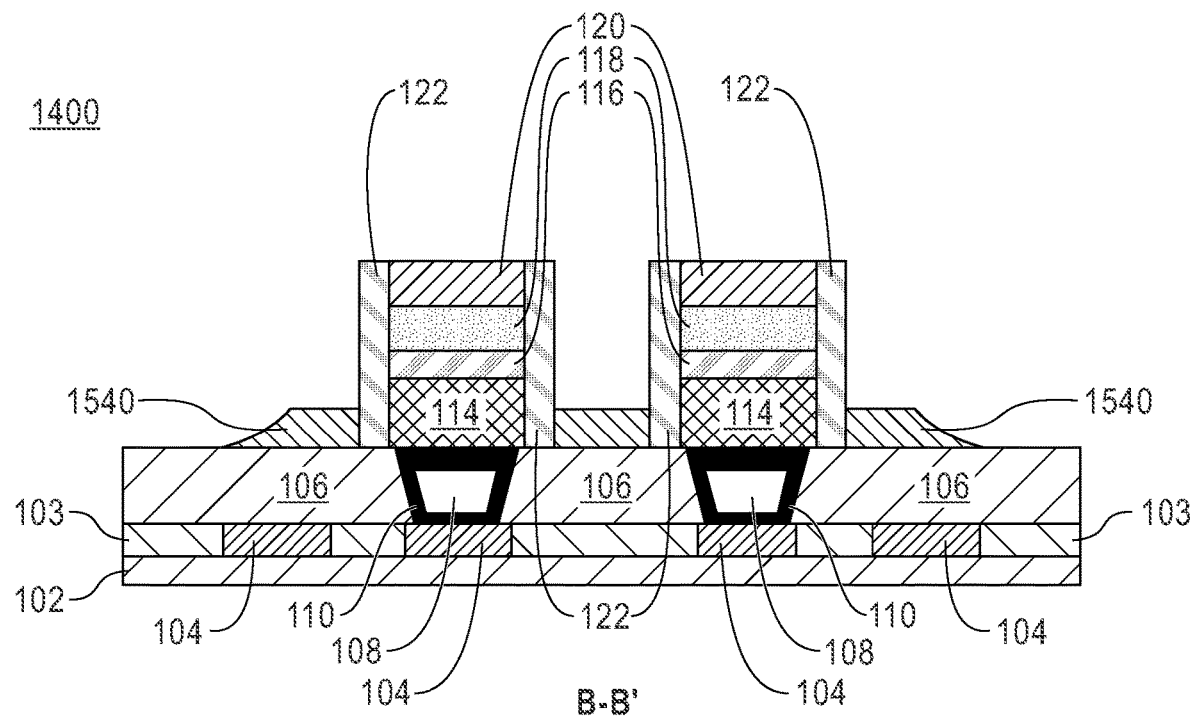
FIG. 16B is a cross-sectional view of the memory device across line B-B'.
Figure 16C:
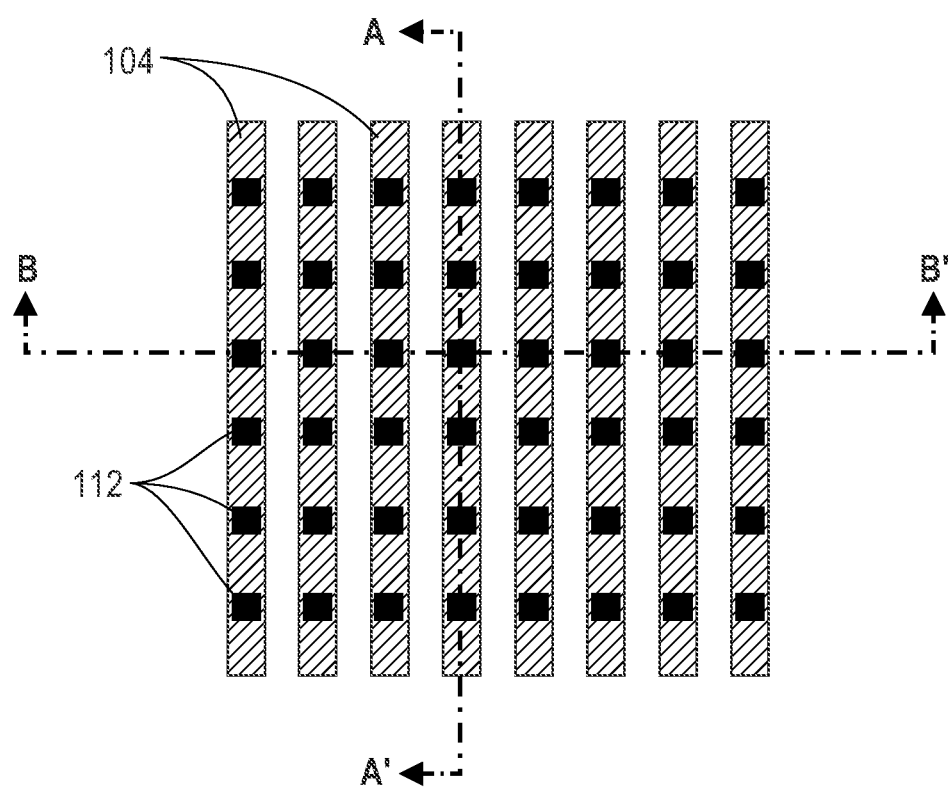
FIG. 16C is a top-down view of the memory device.

Referring now to FIG. 16A, a cross-sectional view of the memory device 1400 after etching the etch stop layer 1540 is shown, according to an embodiment of the present disclosure. In this embodiment, FIG. 16C is a top-down view of the memory device 1400, FIG. 16A is a cross-sectional view of the memory device 1400 across line A-A' of FIG. 16C, and FIG. 16B is a cross-sectional view of the memory device 1400 across line B-B' of FIG. 16C.

In this step, the etch stop layer 1540 is recessed until a (vertical) thickness of the etch stop layer 1540 varies between approximately 10 nm and 30 nm. and ranges therebetween. It should be noted that outer portions of the etch stop layer 1540 above the interconnect dielectric material layer 106 are also removed from the memory device 1400. By removing outer portions of the etch stop layer 1540, a (horizontal) width of the etch stop layer 1540 varies between approximately 10 nm and 50 nm, and ranges therebetween. Thus, the etch stop layer 1540 covers portions of the interconnect dielectric material 106 adjacent to the magnetic tunnel junction stack 124 (FIG. 14A) and a bottom portion of the magnetic tunnel junction stack 124 (FIG. 14A).

Figure 19A:
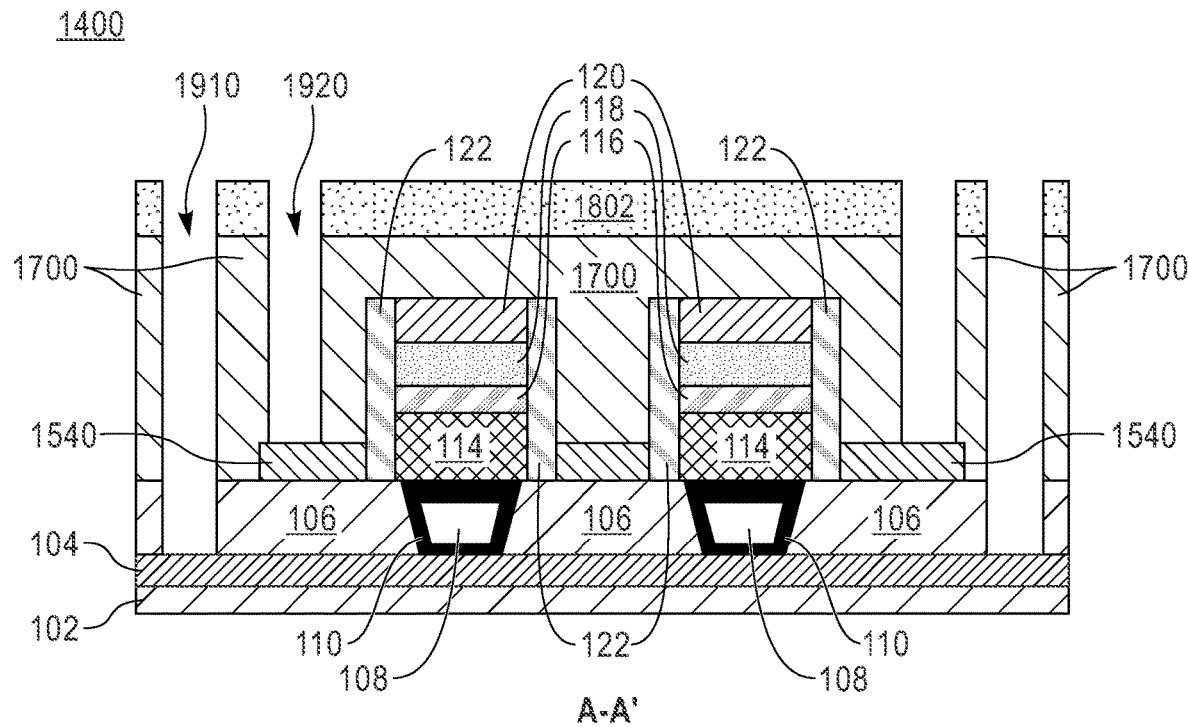
FIG. 19A is a cross-sectional view of the memory device across line A-A' after patterning the second dielectric filling layer to form third connecting vias and third dummy vias, according to yet another embodiment of the present disclosure.
Figure 19B:
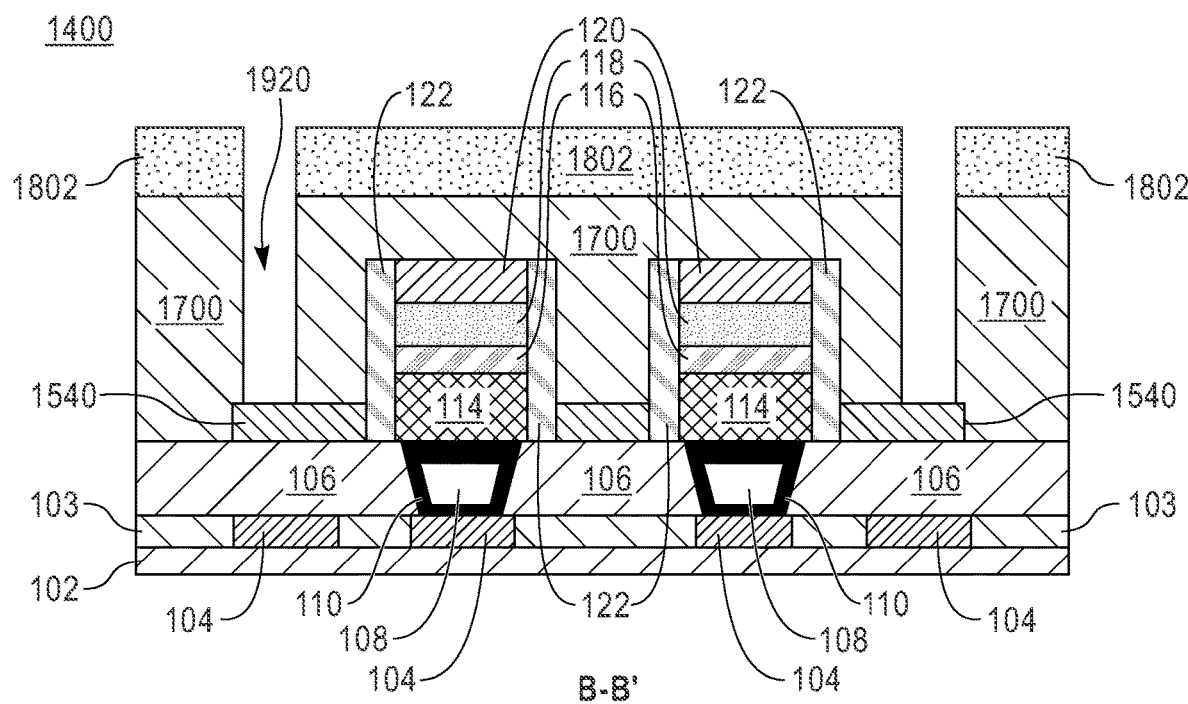
FIG. 19B is a cross-sectional view of the memory device across line B-B'.
Figure 19C:
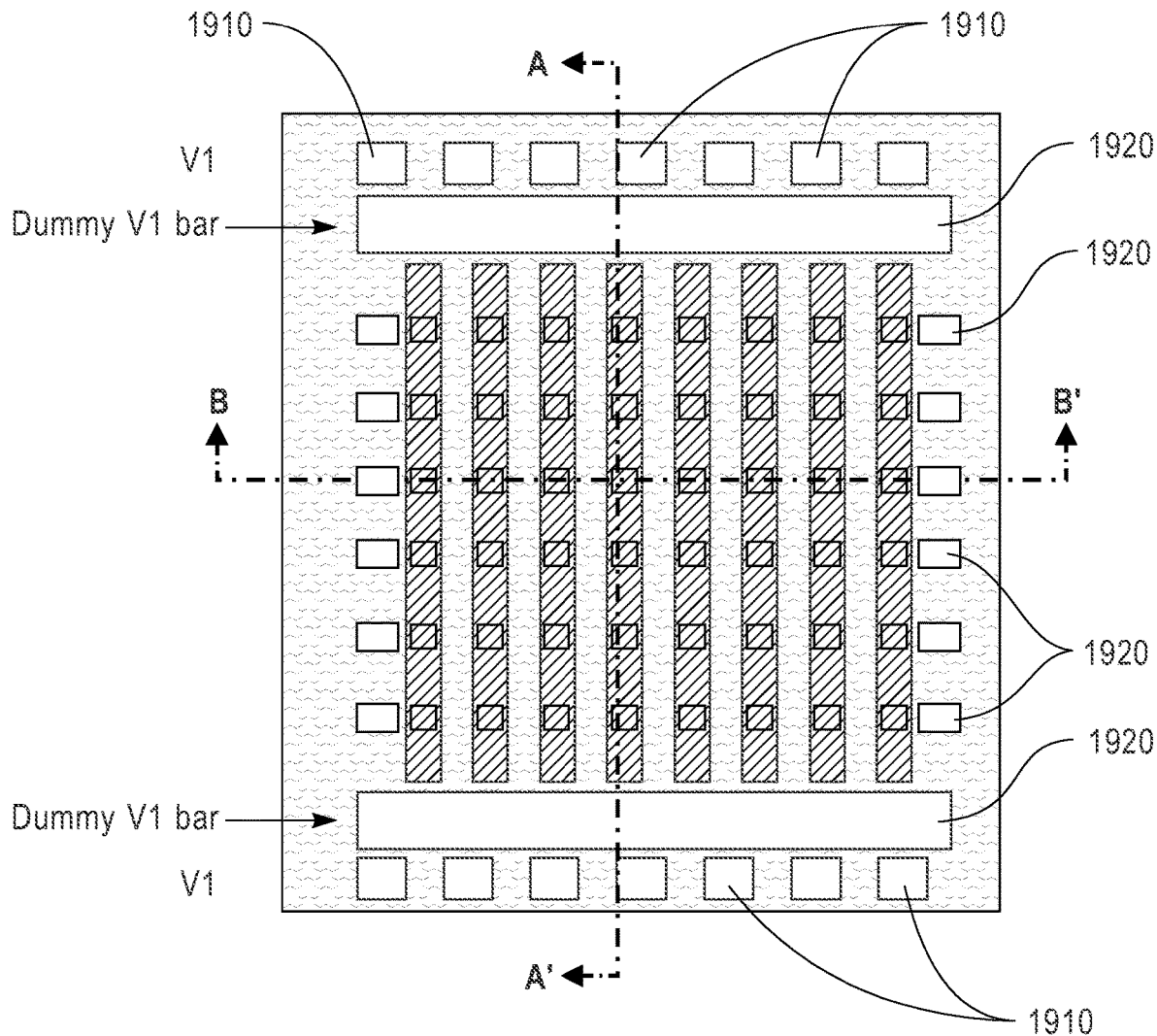
FIG. 19C is a top-down view of the memory device.

As will be observed in FIGS. 19A-19C, by reducing the width of the etch stop layer 1540, third connecting vias 1910 can be formed all the way through the first metal layer 104 while the third dummy vias 1920 are formed until reaching the etch stop layer 1540.

Figure 17A:
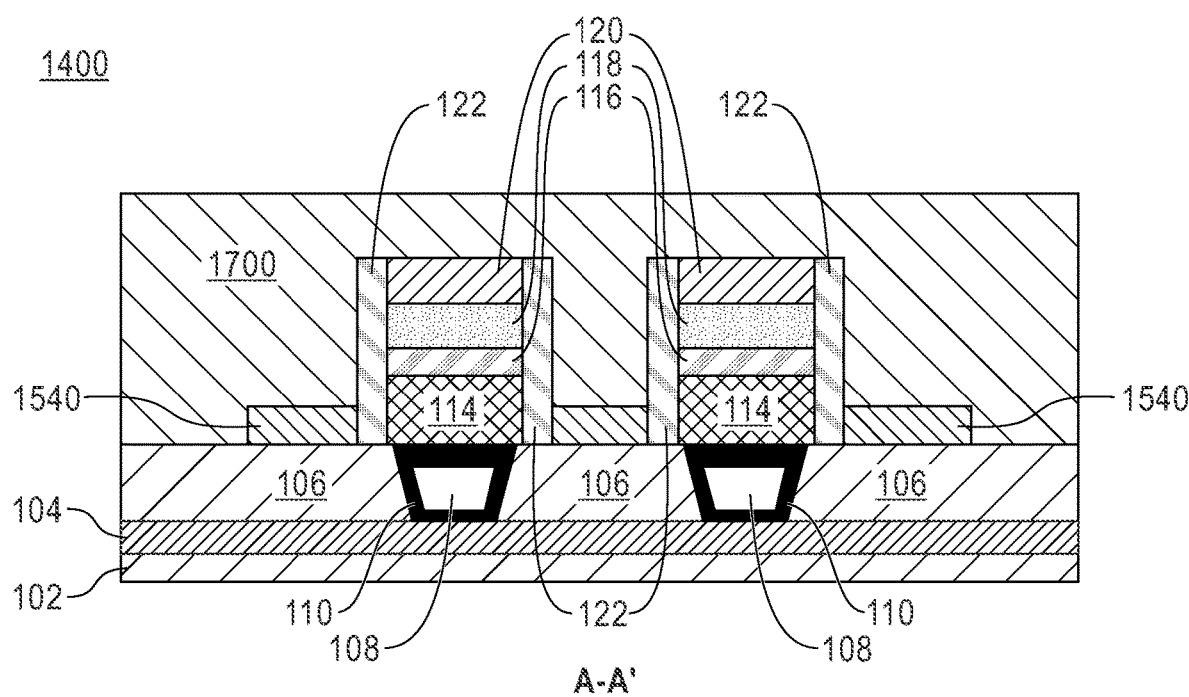
FIG. 17A is a cross-sectional view of the memory device across line A-A' after forming a second dielectric filling layer, according to yet another embodiment of the present disclosure.
Figure 17B:
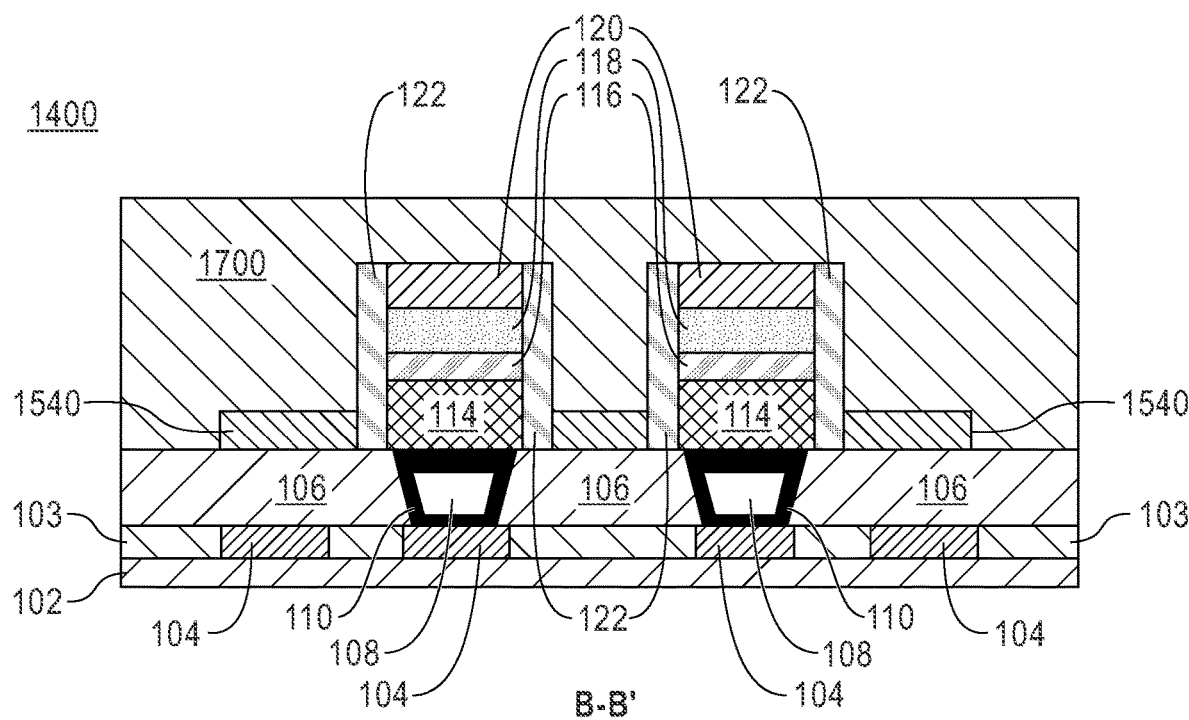
FIG. 17B is a cross-sectional view of the memory device across line B-B'.
Figure 17C:
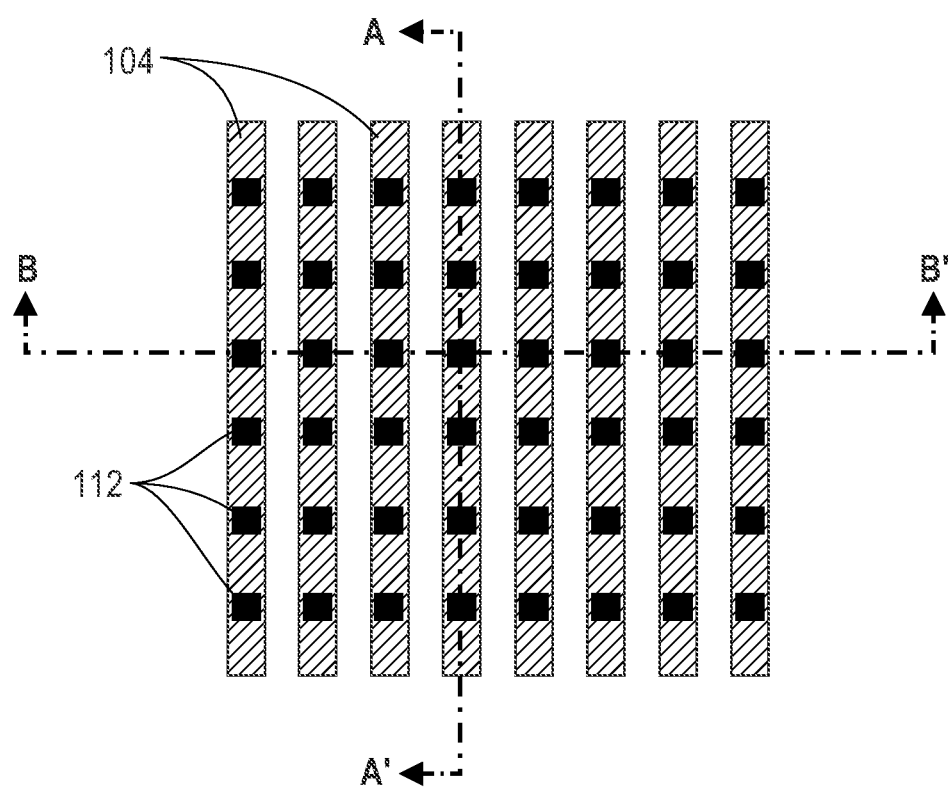
FIG. 17C is a top-down view of the memory device.

Referring now to FIG. 17A, a cross-sectional view of the memory device 1400 after forming a second dielectric filling layer 1700 is shown, according to an embodiment of the present disclosure. In this embodiment, FIG. 17C is a top-down view of the memory device 1400, FIG. 17A is a cross-sectional view of the memory device 1400 across line A-A' of FIG. 17C, and FIG. 17B is a cross-sectional view of the memory device 1400 across line B-B' of FIG. 17C.

The second dielectric filling layer 1700 includes similar materials and is formed in analogous ways as the first dielectric filling layer 200 described above with reference to FIGS. 2A-2C.

Figure 18A:
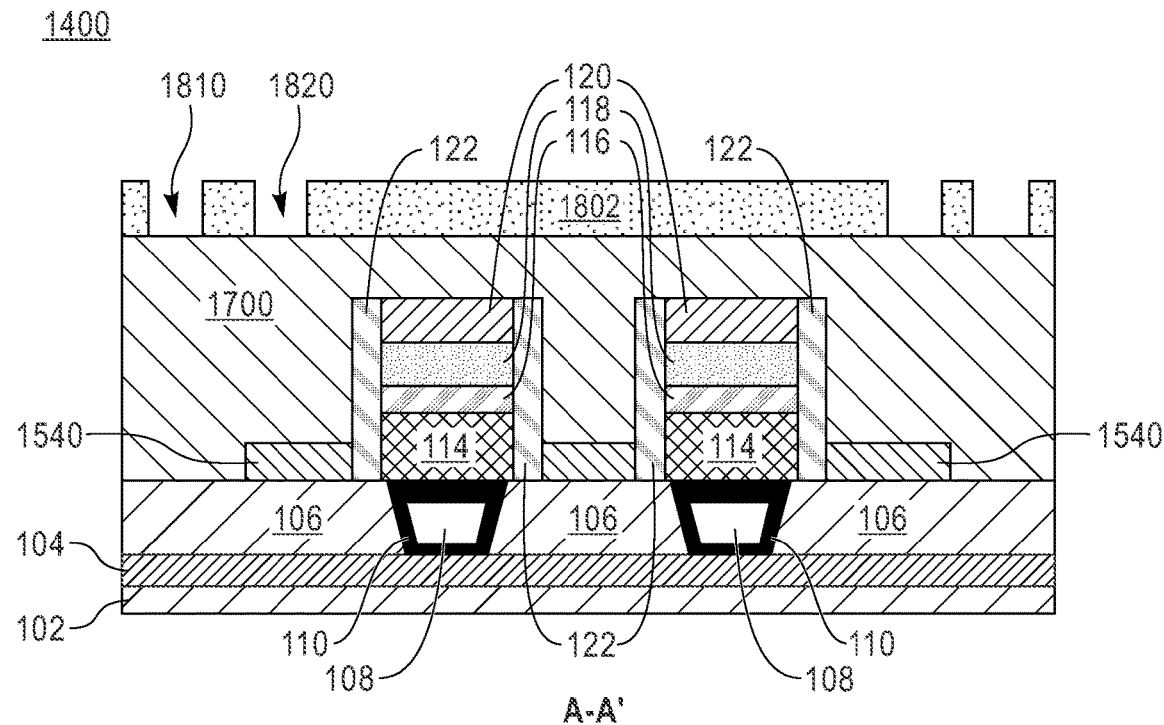
FIG. 18A is a cross-sectional view of the memory device across line A-A' after depositing a fifth photoresist layer, according to yet another embodiment of the present disclosure.
Figure 18B:
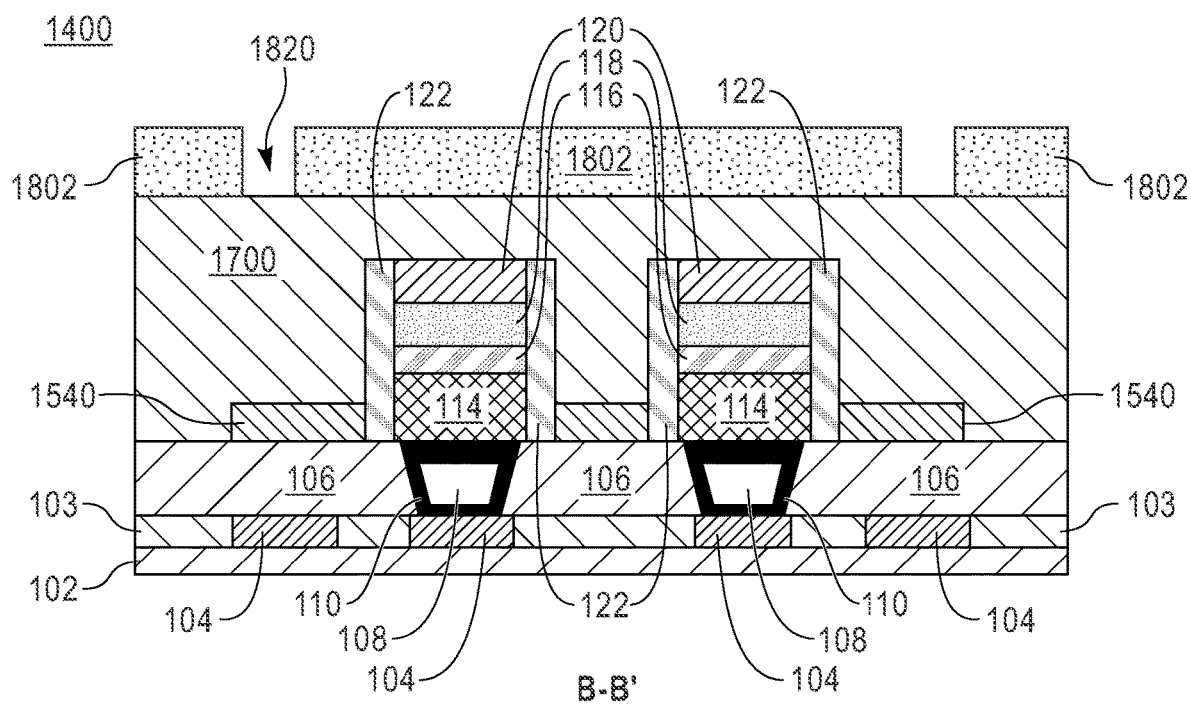
FIG. 18B is a cross-sectional view of the memory device across line B-B'.
Figure 18C:
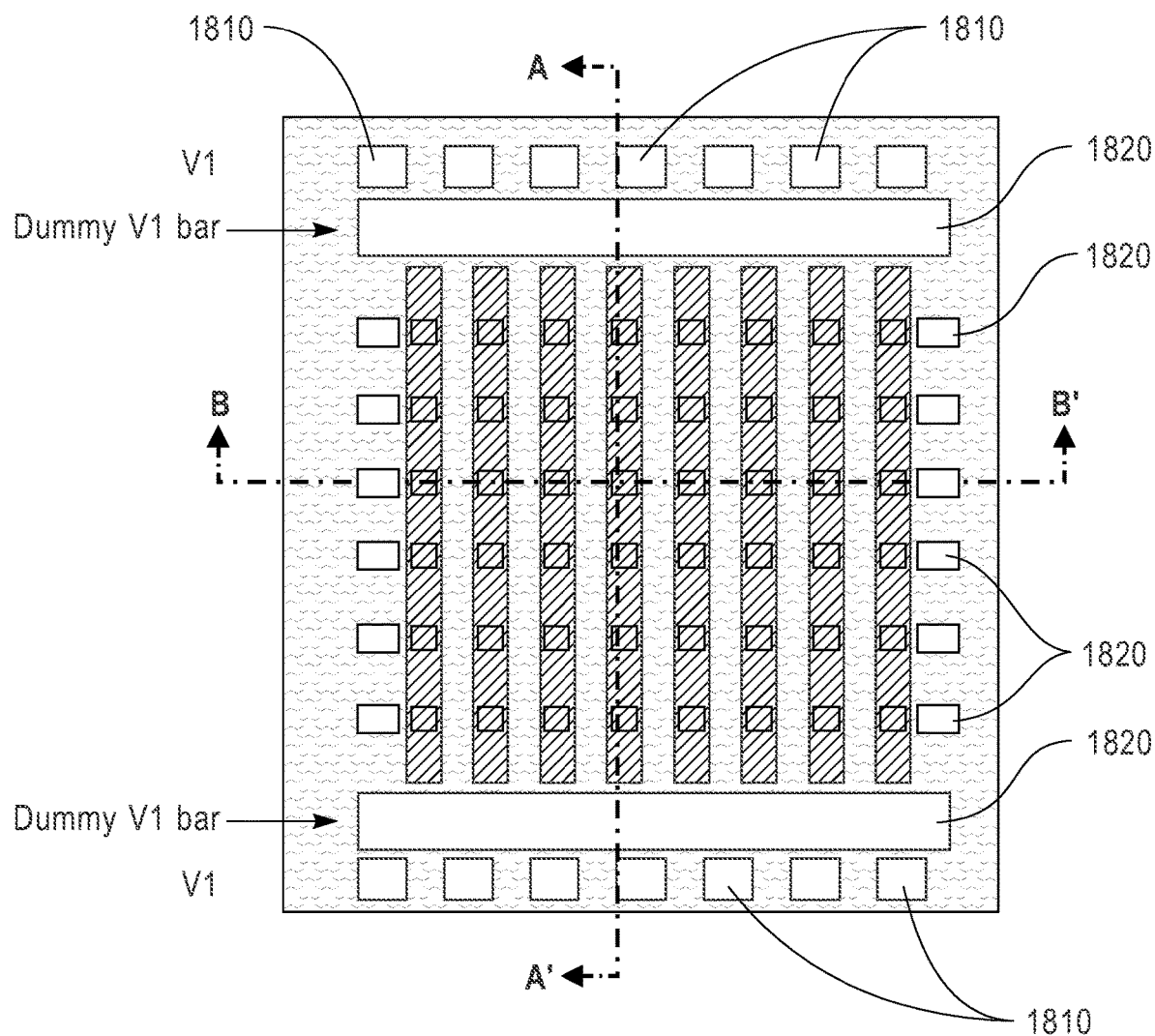
FIG. 18C is a top-down view of the memory device.

Referring now to FIG. 18A and FIG. 19A simultaneously, cross-sectional views of the memory device 1400 after depositing a fifth photoresist layer 1802 and patterning the second dielectric filling layer 1700 to form third connecting vias 1910 and third dummy vias 1920 are shown, according to an embodiment of the present disclosure. In this embodiment, FIG. 18C is a top-down view of the memory device 1400, FIG. 18A is a cross-sectional view of the memory device 1400 across line A-A' of FIG. 18C, and FIG. 18B is a cross-sectional view of the memory device 1400 across line B-B' of FIG. 18C. Similarly, FIG. 19C is a top-down view of the memory device 1400, FIG. 19A is a cross-sectional view of the memory device 1400 across line A-A' of FIG. 19C, and FIG. 19B is a cross-sectional view of the memory device 1400 across line B-B' of FIG. 19C.

The fifth photoresist layer 1802 is deposited above the second dielectric filling layer 1700 for forming third connecting vias 1910 and third dummy vias 1920 (shown in FIGS. 19A-19C) using well-known lithography and RIE processing. As previously described, patterning of the second dielectric filling layer 1700 to form the third connecting vias 1910 and third dummy vias 1920 involves exposing a pattern 1810, 1820 on the fifth photoresist layer 1802 and transferring the exposed pattern to the second dielectric filling layer 1700, as shown in FIGS. 19A-19C. After transferring the pattern 1810, 1820 and forming the third connecting vias 1910 and third dummy vias 1920, the fifth photoresist layer 1802 can be removed from the memory device 1400 using any photoresist striping method known in the art including, for example, plasma ashing.

With continued reference to FIGS. 19A-19C, according to an embodiment, the third connecting vias 1910 extend vertically all the way through the second dielectric filling layer 1700 until the top portion of the first metal layer 104. In an exemplary embodiment, a depth of the third connecting vias 1910 may vary between approximately 50 nm and approximately 300 nm and ranges therebetween. A width of each of the third connecting vias 1910 (as measured in the x-direction) may vary, for example, between approximately 20 nm and approximately 50 nm and ranges therebetween.

In this embodiment, the third dummy vias 1920 extend vertically through the second dielectric filling layer 1700 until a top portion of the etch stop layer 1540. Thus, in the present embodiment, etching of the third dummy vias 1920 stops at the etch stop layer 1540 while etching of the third connecting vias 1910 goes all the way to the $M_1$ level of the memory device 1400. As mentioned above, to improve shielding efficiency, a distance between the third dummy vias 1920 and the MTJ stack 124 (FIG. 14A) may, for example, vary between approximately 50 nm and approximately 500 nm. Similarly, a distance between the third connecting vias 1910 and second dummy vias 1020 may, for example, vary between approximately 50 nm to approximately 200 nm.

Figure 20A:
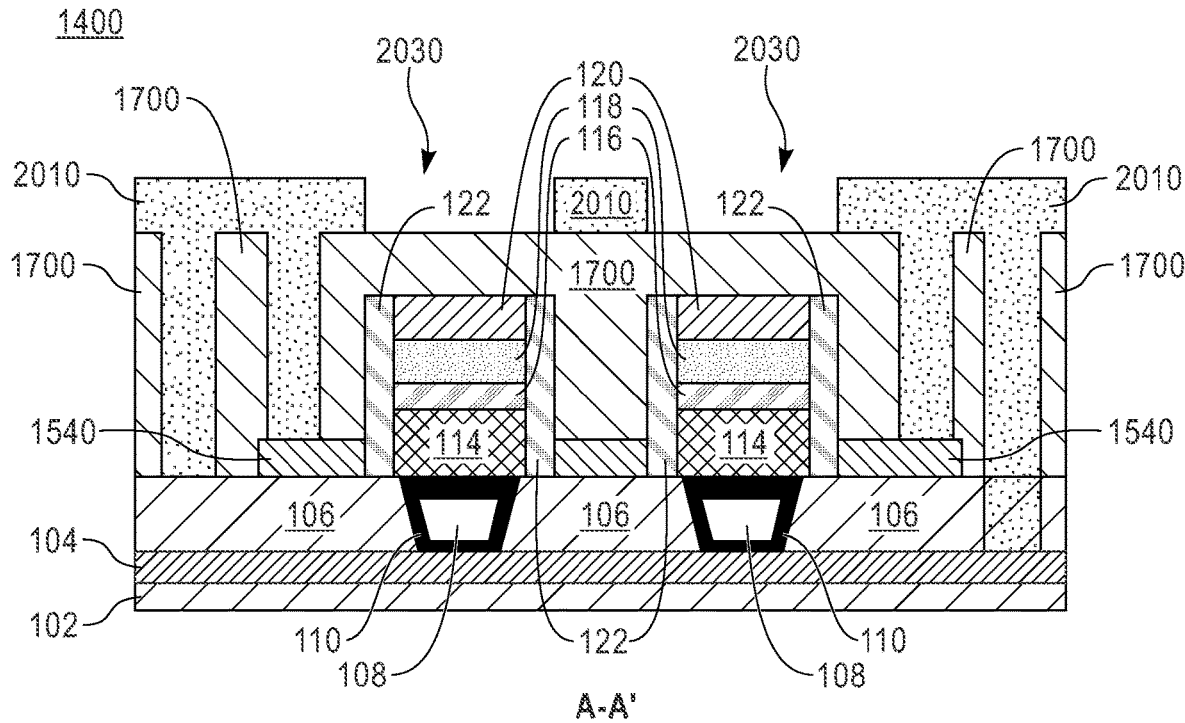
FIG. 20A is a cross-sectional view of the memory device across line A-A' after depositing a sixth photoresist layer, according to yet another embodiment of the present disclosure.
Figure 20B:
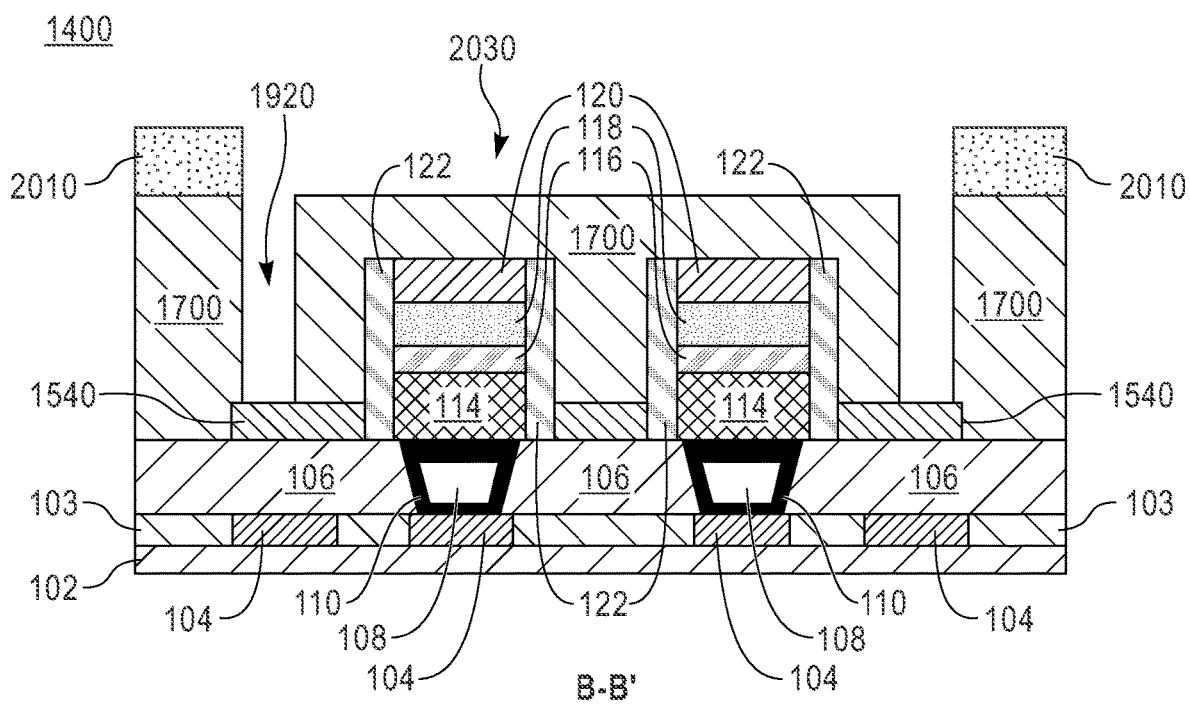
FIG. 20B is a cross-sectional view of the memory device across line B-B'.
Figure 20C:
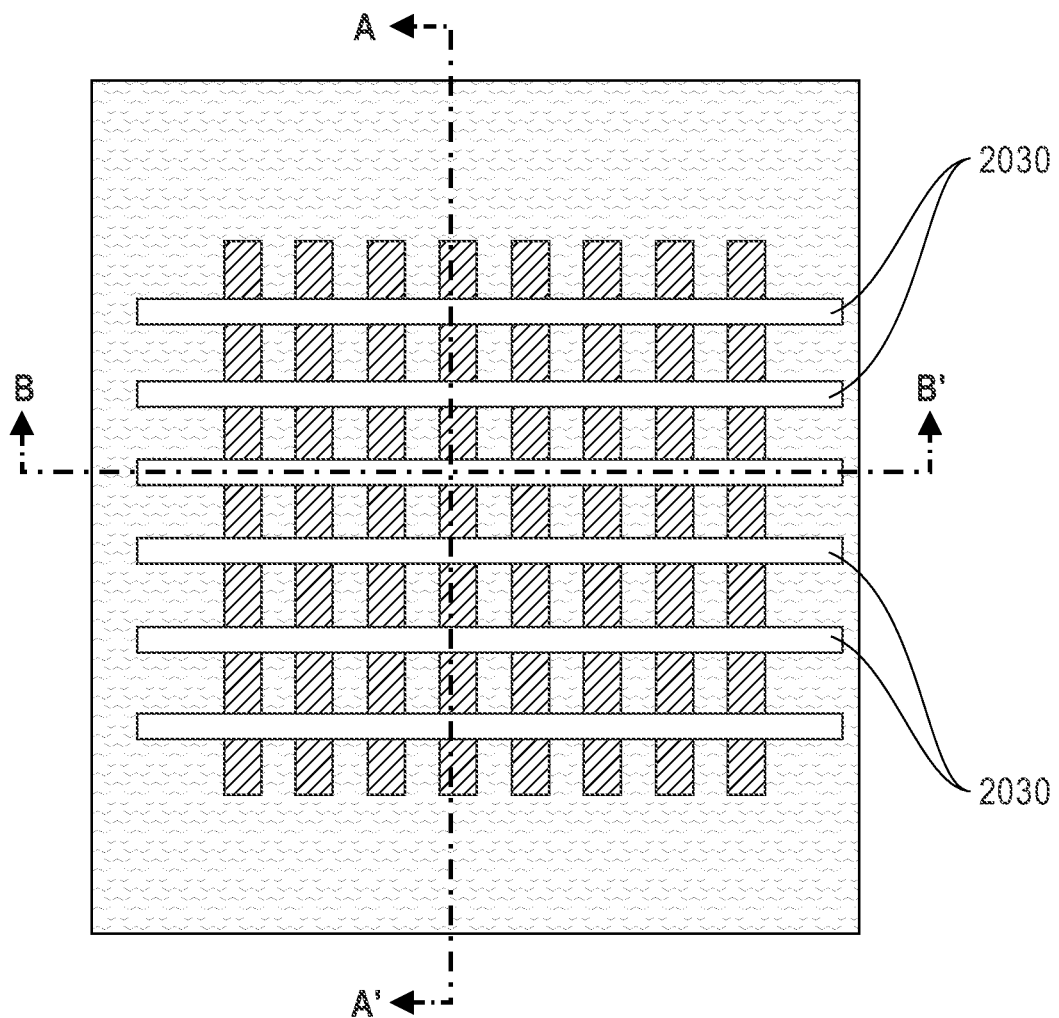
FIG. 20C is a top-down view of the memory device.
Figure 21A:
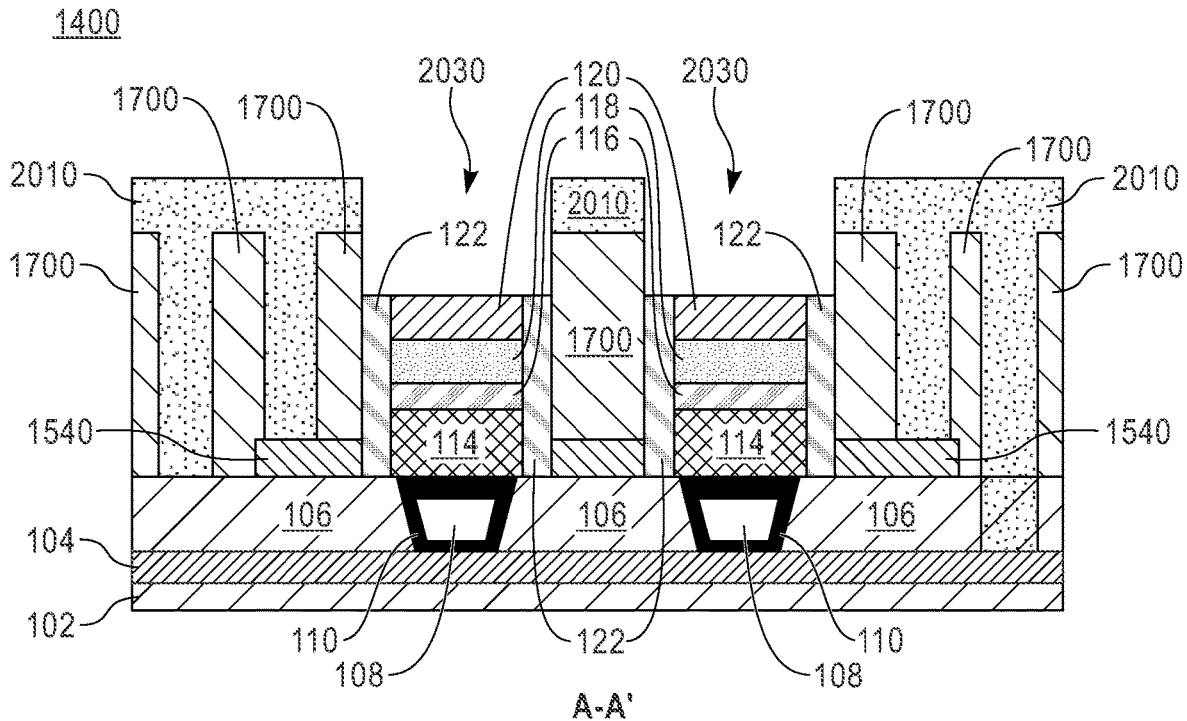
FIG. 21A is a cross-sectional view of the memory device across line A-A' after patterning the second dielectric filling layer to form third trenches, according to yet another embodiment of the present disclosure.
Figure 21B:
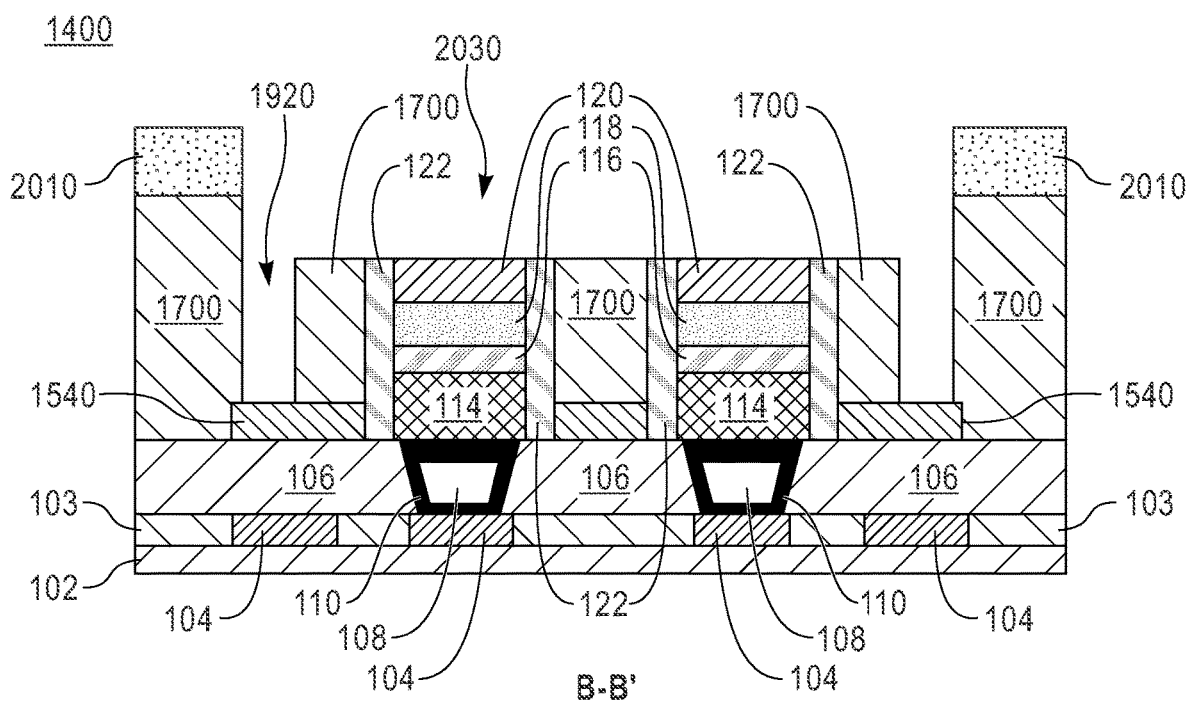
FIG. 21B is a cross-sectional view of the memory device across line B-B'.
Figure 21C:
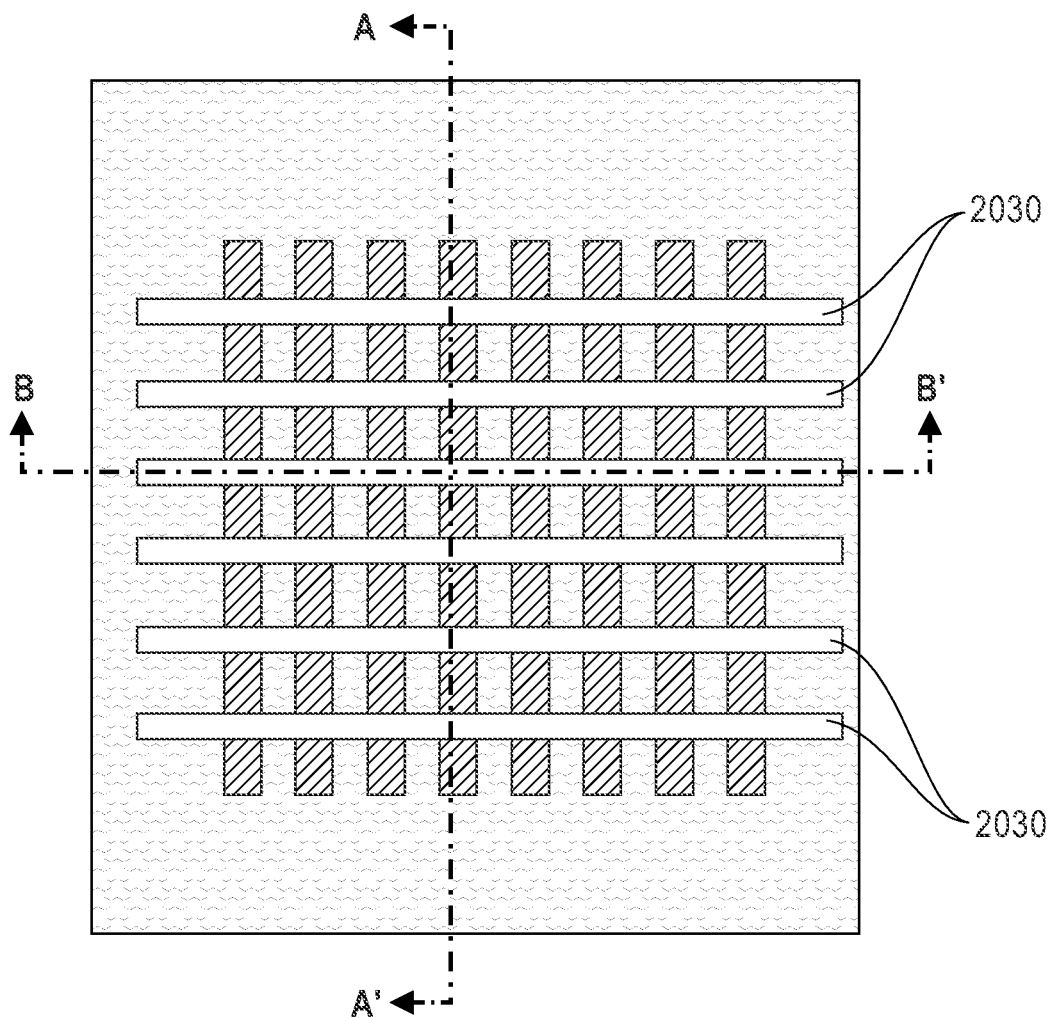
FIG. 21C is a top-down view of the memory device.

Referring now to FIG. 20A and FIG. 21A simultaneously, cross-sectional views of the memory device 800 after depositing a sixth photoresist layer 2010 and patterning the second dielectric filling layer 1700 to form third trenches 2030 ($M_2$ level) are shown, according to an embodiment of the present disclosure. In this embodiment, FIG. 20C is a top-down view of the memory device 1400, FIG. 20A is a cross-sectional view of the memory device 1400 across line A-A' of FIG. 20C, and FIG. 20B is a cross-sectional view of the memory device 1400 across line B-B' of FIG. 20C. Similarly, FIG. 21C is a top-down view of the memory device 1400, FIG. 21A is a cross-sectional view of the memory device 1400 across line A-A' of FIG. 21C, and FIG. 21B is a cross-sectional view of the memory device 1400 across line B-B' of FIG. 21C.

Similarly to the process of forming the third connecting vias 1910 and second dummy vias 1920 described above, forming the third trenches 2030 involves exposing a pattern (not shown) on the sixth photoresist layer 2010 and transferring the exposed pattern to the second dielectric filling layer 1700 using known lithography and RIE processing (shown in FIG. 20A and FIG. 20B). As depicted in FIG. 20A, in this embodiment, the sixth photoresist layer 2010 substantially fills the third connecting vias 1910 and the third dummy vias 1920 (FIG. 20A) protecting them during subsequent etching steps. Similar to the first trenches 610 and second trenches 1130, the third trenches 2030 expose a top portion of the hardmask layer 120 and sidewall spacers 122, as shown in FIGS. 21A-21B. After transferring the pattern, the sixth photoresist layer 2010 can be removed from the memory device 1400 using any photoresist striping method known in the art.

Figure 22A:
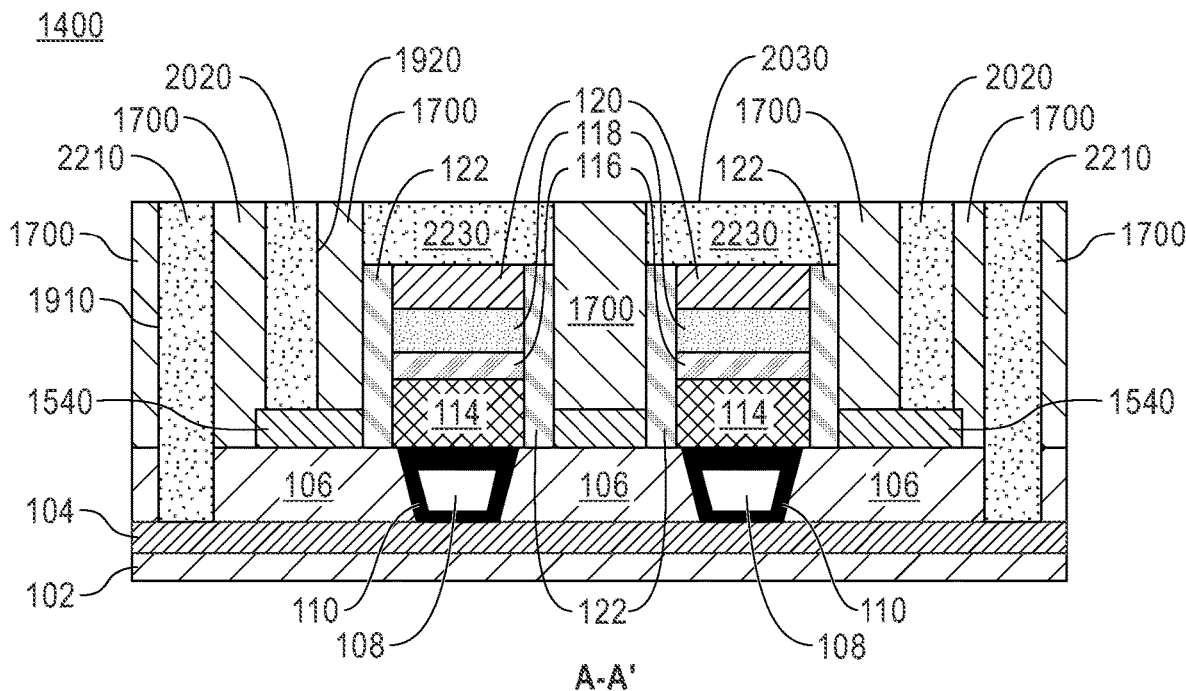
FIG. 22A is a cross-sectional view of the memory device across line A-A' after depositing a third conductive material, according to yet another embodiment of the present disclosure.
Figure 22B:
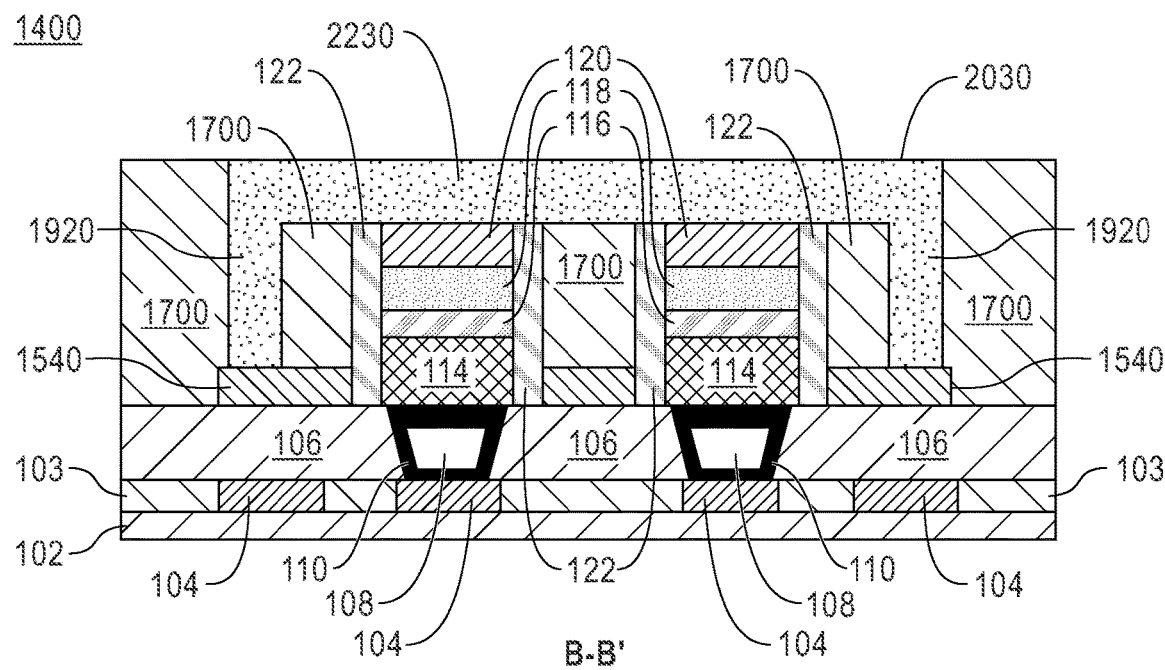
FIG. 22B is a cross-sectional view of the memory device across line B-B'.
Figure 22C:
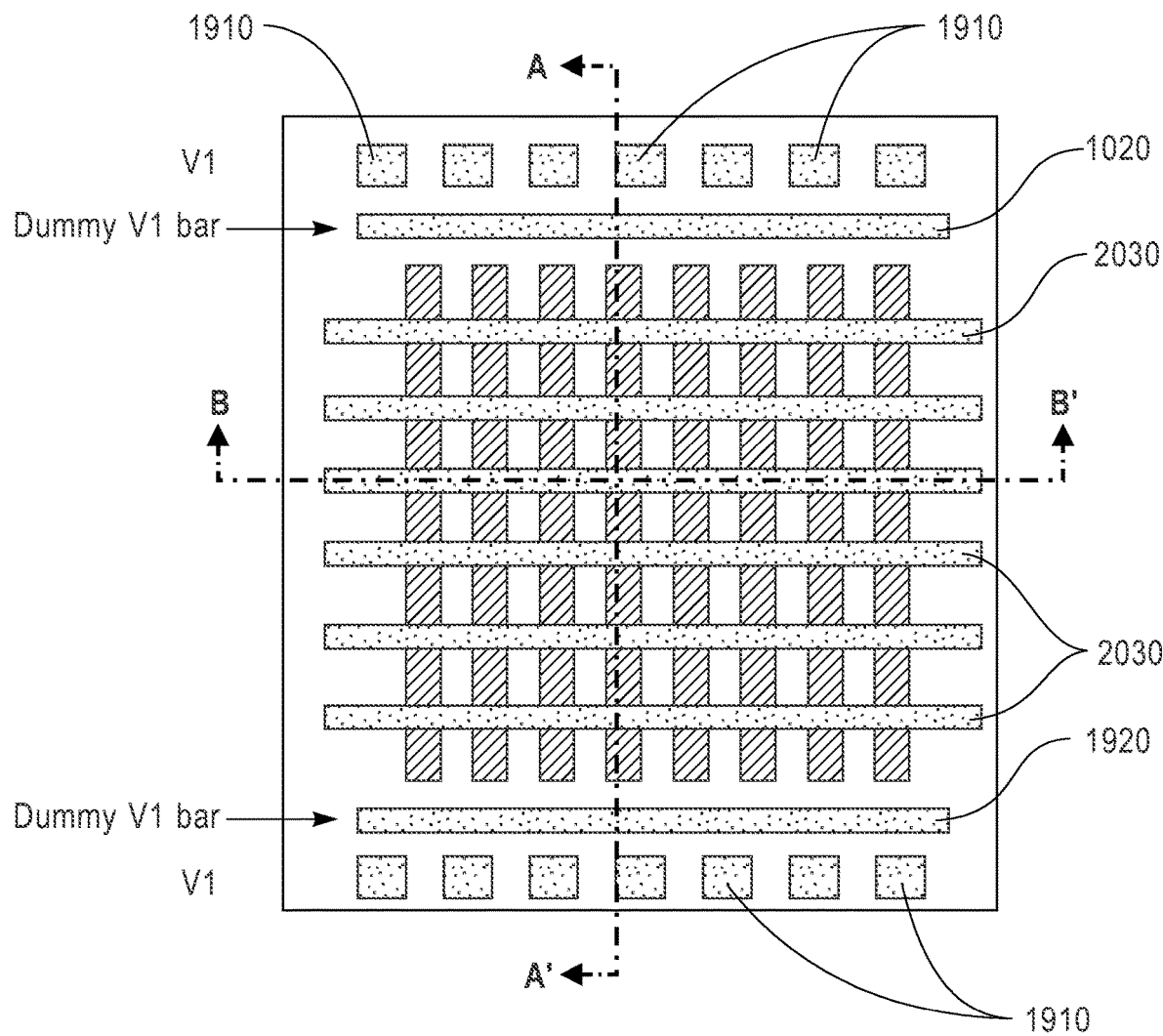
FIG. 22C is a top-down view of the memory device.

Referring now to FIG. 22A, a cross-sectional view of the memory device 1400 after depositing a third conductive material 2230 is shown, according to an embodiment of the present disclosure. In this embodiment, FIG. 22C is a top-down view of the memory device 1400, FIG. 22A is a cross-sectional view of the memory device 1400 across line A-A' of FIG. 22C, and FIG. 22B is a cross-sectional view of the memory device 1400 across line B-B' of FIG. 22C.

Similar to the first conductive material 730 and the second conductive material 1330, the third conductive material 2230 substantially fills the third connecting vias 1910, the third dummy vias 1920 and the third trenches 2030 to form interconnect structures for electrically connecting the memory device 1400 to other structures and (V1) dummy bars for conducting an external magnetic field. The third conductive material 2230 includes similar materials and is formed in analogous ways as the first and second conductive materials 730, 1330. Thus, the third conductive material 2230 also includes a high permeability (m) metal for guiding the external magnetic field around the MRAM array without disturbing the operation of the memory device 1400.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
    an electrically conductive structure embedded within an interconnect dielectric material located above a first metal layer, the electrically conductive structure comprising a bottom electrode;
    a magnetic tunnel junction stack located above the bottom electrode;
    a dielectric filling layer surrounding the magnetic tunnel junction stack;
    one or more connecting vias extending through the dielectric filling layer and the interconnect dielectric material until a top portion of the first metal layer; and
    one or more dummy vias located between the one or more connecting vias and the magnetic tunnel junction stack for guiding an external magnetic field.

2. The memory device of claim 1, further comprising:
    a conductive material filling the one or more conductive vias and the one or more dummy vias.

3. The memory device of claim 2, further comprising:
    one or more trenches above a top portion of the magnetic tunnel junction stack, the conductive material filling the one or more trenches.

4. The memory device of claim 2, wherein the conductive material comprises a high permeability metal capable of guiding the external magnetic field around the memory device, the guiding being performed without disturbing an operation of the memory device.

5. The memory device of claim 1, wherein the one or more dummy vias are formed with a high aspect ratio.

6. The memory device of claim 1, wherein the memory device comprises a perpendicular magnetic anisotropy spin-transfer torque magneto-resistive random access memory device.

7. The memory device of claim 1, wherein the magnetic tunnel junction stack further comprises:
    a magnetic reference layer above the bottom electrode;
    a tunnel barrier layer above the magnetic reference layer;
    a magnetic free layer above the tunnel barrier layer; and
    a hardmask layer above the magnetic free layer, the magnetic tunnel junction stack being surrounded by sidewall spacers.

8. A memory device, comprising:
    an electrically conductive structure embedded within an interconnect dielectric material located above a first metal layer, the electrically conductive structure comprising a bottom electrode;
    a magnetic tunnel junction stack located above the bottom electrode;
    an etch stop layer covering portions of the interconnect dielectric material adjacent to the magnetic tunnel junction stack and a bottom portion of the magnetic tunnel junction stack;

a dielectric filling layer above the interconnect dielectric material and the etch stop layer, the dielectric filling layer surrounding the magnetic tunnel junction stack;

one or more connecting vias extending through the dielectric filling layer and the interconnect dielectric material until a top portion of the first metal layer; and one or more dummy vias extending through the dielectric filling layer until a top portion of the etch stop layer, the one or more dummy vias being located between the one or more connecting vias and the magnetic tunnel junction stack for guiding an external magnetic field.

9. The memory device of claim 8, further comprising:
a conductive material filling the one or more conductive vias and the one or more dummy vias.

10. The memory device of claim 9, further comprising:
one or more trenches above a top portion of the magnetic tunnel junction stack, the conductive material filling the one or more trenches.

11. The memory device of claim 9, wherein the conductive material comprises a high permeability metal capable of guiding the external magnetic field around the memory device, the guiding being performed without disturbing an operation of the memory device.

12. The memory device of claim 8, wherein the one or more dummy vias are formed with a high aspect ratio.

13. The memory device of claim 8, wherein the memory device comprises a perpendicular magnetic anisotropy spin-transfer torque magneto-resistive random access memory device.

14. A method of forming a memory device, comprising:
forming an electrically conductive structure embedded within an interconnect dielectric material located above a first metal layer, the electrically conductive structure comprising a bottom electrode;

forming a magnetic tunnel junction stack above the bottom electrode;

forming a dielectric filling layer surrounding the magnetic tunnel junction stack;

forming one or more connecting vias extending through the dielectric filling layer and the interconnect dielectric material until a top portion of the first metal layer; and forming one or more dummy vias between the one or more connecting vias and the magnetic tunnel junction stack for guiding an external magnetic field.

15. The method of claim 14, further comprising:
depositing a conductive material to fill the one or more conductive vias and the one or more dummy vias.

16. The method of claim 15, further comprising:
forming one or more trenches above a top portion of the magnetic tunnel junction stack; and
filling the one or more trenches with the conductive material.

17. The method of claim 15, wherein the conductive material comprises a high permeability metal capable of guiding the external magnetic field around the memory device, the guiding being performed without disturbing an operation of the memory device.

18. The method of claim 14, wherein the one or more dummy vias are formed with a high aspect ratio.

19. The method of claim 14, wherein the memory device comprises a perpendicular magnetic anisotropy spin-transfer torque magneto-resistive random access memory device.

20. The method of claim 14, further comprising:
forming an etch stop layer to cover portions of the interconnect dielectric material adjacent to the magnetic tunnel junction stack and a bottom portion of the magnetic tunnel junction stack, wherein the one or more dummy vias extend through the dielectric filling layer until a top portion of the etch stop layer.

* * * * *